US011864430B2

(12) United States Patent
Wang et al.

(10) Patent No.: US 11,864,430 B2
(45) Date of Patent: Jan. 2, 2024

(54) ORGANIC LIGHT EMITTING DIODE DISPLAY DEVICE

(71) Applicant: Samsung Display Co., Ltd., Yongin-si (KR)

(72) Inventors: Seong Min Wang, Seongnam-si (KR); Young-In Hwang, Suwon-si (KR); Yong Ho Yang, Suwon-si (KR); Yong Su Lee, Seoul (KR); Jae Seob Lee, Seoul (KR); Gyoo Chul Jo, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/853,468

(22) Filed: Jun. 29, 2022

(65) Prior Publication Data

US 2022/0336554 A1 Oct. 20, 2022

Related U.S. Application Data

(63) Continuation of application No. 17/208,571, filed on Mar. 22, 2021, now Pat. No. 11,380,746, which is a (Continued)

(30) Foreign Application Priority Data

Mar. 30, 2018 (KR) .................. 10-2018-0037658

(51) Int. Cl.
*H10K 59/123* (2023.01)
*G09G 3/3233* (2016.01)
(Continued)

(52) U.S. Cl.
CPC ......... *H10K 59/123* (2023.02); *G09G 3/3233* (2013.01); *G09G 3/3258* (2013.01);
(Continued)

(58) Field of Classification Search
CPC ............... H10K 59/123; H10K 59/131; H10K 59/1213; H10K 50/805; H10K 59/126;
(Continued)

(56) References Cited

U.S. PATENT DOCUMENTS 7,759,863 B2 7/2010 Kim et al.
10,497,720 B2 12/2019 Choi et al.
(Continued)

FOREIGN PATENT DOCUMENTS

EP 3 255 672 12/2017
KR 10-2015-0075512 7/2015
(Continued)

OTHER PUBLICATIONS

Extended European Search Report corresponding to European Patent Application or Patent No. 19164223.0, dated Sep. 16, 2019.
(Continued)

*Primary Examiner* — Thinh T Nguyen
(74) *Attorney, Agent, or Firm* — KILE PARK REED & HOUTTEMAN PLLC

(57) ABSTRACT

A display may include flexible substrate, a blocking layer on the flexible substrate, a pixel on the flexible substrate and the blocking layer, and a scan line, a data line, a driving voltage line, and an initialization voltage line connected to the pixel. The pixel may include an organic light emitting diode, a switching transistor connected to the scan line, and a driving transistor to apply a current to the organic light emitting diode. The blocking layer is in an area that overlaps the switching transistor on a plane, and between the switching transistor and the flexible substrate, and receives a voltage through a contact hole that exposes the blocking layer.

24 Claims, 43 Drawing Sheets

Related U.S. Application Data continuation of application No. 16/251,639, filed on Jan. 18, 2019, now Pat. No. 10,985,227.

(51) Int. Cl.
- *H10K 50/805* (2023.01)
- *G09G 3/3258* (2016.01)
- *H10K 59/126* (2023.01)
- *H10K 59/131* (2023.01)
- *H10K 59/121* (2023.01)
- *H10K 77/10* (2023.01)
- *H10K 102/00* (2023.01)

(52) U.S. Cl.
CPC ......... *H10K 50/805* (2023.02); *H10K 59/126* (2023.02); *H10K 59/1213* (2023.02); *H10K 59/131* (2023.02); *H10K 77/111* (2023.02); *H10K 2102/311* (2023.02)

(58) Field of Classification Search
CPC ........... H10K 2102/311; G09G 3/3233; G09G 3/3258
USPC .................................. 257/40, 81; 438/82, 99
See application file for complete search history.

(56) References Cited

U.S. PATENT DOCUMENTS

| | | | |
|---|---|---|---|
| 10,998,346 | B2 | 5/2021 | Choi et al. |
| 2015/0123107 | A1 | 5/2015 | Choi et al. |
| 2016/0087022 | A1 | 3/2016 | Tsai et al. |
| 2016/0275857 | A1 | 9/2016 | Pyon et al. |
| 2017/0117343 | A1 | 4/2017 | Oh et al. |
| 2018/0033849 | A1 | 2/2018 | Noh et al. |
| 2018/0158410 | A1* | 6/2018 | Jeon ............... G09G 3/3233 |
| 2021/0242247 | A1 | 8/2021 | Choi et al. |

FOREIGN PATENT DOCUMENTS

| | | |
|---|---|---|
| KR | 10-2016-0002337 | 1/2016 |
| KR | 10-2017-0003796 | 1/2017 |
| KR | 10-2017-0049705 | 5/2017 |
| KR | 10-2017-0139213 | 12/2017 |

OTHER PUBLICATIONS

Korean Office Action for Korean Patent Application or Patent No. 10-2018-0037658, dated Aug. 8, 2022.

* cited by examiner

ORGANIC LIGHT EMITTING DIODE DISPLAY DEVICE

CROSS-REFERENCE TO RELATED APPLICATION(S)

This is a continuation application based on currently pending U.S. patent application Ser. No. 17/208,571, filed on Mar. 22, 2021 (now pending), the disclosure of which is incorporated herein by reference in its entirety. U.S. patent application Ser. No. 17/208,571 is a continuation application of U.S. patent application Ser. No. 16/251,639, filed Jan. 18, 2019, now U.S. Pat. No. 10,985,227, issued Apr. 20, 2021, the disclosure of which is incorporated herein by reference in its entirety. U.S. Pat. No. 10,985,227 claims priority benefit of Korean Patent Application No. 10-2018-0037658, filed on Mar. 30, 2018 in the Korean Intellectual Property Office, the disclosure of which is incorporated herein by reference in its entirety for all purposes.

BACKGROUND

1. Field

The present disclosure relates to an organic light emitting diode (OLED) display, and more particularly, it relates to a flexible OLED display.

2. Description of the Related Art

An organic light emitting diode (OLED) display has a self-luminous characteristic. Since the OLED display does not need a separate light source, unlike a liquid crystal display, it can have a relatively small thickness and weight. Further, the OLED device has high-grade characteristics such as low power consumption, high luminance, and a high response speed.

In general, an OLED display includes a substrate, a plurality of thin film transistors disposed on the substrate, a plurality of insulation layers disposed between wires that form the thin film transistors, and organic light emitting diodes connected to the thin film transistors.

Recently, a flexible OLED display that can be wholly bent by including a flexible substrate that includes a polymer material has been researched and developed. The OLED display includes a plurality of pixels, and each pixel includes a plurality of transistors.

SUMMARY

An organic light emitting diode (OLED) display according to an exemplary embodiment includes: a flexible substrate; a blocking layer on the flexible substrate; a pixel on the flexible substrate and the blocking layer; and a scan line, a data line, a driving voltage line, and an initialization voltage line connected to the pixel. The pixel includes: an organic light emitting diode; a switching transistor connected to the scan line; and a driving transistor to apply a current to the organic light emitting diode. The blocking layer is in an area that overlaps the switching transistor on a plane, and is between the switching transistor and the flexible substrate. The blocking layer receives a voltage through a contact hole in the pixel that exposes the blocking layer.

The switching transistor may be a third transistor that includes a first electrode connected with an output side electrode of the driving transistor and a second electrode connected with a gate electrode of the driving transistor.

The blocking layer may be electrically connected with one of the scan line, the data line, the driving voltage line, the initialization voltage line, the switching transistor, the driving transistor, and one terminal of the organic light emitting diode through the contact hole.

The blocking layer may further include a portion that overlaps the driving transistor.

The portion of the blocking layer, overlapping the driving transistor, may have a width that is wider than a width of the gate electrode of the driving transistor.

The blocking layer may be connected with the driving voltage line through the contact hole.

A portion of the blocking layer overlapping the third transistor, and a portion of the blocking layer overlapping the driving transistor, may be separated from each other, and may receive different voltages.

The switching transistor may further include a second transistor that is connected to the scan line and the data line, and the blocking layer may further include a portion that overlaps the second transistor.

The blocking layer may be connected with the driving voltage line through the contact hole.

The portion of the blocking layer overlapping the third transistor, and the portion of the blocking layer overlapping the second transistor, may be separated from each other, and may receive different voltages.

The pixel may further include a fourth transistor that includes a first electrode connected with the initialization voltage line and a second electrode that is connected with the gate electrode of the driving transistor, and the blocking layer may further include a portion that overlaps the fourth transistor.

The blocking layer may be connected with the driving voltage line through the contact hole.

The portion of the blocking layer overlapping the third transistor, and the portion of the blocking layer overlapping the fourth transistor, may be separated from each other, and may receive different voltages.

The pixel may further include at least one of: a fifth transistor that includes a first electrode connected with the driving voltage line and a second electrode connected with an input side electrode of the driving transistor; a sixth transistor that includes a first electrode connected with an output side electrode of the driving transistor and a second electrode connected with the organic light emitting diode; and a seventh transistor that includes a first electrode connected with the organic light emitting diode and a second electrode connected with the initialization voltage line.

The blocking layer may further include a portion that overlaps one of the fifth transistor, the sixth transistor, and the seventh transistor, included in the pixel.

The OLED display may further include a previous scan line and a light emission control line that are connected to the pixel, wherein, in the blocking layer, the portion overlapping the third transistor and the portion overlapping one of the fifth transistor, the sixth transistor, and the seventh transistor, included in the pixel, may be separated from each other, and may receive different voltages, and one of the applied voltages may be electrically connected with one of the previous scan line and the light emission control line.

The blocking layer may not overlap at least a part of the pixel.

An organic light emitting diode (OLED) display according to an exemplary embodiment includes: a flexible substrate; a blocking layer on the flexible substrate; a buffer layer on the blocking layer; a semiconductor layer on the buffer layer; a first gate insulation layer that covers the semiconductor layer; a first gate conductor on the first gate insulation layer; a second gate insulation layer that covers the first gate conductor and the first gate insulation layer; a second gate conductor on the second gate insulation layer; a second gate conductor on the second gate insulation layer; a data conductor on the interlayer insulation layer; a passivation layer that covers the data conductor and the interlayer insulation layer, and a transistor that includes a channel in the semiconductor layer and a gate electrode in the first gate conductor. The blocking layer may overlap the channel of the transistor on a plane, a contact hole that exposes the blocking layer may be formed in at least a part of the buffer layer, the first gate insulation layer, the second gate insulation layer, and the interlayer insulation layer, the blocking layer may receive a voltage through the contact hole. The contact hole may be formed in a pixel that includes the transistor or an adjacent pixel.

The blocking layer may be electrically connected with one of a scan line, a data line, a driving voltage line, an initialization voltage line, a previous scan line, a light emission control line, one terminal of the transistor, and one terminal of an organic light emitting diode.

The transistor may include a plurality of transistors, the plurality of transistors may include a switching transistor connected to the scan line and a driving transistor applying a current to the organic light emitting diode, and the blocking layer may overlap the switching transistor.

The switching transistor may be a third transistor that includes a first electrode connected with an output side electrode of the driving transistor and a second electrode connected with a gate electrode of the driving transistor.

The plurality of transistors may further include a second transistor that is connected with the scan line and the data line, wherein the blocking layer may further include a portion that overlaps the second transistor or the driving transistor.

The portion of the blocking layer overlapping the third transistor, and the portion of the blocking layer overlapping the second transistor or the driving transistor, may be electrically separated from each other, and may receive different voltages.

The blocking layer may be formed of a metal or a semiconductor material having a conductive characteristic that is equivalent to that of the meta.

The flexible substrate may be provided in plural, and a barrier layer may be further included in at least one portion between the plurality of flexible substrates.

A channel of the driving transistor may be formed in the semiconductor layer, and the semiconductor layer may have one of Ω, inverted S, S, M, and W shapes.

The OLED display may include: a first sustain electrode provided as the first gate conductor; and a second sustain electrode provided as the second gate conductor, wherein the first sustain electrode and the second sustain electrode may be overlapped with each other such that a storage capacitor is formed.

The second sustain electrode includes an opening, and a degree of overlapping of the second sustain electrode with the first sustain electrode may be changed depending on a size of the opening.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
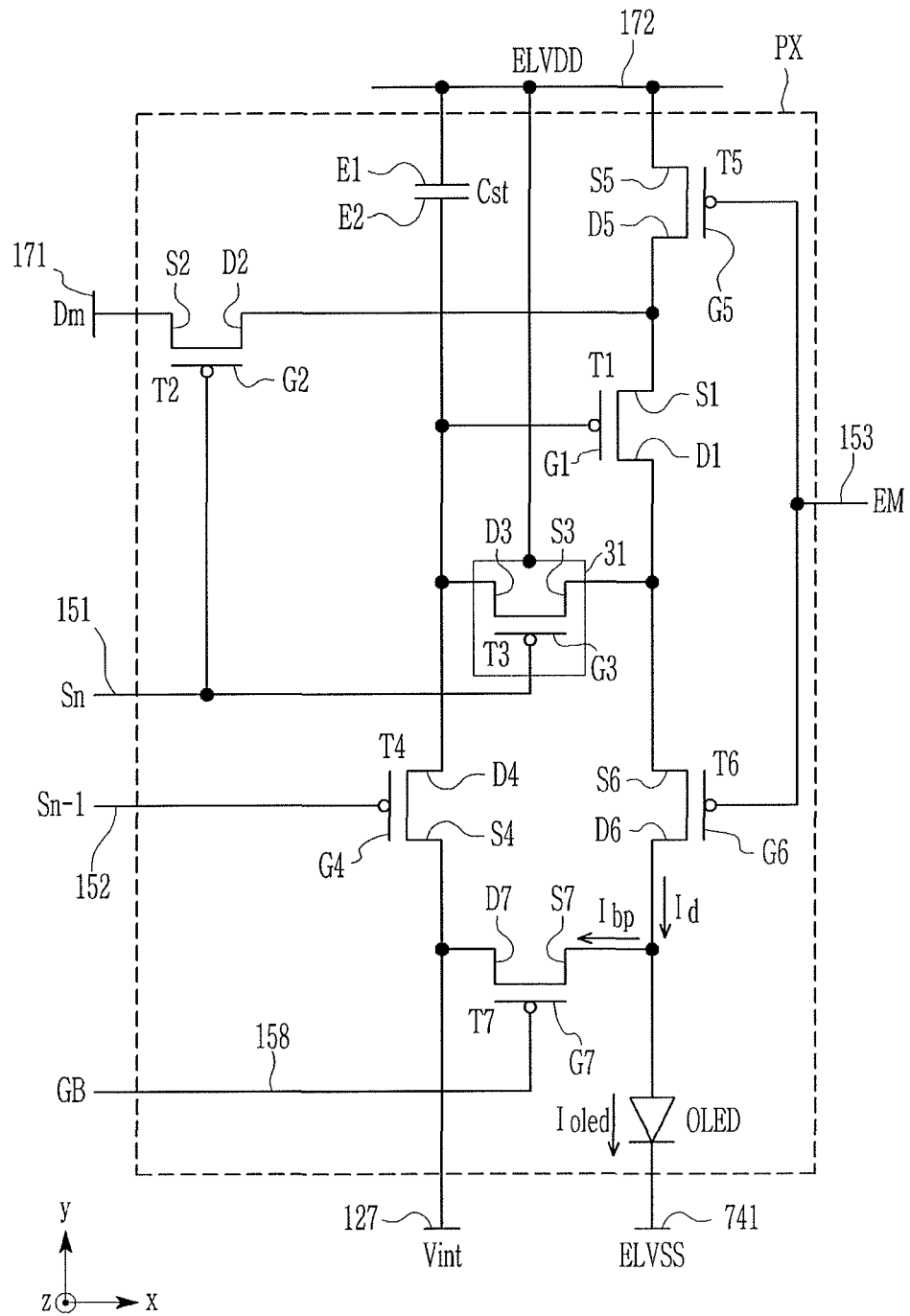
FIG. 1 illustrates an equivalent circuit diagram of a pixel of an organic light emitting diode (OLED) display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, embodiments are not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

Hereinafter, an organic light emitting diode (OLED) display according to an exemplary embodiment will be described with reference to FIG. 1 and FIG. 2.

Figure 2:
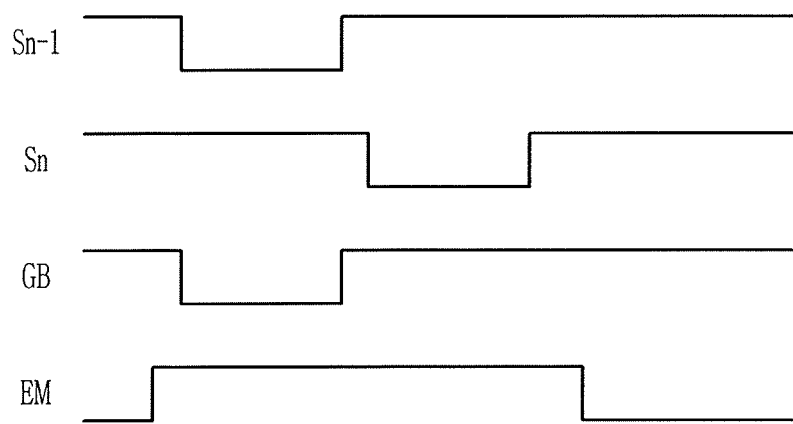
FIG. 2 illustrates a timing diagram of a signal applied to the pixel of the OLED display according to the exemplary embodiment.

FIG. 1 is an equivalent circuit diagram of a pixel of an OLED display according to an exemplary embodiment. FIG. 2 is a timing diagram of a signal applied to the pixel of the OLED display according to the exemplary embodiment.

Referring to FIG. 1, a pixel PX of the OLED display includes a plurality of transistors T1, T2, T3, T4, T5, T6, and T7 that are connected to a plurality of signal lines 127, 151, 152, 153, 158, 171, 172, and 741, a capacitor Cst, and an organic light emitting diode OLED.

In addition, the pixel shown in FIG. 1 further includes a blocking layer 31. The blocking layer 31 is below a third transistor T3, while overlapping the same on a plane, e.g. on a plane of an x-direction and a y-direction, the y-direction intersecting the x-direction. That is, the blocking layer 31 is between a substrate 110 and the third transistor T3 such that the blocking layer 31 and the third transistor overlap along a z-direction, intersecting the x- and y-directions. The blocking layer 31 may be made of a metal having a conductive characteristic or a semiconductor material having a conductive characteristic that is equivalent thereto.

Although FIG. 1 is a circuit diagram, a rectangular-shaped box is additionally illustrated in the circuit diagram to clearly show the blocking layer 31, such that a location of the blocking layer 31 and electrical connection between the blocking layer 31 and the driving voltage line 172 is illustrated. Hereinafter, a location of a blocking layer and an electrical connection relationship will also be shown through such a circuit diagram. A detailed structure of the blocking layer 31 will be shown in the layout view and the cross-sectional view of FIG. 3 and FIG. 4, respectively.

The driving voltage ELVDD is applied to the blocking layer 31 of FIG. 1. Alternatively, any one of an initialization voltage Vint, a common voltage ELVSS, a scan signal Sn, a previous scan signal Sn−1, a data voltage Dm, and an emission control signal EM may be applied to the blocking layer 31, and one terminal of one of the plurality of transistors T1 to T7 or one terminal of the organic light emitting diode OLED may be connected to the blocking layer 31. A threshold voltage Vth of a channel of a transistor, e.g., the third transistor T3, that overlaps the blocking layer 31 may be shifted depending on a voltage applied to the blocking layer 31. A threshold voltage Vth of a transistor may be shifted in opposite directions when the driving voltage ELVDD is applied to the blocking layer 31 and the initialization voltage Vint is applied to the blocking layer 31. Therefore, various voltages are applied to the blocking layer 31 in accordance with a characteristic of a transistor to be compensated based on the above-stated characteristic. In addition, a voltage applied to the blocking layer 31 may be determined depending on whether the channel of the transistor is a p-type channel or an n-type channel.

The OLED display further includes a display area where an image is displayed, and the pixels PX are arranged in various formats in the display area.

The plurality of transistors T1, T2, T3, T4, T5, T6, and T7 include a driving transistor T1, second and third transistors T2 and T3, which are switching transistors connected to the scan line 151, and other transistors T4 to T7 (hereinafter referred to as compensation transistors) for operation of the organic light emitting diode OLED. The compensation transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include a scan line 151, a previous scan line 152, an emission control line 153, a bypass control line 158, a data line 171, the driving voltage line 172, an initialization voltage line 127, and a common voltage line 741. The bypass control line 158 may be a part of the previous scan line 152 or may be electrically connected to the previous scan line 152.

The scan line 151 is connected to a gate driver, and transmits a scan signal Sn to the second transistor T2 and the third transistor T3. The previous scan line 152 is connected to the gate driver and transmits a previous scan signal Sn−1, which has been applied to a pixel PX at the previous stage, to the fourth transistor T4. The light emission control line 153 is connected to a light emission control portion, and transmits a light emission control signal EM that controls a duration of light emission of the organic light emitting diode OLED to the fifth transistor T5 and the sixth transistor T6. The bypass control line 158 transmits a bypass signal GB to the seventh transistor T7.

The data line 171 transmits a data voltage Dm generated from a data driver and luminance of the organic light emitting diode OLED (also referred to as an organic light emitting element) is changed depending on the data voltage Dm. The driving voltage line 172 applies the driving voltage ELVDD, the initialization voltage line 127 transmits an initialization voltage Vint that initializes the driving transistor T1, and the common voltage line 741 applies a common voltage Vcom. The driving voltage line 172, the initialization voltage line 127, and the common voltage line 741 may be respectively applied with constant voltages.

Hereinafter, the plurality of transistors will be described.

First, the driving transistor T1 adjusts intensity of an output current depending on the data voltage Dm applied thereto, and an output driving current Id is applied to the organic light emitting diode OLED and brightness of the organic light emitting diode OLED is adjusted depending on the data voltage Dm. For this purpose, a first electrode S1 of the driving transistor T1 receives the driving voltage ELVDD and, thus, is connected with the driving voltage line 172 via the fifth transistor T5. In addition, the first electrode S1 of the driving transistor T1 is connected with a second electrode D2 of the second transistor T2 and, thus, receives the data voltage Dm. A second electrode D1 (an output side electrode) outputs a current toward the organic light emitting diode OLED, and may be connected with an anode of the organic light emitting diode OLED via the sixth transistor T6. A gate electrode G1 is connected with a second electrode (i.e., a second sustain electrode E2) of the storage capacitor Cst. Thus, a voltage of the gate electrode G1 is changed depending on a voltage stored in the storage capacitor Cst. Accordingly, the driving current Id output from the driving transistor T1 is changed.

The second transistor T2 receives the data voltage Dm into the pixel PX. The gate electrode G2 is connected with the scan line 151, and a first electrode S2 is connected with the data line 171. A second electrode D2 of the second transistor T2 is connected with the first electrode S1 of the driving transistor T1. When the second transistor T2 is turned on in accordance with the scan signal Sn transmitted through the scan line 151, the data voltage Dm transmitted through the data line 171 is transmitted to the first electrode S1 of the driving transistor T1.

The third transistor T3 enables a compensation voltage (i.e., Dm+Vth), which has been changed through the driving transistor T1, to be transmitted to the second sustain electrode E2 of the storage capacitor Cst. A gate electrode G3 is connected with the scan line 151, and a first electrode S3 is connected with the second electrode D1 of the driving transistor T1. A second electrode D3 of the third transistor T3 is connected with the second sustain electrode E2 of the storage capacitor Cst and the gate electrode G1 of the driving transistor T1. The third transistor T3 is turned on by the scan signal Sn transmitted through the scan line 151 to connect the gate electrode G1 and the second electrode D1 of the driving transistor T1, and the second electrode D1 of the driving transistor T1 and the second sustain electrode E2 of the storage capacitor Cst.

The fourth transistor T4 initializes the gate electrode G1 of the driving transistor T1 and the second sustain electrode E2 of the storage capacitor Cst. The gate electrode G4 is connected with the previous scan line 152 and the first electrode S4 is connected with the initialization voltage line 127. A second electrode D4 of the fourth transistor T4 is connected to the second sustain electrode E2 of the storage capacitor Cst and the gate electrode G1 of the driving transistor T1 via the second electrode D3 of the third transistor T3. The fourth transistor T4 transmits the initialization voltage Vint to the gate electrode G1 of the driving transistor T1 and the second sustain electrode E2 of the storage capacitor Cst according to the previous scan signal Sn−1 received through the previous scan line 152. Accordingly, a gate voltage of the gate electrode G1 of the driving transistor T1 and the storage capacitor Cst are initialized. The initialization voltage Vint may be a voltage that has a low-voltage value to turn on the driving transistor T1.

The fifth transistor T5 transmits the driving voltage ELVDD to the driving transistor T1. The gate electrode G5 is connected with the light emission control line 153, and a first electrode S5 is connected with the driving voltage line 172. A second electrode D5 of the fifth transistor T5 is connected with the first electrode S1 of the driving transistor T1.

The sixth transistor T6 transmits the driving current Id output from the driving transistor T1 to the organic light emitting diode OLED. The gate electrode G6 is connected with the light emission control line 153, and a first electrode S6 is connected with the second electrode D1 of the driving transistor T1. A second electrode D6 of the sixth transistor T6 is connected with the anode of the organic light emitting diode OLED.

The fifth transistor T5 and the sixth transistor T6 are simultaneously turned on by the light emission control signal EM transmitted through the light emission control line 153. When the driving voltage ELVDD is applied to the first electrode S1 of the driving transistor T1 through the fifth transistor T5, the driving transistor T1 outputs the driving current Id according to a voltage of the gate electrode S1 of the driving transistor T1 (i.e., a voltage of the second sustain electrode E2 of the storage capacitor Cst). The output driving current Id is transmitted to the organic light emitting diode OLED through the sixth transistor T6. As a current holed flows to the organic light emitting diode OLED, the organic light emitting diode OLED emits light.

The seventh transistor T7 initializes the anode of the organic light emitting diode OLED. A gate electrode G7 is connected with the bypass control line 158, a first electrode S7 is connected with the anode of the organic light emitting diode OLED, and a second electrode D7 is connected with the initialization voltage line 127. The bypass control line 158 may be connected with the previous scan line 152, and the bypass signal GB has the same timing as the previous scan signal Sn−1. The bypass control line 158 may transmit a signal other than the previous scan signal Sn−1 rather than being connected to the previous scan line 152. When the seventh transistor T7 is turned on by the bypass signal GB, the initialization voltage Vint is applied to the anode of the organic light emitting diode OLED and thus the organic light emitting diode OLED is initialized.

The first sustain electrode E1 of the storage capacitor Cst is connected with the driving voltage line 172. The second sustain electrode E2 of the storage capacitor Cst is connected with the gate electrode G1 of the driving transistor T1, the second electrode D3 of the third transistor T3, and the second electrode D4 of the fourth transistor T4. Thus, the second sustain electrode E2 determines a voltage of the gate electrode G1 of the driving transistor T1, and may receive the data voltage Dm through the second electrode D3 of the third transistor T3 or receive the initialization voltage Vint through the second electrode D4 of the fourth transistor T4.

The anode of the organic light emitting diode OLED is connected with the second electrode D6 of the sixth transistor T6 and the first electrode S7 of the seventh transistor T7. A cathode of the organic light emitting diode OLED is connected with the common voltage line 741 that transmits the common voltage ELVSS.

In the exemplary embodiment of FIG. 1, the pixel circuit includes the seven transistors T1 to T7 and one capacitor Cst. Alternatively, the number of transistors, the number of capacitors, and a connection therebetween can be variously modified.

Operation of the pixel of the organic light emitting diode according to the exemplary embodiment will be described with reference to FIG. 1 and FIG. 2.

During an initialization period, a low-level previous scan signal Sn−1 is supplied to the pixel PX through the previous scan line 152. Then, the fourth transistor T4, having received the previous scan signal Sn−1, is turned on. Thus, the initialization voltage Vint is applied to the gate electrode G1 of the driving transistor T1 and the second sustain electrode E2 of the storage capacitor Cst through the fourth transistor T4. Accordingly, the driving transistor T1 and the storage capacitor Cst are initialized. A voltage of the initialization voltage Vint is a low-level voltage such that the driving transistor T1 can be turned on.

Meanwhile, during the initialization period, a low-level bypass signal GB is also applied to the seventh transistor T7. Then, the seventh transistor T7 is turned on and, thus, the initialization voltage Vint is applied to the anode of the organic light emitting diode OLED through the seventh transistor T7. Accordingly, the anode of the organic light emitting diode OLED is initialized.

Next, a low-level scan signal Sn is supplied to the pixel PX through the scan line 151 during a data writing period. Thus, the second transistor T2 and the third transistor T3 are turned on by the low-level scan signal Sn.

When the second transistor T2 is turned on, the data voltage Dm passes through the second transistor T2 and then input to the first electrode S1 of the driving transistor T1.

When the third transistor T3 is turned on, the second electrode D1 of the driving transistor T1 is electrically connected with the gate electrode G1 and the second sustain electrode E2 of the storage capacitor Cst. Then, the gate electrode G1 and the second electrode D1 of the driving transistor T1 are diode-connected. In addition, the driving transistor T1 is in the turned-on state because the low-level voltage (i.e., the initialization voltage Vint) is applied to the gate electrode G1 during the initialization period. Accordingly, the data voltage Dm input to the first electrode S1 of the driving transistor T1 passes through a channel of the driving transistor T1 and is output to the second electrode D1, and then passes through the third transistor T3 and stored in the second sustain electrode E2 of the storage capacitor Cst.

In this case, a voltage applied to the second sustain electrode E2 is changed according to a threshold voltage Vth of the driving transistor T1. When the data voltage Dm is applied to the first electrode S1 of the driving transistor T1 and the initialization voltage Vint is applied to the gate electrode G1 of the driving transistor T1, a voltage output to the second electrode D1 may have a value of Vgs+Vth. Here, Vgs corresponds to a voltage difference between the gate electrode G1 and the first electrode S1 of the driving transistor T1, and, thus, may have a value of Dm−Vint. Thus, a voltage output from the second electrode D1 and then stored in the second sustain electrode E2 may have a value of (Dm−Vint+Vth).

Next, during a light emission period, the light emission control signal EM supplied from the light emission control line 153 has a low-level value. Thus, the fifth transistor T5 and the sixth transistor T6 are turned on. Accordingly, the driving voltage ELVDD is applied to the first electrode S of the driving transistor T1 and the second electrode D1 of the driving transistor T1 is connected with the organic light emitting diode OLED. The driving transistor T1 generates a driving current Id according to a voltage difference between the voltage of the gate electrode G1 and the voltage (i.e., the driving voltage ELVDD) of the first electrode S1. The driving current Id of the driving transistor T1 may have a value that is proportional to the square of (Vgs−Vth). Here, Vgs may correspond to a voltage difference between oppo- site ends of the storage capacitor Cst and Vgs have a value of (Vg−Vs). Thus, Vgs has a value of (Dm−Vint+Vth− ELVDD). When a value of Vgs−Vth is acquired by sub- tracting Vth, a value of (Dm−Vint−ELVDD) is acquired. That is, the driving current Id of the driving transistor T1 has an output current that is independent of the threshold voltage Vth of the driving transistor T1.

Thus, although the driving transistor T1 of each pixel PX has a different threshold voltage Vth due to process disper- sion, the driving transistor T1 can output a constant current, thereby improving non-uniformity of the transistor charac- teristic.

In the above calculation, the value of Vth may be slightly greater than zero or a negative value when the transistor is a P-type transistor using a polycrystalline semiconductor. In addition, depending on a voltage calculation direction, expressions of + and − may be changed. However, the driving current Id, which is output from the driving transis- tor T1, can still have a value that is independent of the threshold voltage Vth.

When the above-described light emission period is ter- minated, the initialization period starts again such that the same operation is repeated.

One of a first electrode and a second electrode of each of the plurality of transistors T1, T2, T3, T4, T5, T6, and T7 may be a source electrode and the other may be a drain electrode depending on a voltage or current application direction.

Meanwhile, depending on exemplary embodiments, when the seventh transistor T7 initializes the anode of the organic light emitting diode OLED in the initialization period, even a small amount of current emitted under a condition that the driving transistor T1 is not actually turned on can be prevented from flowing toward the organic light emitting diode OLED. In this case, the small amount of current is output as a bypass current Ibp to a terminal of an initializa- tion voltage Vint through the seventh transistor T7. Accord- ingly, the organic light emitting diode OLED can be pre- vented from emitting unnecessary light so that a black gray can be more vividly displayed and a contrast ratio can be improved. In such a case, the bypass signal GB may be a timing signal that is different from the previous can signal Sn−1.

In the pixel PX that operates as described above, the blocking layer 31 does not specifically operate and the driving voltage ELVDD is constantly applied. Application of a constant voltage prevents the potential from being changed due to injection of a specific charge into the blocking layer 31. In addition, since the blocking layer 31 is between the substrate and the third transistor T3 while overlapping the third transistor T3 along the z-direction, permeation of an impurity from a flexible substrate formed of plastic or polyimide (PI) can be reduced or prevented in manufactur- ing of the third transistor T3. Accordingly, the third transis- tor T3 can have a desired characteristic. Further, no after- image may occur, as described later with reference to FIG. 20 and FIG. 21.

Figure 3:
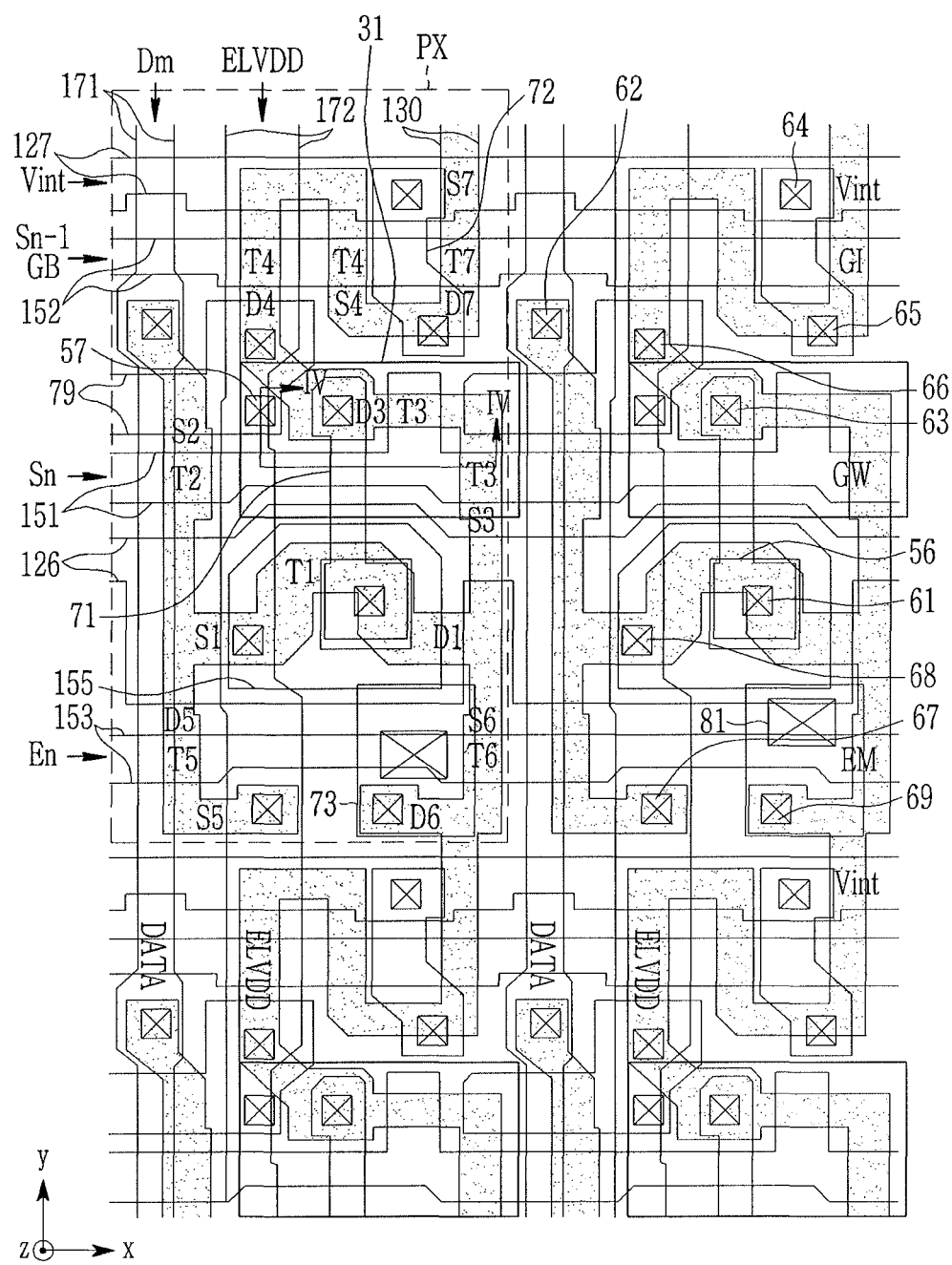
FIG. 3 illustrates a layout view of a pixel area of the OLED display according to the exemplary embodiment.

Hereinafter, alignment of a pixel and a blocking layer of an organic light emitting diode display and a connection therebetween according to an exemplary embodiment will be described with reference to FIG. 3 and FIG. 4. FIG. 3 is a layout view of a pixel area of an organic light emitting diode display according to an exemplary embodiment, and FIG. 4 is a cross-sectional view of FIG. 3, taken along the line IV-IV.

Figure 4:
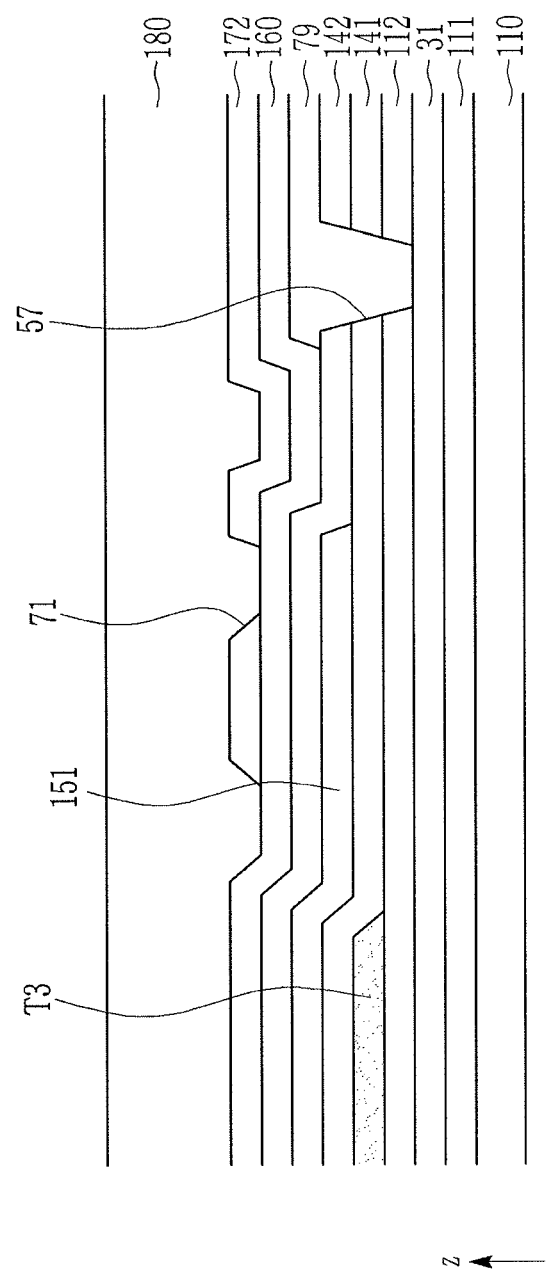
FIG. 4 illustrates a cross-sectional view of FIG. 3, taken along the line IV-IV.

Referring to FIG. 3 and FIG. 4, an OLED display accord- ing to an exemplary embodiment includes the scan line 151, the previous scan line 152, the light emission control line 153, and the initialization voltage line 127, which substantially extend along the x-direction and respectively transmit a scan signal Sn, a previous scan line Sn−1, an emission control signal EM, and an initialization voltage Vint. A bypass signal GB is transmitted through the previous scan line 152. The OLED display includes the data line 171 and the driving voltage line 172 that extend in the y-direction, and respectively transmit a data voltage Dm and a driving voltage ELVDD. The pixel Px in the OLED display may include the driving transistor T1, the second transistor T2, the third transistor T3, the fourth transistor T4, the fifth transistor T5, the sixth transistor T6, the seventh transistor T7, the storage capacitor Cst, and the organic light emitting diode OLED.

In addition, the OLED display according to FIG. 3 and FIG. 4 further includes a blocking layer 31 formed of a metal having a conductive characteristic or a semiconductor material having a conductive characteristic equivalent thereto. The blocking layer 31 may be between a flexible substrate 110 formed, e.g., of plastic or polyimide (PI), and a semiconductor layer. In addition, the blocking layer 31 overlaps a channel of the third transistor T3 on a plane, e.g., along the z-direction, and may overlap at least a part of first and second electrodes of the third transistor T3. The blocking layer 31 is connected to a voltage line, e.g., the driving voltage line 172 in the pixel PX (or an adjacent pixel), through a contact hole 57 to receive a voltage, e.g., the driving voltage ELVDD. In FIG. 3, the blocking layer 31 is illustrated as a thicker line compared to other portions in order to clearly illustrate the blocking layer 31.

The organic light emitting diode OLED is formed of a pixel electrode, an organic emission layer, and a common electrode.

Channels of the driving transistor T1, the second transistor T2, the third transistor T3, the fourth transistor T4, the fifth transistor T5, the sixth transistor T6, and the seventh transistor T7 may be in a semiconductor layer 130 that extends within the D1-D2 plane. In addition, at least a part of first and second electrodes of each of the plurality of transistors T1, T2, T3, T4, T5, T6, and T7 is in the semiconductor layer 130. The semiconductor layer 130 (the shaded part in FIG. 3 and will be the same hereinafter) may be bent into various shapes In the D1-D2 plane. The semiconductor layer 130 may include a polycrystalline semiconductor, e.g., polysilicon, or an oxide semiconductor.

The semiconductor layer 130 includes a channel doped with an N-type impurity or a P-type impurity, a first doping region, and a second doping region. The first and second doping regions are at opposite sides of the channel, and are more heavily doped with the impurity than the channel. The first doping region and the second doping region correspond to a first electrode and a second electrode of each of the plurality of transistors T1, T2, T3, T4, T5, T6, and T7. When one of the first doping region and the second doping region is a source region, the other is a drain region. In addition, a region between first electrodes and second electrodes of different transistors may also doped in the semiconductor layer 130 such that the two transistors may be electrically connected with each other.

A channel of each of the plurality of transistors T1, T2, T3, T4, T5, T6, and T7 may overlap a gate electrode of each of the transistors T1, T2, T3, T4, T5, T6, and T7, and is between the first electrode and the second electrode of each of the transistors T1, T2, T3, T4, T5, T6, and T7. The plurality of transistors T1, T2, T3, T4, T5, T6, and T7 may substantially have the same layering structure along the z-direction. Hereinafter, the driving transistor T1 will be mainly described, and the other transistors T2, T3, T4, T5, T6, and T7 will be briefly described.

The driving transistor T1 includes a channel, a gate electrode 155, a first electrode S1, and a second electrode D1. The channel of the driving transistor T1 is between the first electrode S1 and the second electrode D1, and overlaps the gate electrode 155 on a plane, e.g., along the z-direction. The channel may be curved to extend a length of the channel in a limited area. As the length of the channel increases, a driving range of a gate voltage Vg applied to the gate electrode 155 of the driving transistor T1 widens and a driving current Id increases according to the gate voltage Vg. Accordingly, grayscales of light emitted from the organic light emitting diode OLED can be more finely adjusted by changing the magnitude of the gate voltage Vg. Thus, display quality of the OLED display may be improved.

In addition, since the channel can be extended in multiple directions rather than extending in one direction, an influence due to directivity during a manufacturing process can be offset, thereby reducing process dispersion. Accordingly, a stain problem (e.g., a luminance difference that occurs depending on pixels even when the same data voltage Dm is applied), which may occur due to a change in a characteristic of the driving transistor T1 due to process dispersion, may be reduced or prevented. Such a shape of the channel may vary rather than being limited to the shape Ω shown in the drawing, as will be described with reference to FIG. 41 and FIG. 42 later.

The gate electrode 155 overlaps the channel on a plane, e.g., along the third z-direction. The first electrode S1 and the second electrode D1 are at opposite sides of the channel. An expanded portion of a sustain line 126 is on the gate electrode 155 in an insulated manner. The expanded portion of the sustain line 126 overlaps the gate electrode 155 along the z-direction, with a second gate insulation layer therebetween such that a storage capacitor Cst is formed. The expanded portion of the sustain line 126 is a first electrode EI (refer to FIG. 1) of the storage capacitor Cst, and the gate electrode 155 forms a second sustain electrode E2 (refer to FIG. 1). The expanded portion of the sustain line 126 includes an opening 56 and thus the gate electrode 155 can be connected with a first data connection member 71. An upper surface of the gate electrode 155 and the first data connection member 71 are electrically connected with each other in the opening 56 through a contact hole 61. The first data connection member 71 is connected with a second electrode D3 of the third transistor T3. Thus, gate electrode 155 of the driving transistor T1 and the second electrode D3 of the third transistor T3 are connected.

A gate electrode of the second transistor T2 may be a part of the scan line 151. The data line 171 is connected to a first electrode of the second transistor T2 through the contact hole 62, and the first electrode S2 and the second electrode D2 of the second transistor T2 may be on the semiconductor layer 130.

The third transistor T3 may be formed of two adjacent transistors. That is, reference numerals T3 are shown in the left side and the lower side with reference to a portion where the semiconductor layer 130 is bent in the pixel PX in FIG. 3. The two portions serve as third transistors T3, and a first electrode of one of the two third transistors T3 is connected with a second electrode of the other third transistor T3. Gate electrodes of the two transistors T3 may be a part of the scan line 151 or a portion protruded upward along the z-direction from the scan line 151. Such a structure may be called a dual gate structure, and a leakage current may be reduced or prevented by using the dual gate structure. The first electrode S3 of the third transistors T3 is connected with a first electrode S6 of the sixth transistor T6 and the second electrode D1 of the driving transistor T1. The second electrode D3 of the third transistors T3 is connected with the first data connection member 71 through a contact hole 63.

The blocking layer 31 overlaps a channel of the third transistor T3 on a plane, e.g., along the z-direction, and may overlap at least a part of the first electrode S3 and the second electrode D3 of the third transistor T3. Alternatively, the blocking layer 31 may wholly overlap the third transistor T3 along the z-direction. The blocking layer 31 may be connected with the driving voltage line 172 in the pixel PX through the contact hole 57 to receive the driving voltage ELVDD.

The fourth transistor T4 may be a dual gate structure, e.g., two fourth transistors T4 where the previous scan line 152 and the semiconductor layer 130 meet each other. Gate electrodes of the fourth transistors T4 may be a part of the previous scan lines 152. A first electrode of one of the two fourth transistors T4 is connected with a second electrode of the other fourth transistor T4. A second data connection member 72 is connected to a first electrode S4 of the fourth transistor T4 through a contact hole 65, and a second electrode D4 of the fourth transistor T4 is connected with the first data connection member 71 through the contact hole 63.

As described, since the third transistor T3 and the fourth transistor T4 have dual gate structures, an electron moving path of the channels is prevented in an off state so the generation of the leakage current may be effectively reduced or prevented.

A gate electrode of the fifth transistor T5 may be a part of the light emission control line 153. The driving voltage line 172 is connected to a first electrode S5 of the fifth transistor T5 through a contact hole 67, and a second electrode D5 is connected with the first electrode S1 of the driving transistor T1 through the semiconductor layer 130.

A gate electrode of the sixth transistor T6 may be a part of the light emission control line 153. A third data connection member 73 is connected to a second electrode D6 of the sixth transistor T6 through a contact hole 69, and a first electrode S6 is connected with the second electrode D1 of the driving transistor T1 through the semiconductor layer 130.

A gate electrode of the seventh transistor T7 may be a part of the previous scan line 152. The third data connection member 73 is connected to a first electrode S7 of the seventh transistor T7 through a contact hole 81, and a second electrode D7 is connected with the first electrode S4 of the fourth transistor T4.

The storage capacitor Cst includes the first sustain electrode E1 and the second sustain electrode E2 that overlap each other, while a second gate insulation layer 142 is therebetween along the z-direction. The second sustain electrode E2 may correspond to the gate electrode 155 of the driving transistor T1, and the first sustain electrode E1 may correspond to the expanded portion of the sustain line 126. Here, the second gate insulation layer 142 is a dielectric material, and capacitance is determined by charges charged in the storage capacitor Cst and a voltage between the first and second sustain electrodes E1 and E2. Since the gate electrode 155 is used as the second sustain electrode E2, a space occupied by the storage capacitor Cst can be reduced, while space for the channel of the driving transistor T1, which occupies a large area in the pixel, can be assured.

The driving voltage line 172 is connected to the first sustain electrode E1 through a contact hole 68. Thus, the storage capacitor Cst stores charges that correspond to a difference between the driving voltage ELVDD transmitted to the first sustain electrode E1 through the driving voltage line 172 and the gate voltage Vg of the gate electrode 155.

The second data connection member 72 is connected with the initialization voltage line 127 through a contact hole 64. A pixel electrode is connected to the third data connection member 73 through the contact hole 81.

A parasitic capacitor control pattern 79 may be between dual gate electrodes of the third transistors T3. A parasitic capacitor exists in the pixel. When a voltage applied to the parasitic capacitor is changed, an image quality characteristic may be changed. The driving voltage line 172 is connected to the parasitic capacitor control pattern 79 through a contact hole 66. Thus, the driving voltage ELVDD, which is a constant DC voltage, is applied to the parasitic capacitor, thereby preventing the image quality characteristic from being changed. The parasitic capacitor control pattern 79 may be in an area other than the area shown in the drawing, and a voltage other than the driving voltage ELVDD may be applied.

A stacking sequence in a cross-sectional structure of the OLED display according to the present exemplary embodiment will be described with reference to FIG. 4 along the z-direction. FIG. 4 shows a cross-sectional view of the blocking layer 31 in the OLED display, taken along the line IV-IV of FIG. 3. A cross-sectional layering structure of an OLED display according to an exemplary embodiment will be described further before describing of a layering relationship of a portion in detail with reference to FIG. 4.

The OLED display according to the exemplary embodiment uses a substrate 110 made of a flexible material such as plastic or polyimide (PI). A barrier layer 111 may be on the substrate 110, and the blocking layer 31 made of a metal having a conductive characteristic or a semiconductor material having a conductive characteristic equivalent thereto may be on the barrier layer 111. A buffer layer 112 may be on the blocking layer 31. The barrier layer 111 and the buffer layer 112 may include an inorganic insulation material, e.g., a silicon oxide, a silicon nitride, an aluminum oxide, and the like, and may include an organic insulation material, e.g., a polyimide acryl (epoxy added).

The semiconductor layer 130 that includes the channels, the first electrodes, and the second electrodes of the plurality of transistors T1, T2, T3, T4, T5, T6, and T7 may be on the buffer layer 112. A first gate insulation layer 141 that covers the semiconductor layer 130 may be on the semiconductor layer 130. A first gate conductor that includes gate electrodes (second sustain electrodes E2) of the plurality of transistors T1, T2, T3, T4, T5, T6, and T7, the scan line 151, the previous scan line 152, and the light emission control line 153 may be on the first gate insulation layer 141. The second gate insulation layer 142 that covers the first gate conductor may be on the first gate conductor. The first gate insulation layer 141 and the second gate insulation layer 142 may be made of a material such as a silicon nitride, a silicon oxide, and an aluminum oxide. A second gate conductor that includes the sustain line 126, the first sustain electrode E1, the initialization voltage line 127, and the parasitic capacitor control pattern 79 may be on the second gate insulation layer 142.

An interlayer insulation layer 160 that covers the second gate conductor may be on the second gate conductor. The interlayer insulation layer 160 may be made of an inorganic material, e.g., silicon nitride, silicon oxide, aluminum oxide, and the like, or may be made of an organic insulation material. A data conductor that includes the data line 171, the driving voltage line 172, the first data connection member 71, the second data connection member 72, and a third data connection member (see reference numeral 73 in FIG. 8) may be on the interlayer insulation layer 160.

A passivation layer 180 that covers the data conductor is disposed on the data conductor. The passivation layer 180, i.e., a planarization layer, may include an organic insulation material. A pixel electrode may be on the passivation layer 180. The pixel electrode is connected with the third data connection member through a contact hole (see reference numeral 81 in FIG. 8) formed in the passivation layer 180. A barrier rib may be on the passivation layer 180 and the pixel electrode. The barrier rib has an open portion that overlaps the pixel electrode along the z-direction and an organic emission layer may be in the open portion. A common electrode may be on the organic emission layer and the barrier rib. The pixel electrode, the organic emission layer, and the common electrode form the organic light emitting diode OLED.

Depending on exemplary embodiments, the pixel electrode may be an anode, e.g., a hole injection electrode, and the common electrode may be a cathode, e.g., an electron injection electrode. On the contrary, the pixel electrode may be a cathode and the common electrode may be an anode. The hole and electron are injected into the organic emission layer from the pixel electrode and the common electrode, respectively, and an exciton generated by coupling the injected hole and electron falls from an excited state to a ground state to emit light.

The scan line 151, provided as the first gate conductor, the previous scan line 152, and the light emission control line 153 extend in the x-direction, and the sustain line 126 and the initialization voltage line 127, provided as the second gate conductor, also extend in the x-direction. Meanwhile, the data line and the driving voltage line 172, provided as the data conductor, extend in the y-direction.

The data line 171 is connected with the first electrode S2 of the second transistor T2 through the contact hole 62 formed in the first gate insulation layer 141, the second gate insulation layer 142, and the interlayer insulation layer 160.

The driving voltage line 172 is connected to the first electrode S5 of the fifth transistor T5 through the contact hole 67 in the first gate insulation layer 141, the second gate insulation layer 142, and the interlayer insulation layer 160, is connected with the expanded portion (first sustain electrode E1) of the sustain line 126 through the contact hole 68 formed in the interlayer insulation layer 160, and is connected with the parasitic capacitor control pattern 79 through the contact hole 66 formed in the interlayer insulation layer 160. In addition, the driving voltage line 172 is electrically connected with the blocking layer 31 through the contact hole 57 in the buffer layer 112, the first gate insulation layer 141, the second gate insulation layer 142, and the interlayer insulation layer 160.

A first end of the first data connection member 71 is connected with the gate electrode 155 through the contact hole 61 formed in the second gate insulation layer 142 and the interlayer insulation layer 160, and a second end is connected with the second electrode D3 of the third transistor T3 and the second electrode D4 of the fourth transistor T4 through the contact hole 63 formed in the first gate insulation layer 141, the second gate insulation layer 142, and the interlayer insulation layer 160.

A first end of the second data connection member 72 is connected with the first electrode S4 of the fourth transistor T4 through the contact hole 65 formed in the first gate insulation layer 141, the second gate insulation layer 142, and the interlayer insulation layer 160, and a second end is connected with the initialization voltage line 127 through the contact hole 64 formed in the interlayer insulation layer 160.

The third data connection member (see reference numeral 73 of FIG. 8) is connected with a second electrode S6 of the sixth transistor T6 through the contact hole 69 formed in the first gate insulation layer 141, the second gate insulation layer 142, and the interlayer insulation layer 160.

An encapsulation layer that protects the organic light emitting diode OLED may be on the common electrode. The encapsulation layer may contact or separated from the common electrode. The encapsulation layer may be a thin film encapsulation formed by stacking an inorganic layer and an organic layer, and may have a three-layered structure of an inorganic layer, an organic layer, and an inorganic layer. A capping layer and a function layer may be between the common electrode and the encapsulation layer.

In FIG. 4, a structure in which the blocking layer 31 is electrically connected is illustrated in detail. Referring to FIG. 4, the barrier layer 111 may be on the substrate 110, and the blocking layer 31 maybe on the barrier layer 111. The location of the blocking layer 31 overlaps the third transistor T3 on a plane as shown in FIG. 3, e.g., along the z-direction as shown in FIG. 4. The buffer layer 112 is on the blocking layer 31. The semiconductor layer 130 is on the buffer layer 112, and a channel region of the third transistor T3 is illustrated in FIG. 4. The first gate insulation layer 141 is on the channel region of the third transistor T3 and the buffer layer 112. The scan line 151 is on the first gate insulation layer. The second gate insulation layer 142 is on the scan line 151. The contact hole 57 in the buffer layer 112, the first gate insulation layer 141, and the second gate insulation layer 142 partially exposes the blocking layer 31, and the parasitic capacitor control pattern 79 may fill the contact hole 57. The parasitic capacitor control pattern 79 and the blocking layer 31 are electrically connected with each other.

Here, the parasitic capacitor control pattern 79 is connected with the driving voltage line 172 through the contact hole 66 and receives the driving voltage ELVDD. Thus, the driving voltage ELVDD is also applied to the blocking layer 31. The interlayer insulation layer 160 is on the parasitic capacitor control pattern 79. The first data connection member 71 and the driving voltage line 172 are disposed on the interlayer insulation layer 160. The passivation layer 180 is on the first data connection member 71 and the driving voltage line 172, and the pixel electrode, the organic emission layer, the common electrode, and the encapsulation layer may be thereon.

The blocking layer 31 according to the exemplary embodiment of FIG. 3 and FIG. 4 receives the driving voltage ELVDD and, along the z-direction, overlaps the third transistor T3, is above the substrate 110, below the semiconductor layer 130, and between the barrier layer 111 and the buffer layer 112.

Figure 5:
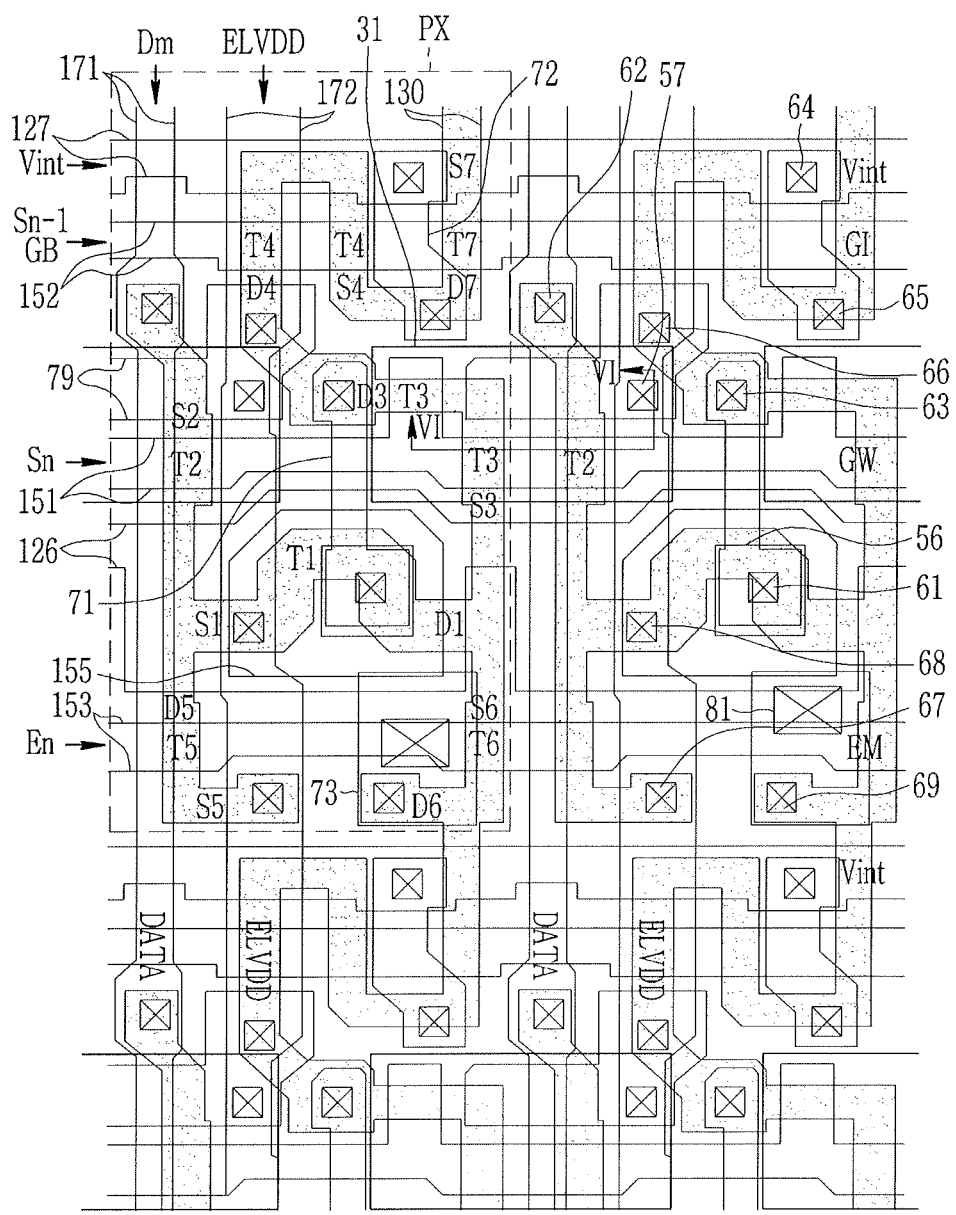
FIG. 5 illustrates a layout view of a pixel area of an OLED display according to an exemplary embodiment.
Figure 6:
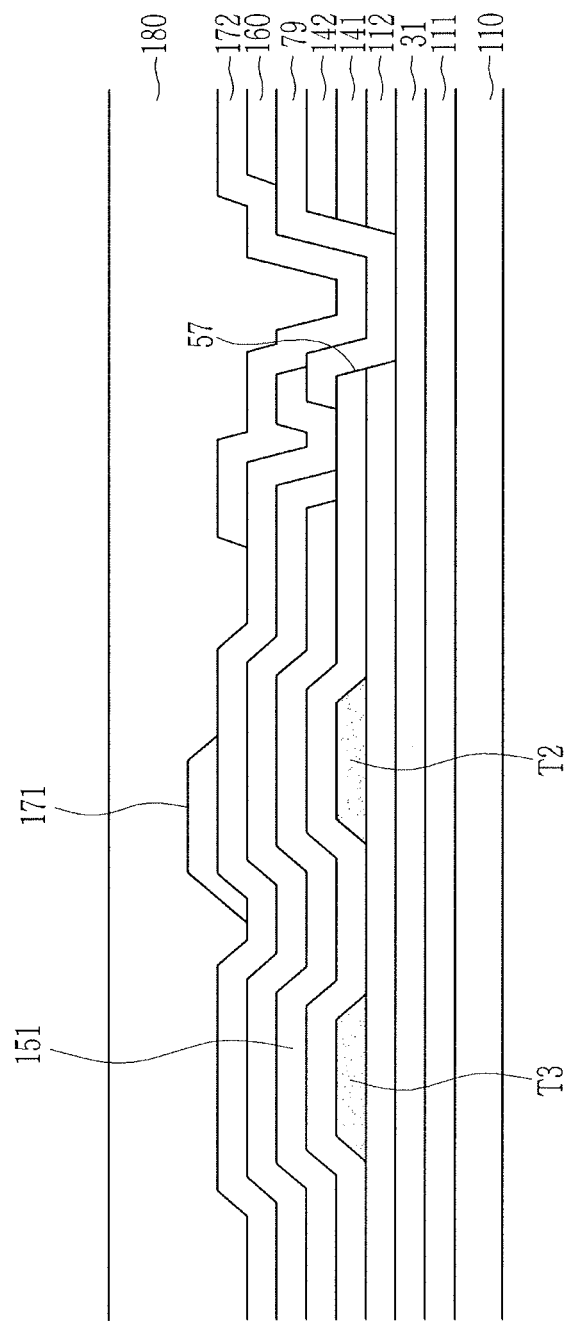
FIG. 6 illustrates a cross-sectional view of FIG. 5, taken along the line VI-VI.

The blocking layer 31 having such a characteristic may have a structure shown in FIG. 5 and FIG. 6. FIG. 5 is a layout view of a pixel area of an OLED display according to an exemplary embodiment, and FIG. 6 is a cross-sectional view of FIG. 5, taken along the line VI-VI.

An OLED display according to the exemplary embodiment of FIG. 5 has the same features as the OLED display of the exemplary embodiment of FIG. 3 and FIG. 4, except for a location of a blocking layer on a plane and a connection relationship on a cross-section. That is, the exemplary embodiment of FIG. 5 and FIG. 6 may also be illustrated as a circuit diagram like the circuit diagram of FIG. 1, and operation can be carried out by receiving a timing signal like the timing signal shown in FIG. 2.

However, unlike the exemplary embodiment of FIG. 1, in the exemplary embodiment of FIG. 5 and FIG. 6, the blocking layer 31 also overlaps the second transistor T2 along the z-direction. The same description provided with reference to FIG. 3 and FIG. 4 will be omitted, and only a difference will be described with reference to FIG. 5 and FIG. 6.

In FIG. 5, the contact hole 57 where a blocking layer 31 that overlaps transistors T2 and T3 and the blocking layer 31 are electrically connected is in adjacent pixels PX. In particular, in the exemplary embodiment of FIG. 5, the blocking layer 31 is connected with the parasitic capacitor control pattern 79 through the contact hole 57 in an adjacent pixel, and then overlaps the second transistor T2 therebetween, while overlapping the third transistor T3 in the pixel PX. When the exemplary embodiment of FIG. 5 is illustrated exactly the same as the circuit diagram of FIG. 1, a quadrangle may be drawn at the periphery of the second transistor T2 and then the quadrangle may be drawn to be connected with the driving voltage line 172.

In FIG. 6, a connection relationship for the blocking layer 31 to receive a driving voltage ELVDD is illustrated. As shown in FIG. 4, the blocking layer 31 of FIG. 6 may be electrically connected with the driving voltage line 172 through the parasitic capacitor control pattern 79 therebetween rather than being directly connected to the driving voltage line 172. The difference in the cross-sectional structure in FIG. 6 and FIG. 4 is the difference depending on the position of the cross-sectional line and the difference depending on how the contact hole is formed. However, the blocking layer 31 is connected with the driving voltage line 172 through the parasitic capacitor control pattern 79 in both of FIG. 4 and FIG. 6.

Figure 7:
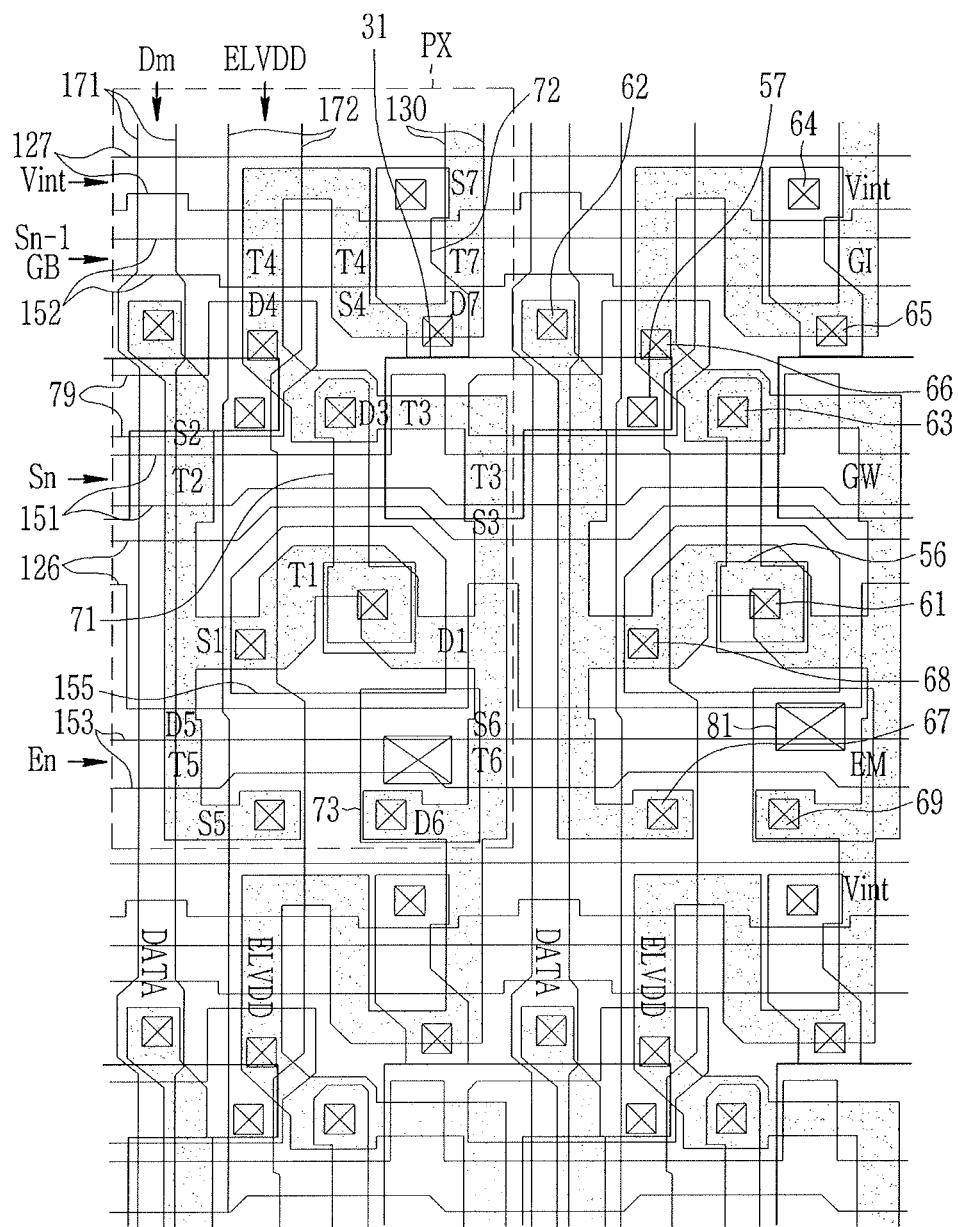
FIG. 7 illustrates a layout view of a pixel area of an OLED display according to an exemplary embodiment.

The blocking layer 31 may have a structure like that shown in FIG. 7. FIG. 7 is a layout view of a pixel area of an OLED display according to an exemplary embodiment.

Unlike FIG. 5, FIG. 7 illustrates a structure in which a blocking layer overlaps a third transistor, without overlapping a channel region of a second transistor T2 while being connected with a parasitic capacitor control patter 79 through a contact hole 57, in an adjacent pixel PX. A connection relationship is the same as that shown in FIG. 6, and a cross-sectional view is not provided.

Figure 8:
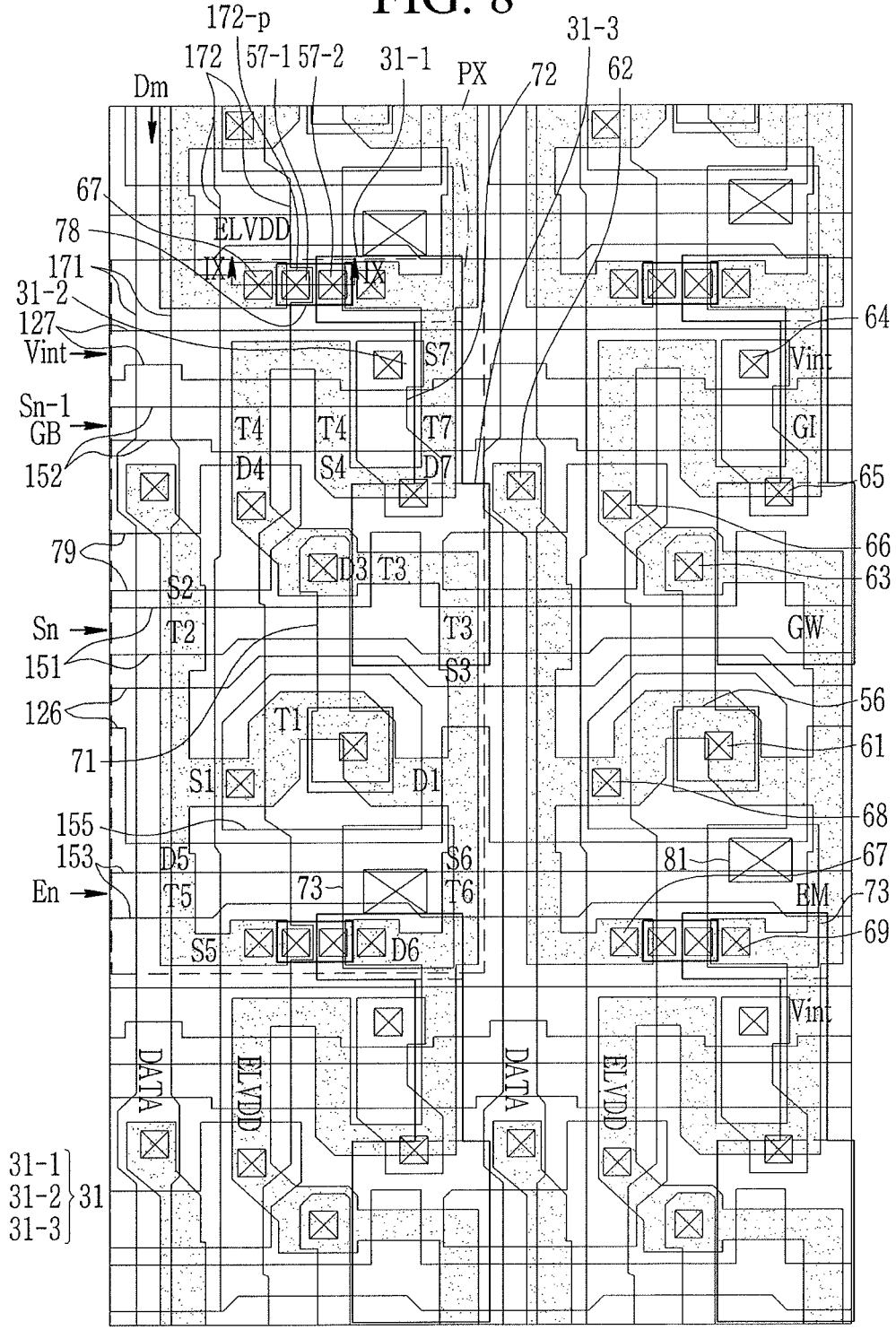
FIG. 8 illustrates a layout view of a pixel area of an OLED display according to an exemplary embodiment.
Figure 9:
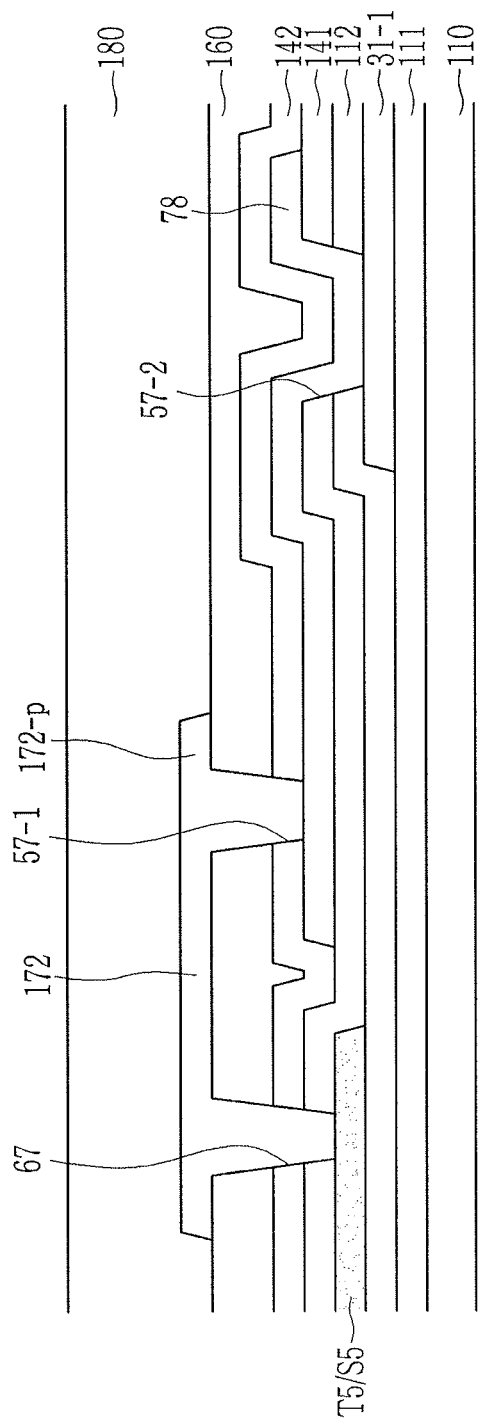
FIG. 9 illustrates a cross-sectional view of FIG. 8, taken along the line IX-IX.

A blocking layer 31 may have a structure shown in FIG. 8 and FIG. 9. FIG. 8 is a layout view of a pixel area of an OLED display according to an exemplary embodiment, and FIG. 9 is a cross-sectional view of FIG. 8, taken along the line IX-IX. The blocking layer 31 of FIG. 8 has a structure that overlaps only a third transistor T3, but is connected with a driving voltage line 172 in a different manner than in FIG. 3, FIG. 5, and FIG. 7.

In the exemplary embodiment of FIG. 8, the blocking layer 31 further includes a bent portion for connecting to the driving voltage line 172. In particular, the blocking layer 31 according to the exemplary embodiment of FIG. 8 includes an expansion portion 31-3 that overlaps the third transistor T3 on a plane, a contact portion 31-1 that receives a driving voltage ELVDD, and a connection portion 31-2 that connects the expansion portion 31-3 and the connection portion 31-2.

In addition, unlike the driving voltage line of FIG. 3, FIG. 5, and FIG. 7, the driving voltage line 172 of the exemplary embodiment of FIG. 8 includes a protrusion portion 172-p that protrudes sideways, e.g., along the x-direction towards the contact portion 31-1. The protrusion portion 172-p of the driving voltage line 172 is connected with one end of a connection member 78, provided as a second gate conductor, through a contact hole 57-1. The other end of the connection member 78 is connected with the contact portion 31-1 of the blocking layer 31 through a contact hole 57-2. Accordingly, the blocking layer 31 receives the driving voltage ELVDD.

The exemplary embodiment of FIG. 8 and FIG. 9 has a structure in which the connection portion 31-2 overlaps a seventh transistor T7. That is, when the exemplary embodiment of FIG. 8 is illustrated as a circuit diagram such as FIG. 1, a quadrangle may be drawn at the periphery of the seventh transistor T7 and then the quadrangle may be drawn to be connected with the driving voltage line 172.

Figure 10:
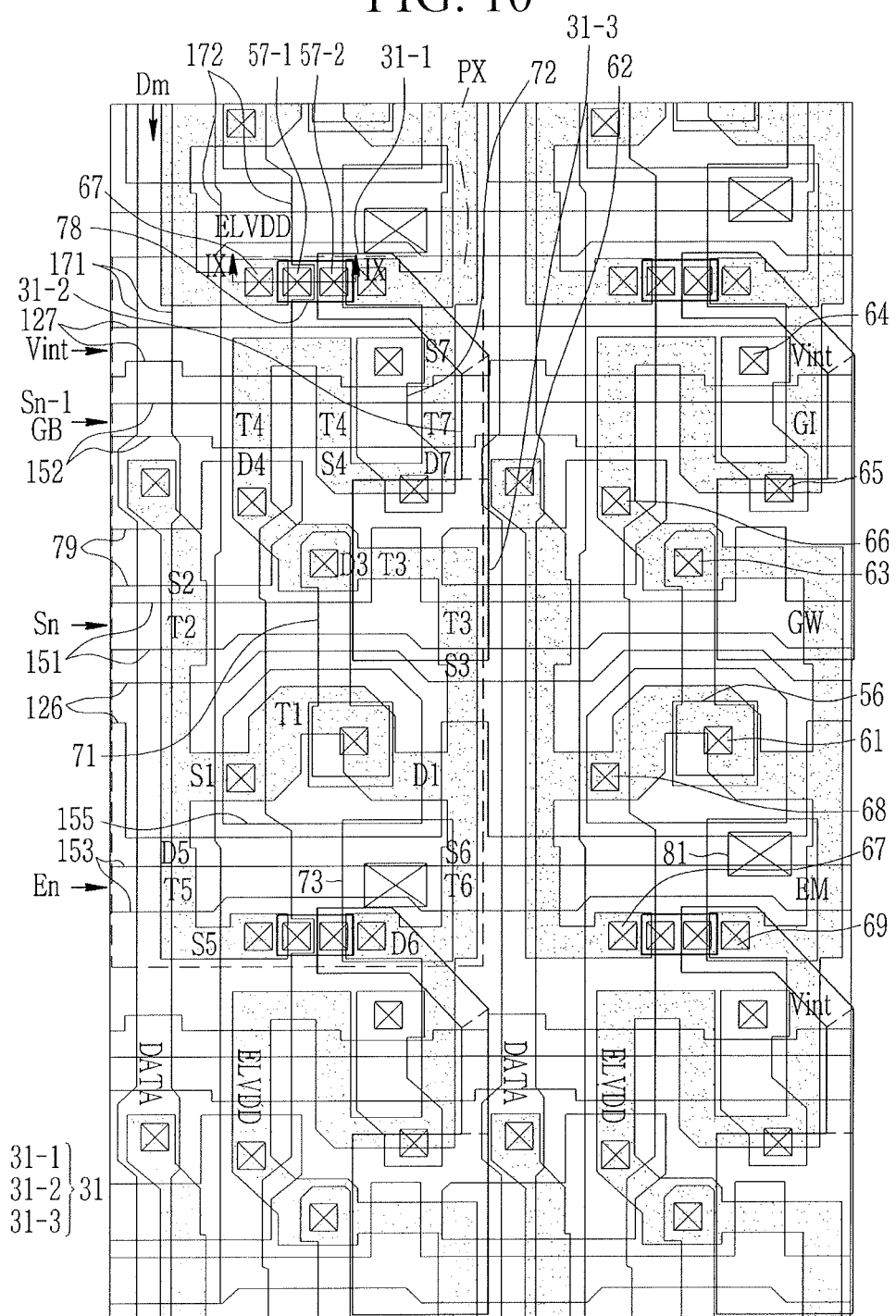
FIG. 10 illustrates a layout view of a pixel area of an OLED display according to an exemplary embodiment.

However, depending on exemplary embodiments, the connection portion 31-2 may be along an edge of the pixel to minimize overlap with other transistors. This is shown in FIG. 10. The blocking layer 31 may have a structure shown in FIG. 10. FIG. 10 is a layout view of a pixel area of an OLED display according to an exemplary embodiment. Unlike FIG. 8, in FIG. 10, a connection portion 31-2 is formed along a boundary (illustrated as a dotted line) of a pixel PX such that the connection portion 31-2 does not overlap a channel region of a seventh transistor T7.

Hereinabove, the exemplary embodiment having the circuit diagram like FIG. 1, wherein the blocking layer 31 overlaps the third transistor T3 on a plane and receives the driving voltage ELVDD, has been described. Hereinafter, a structure in which a blocking layer overlaps not only the third transistor T3, but also the driving transistor T1 will be described.

Figure 11:
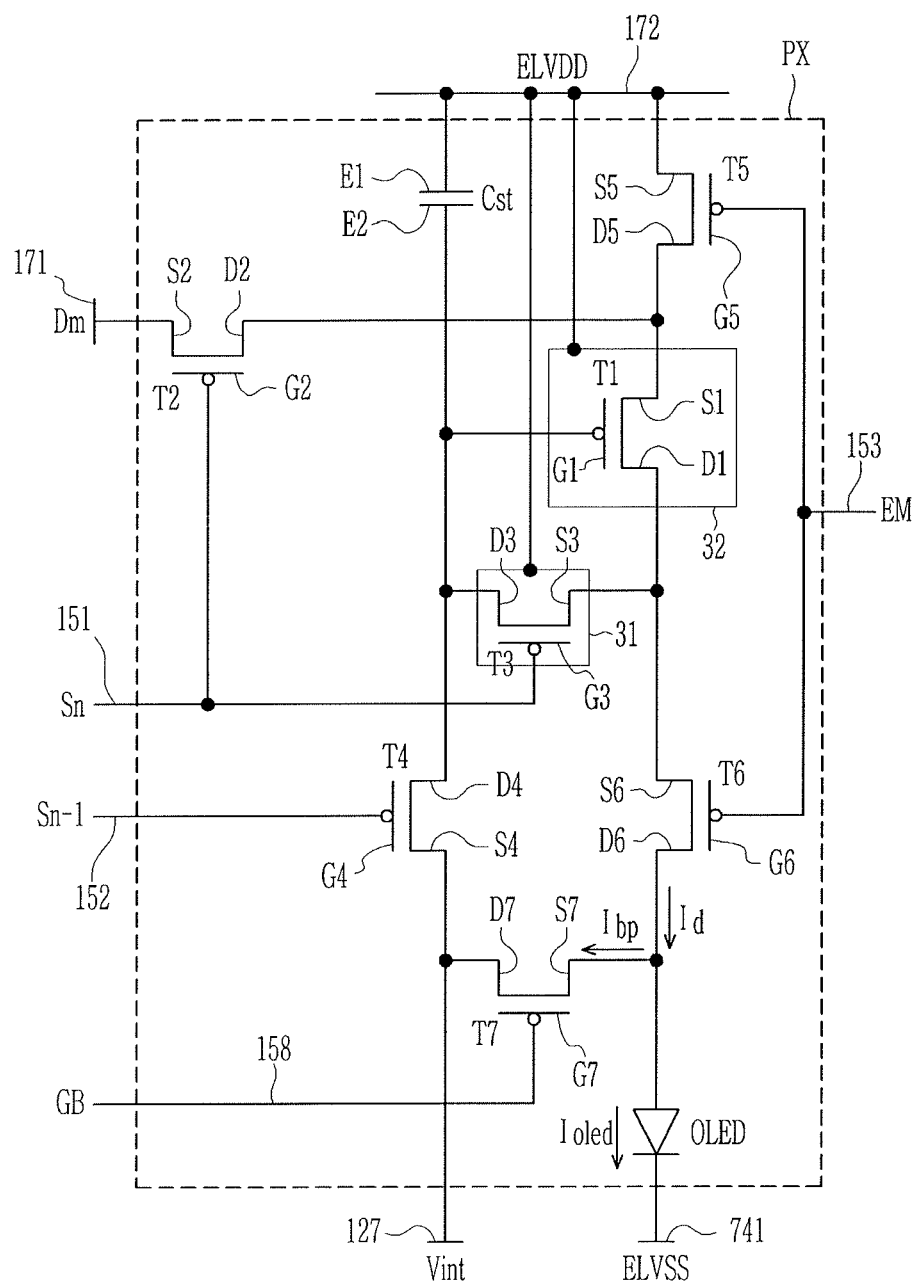
FIG. 11 illustrates an equivalent circuit diagram of a pixel of an OLED display according to an exemplary embodiment.

FIG. 11 is an equivalent circuit diagram of a pixel of an OLED display according to an exemplary embodiment. FIG. 11 is almost the same as FIG. 1, and only a difference will be described. A blocking layer 32 of FIG. 11 overlaps a driving transistor T1 and also receives a driving voltage ELVDD. That is, in the OLED display according to the exemplary embodiment of FIG. 11, two blocking layers 31 and 32 are provided. In particular, one of the two blocking layers 31 and 32 overlaps the third transistor T3 on a plane and the other overlaps the driving transistor T1 on a plane. The two blocking layers 31 and 32 both receive a driving voltage ELVDD through contact holes provided in a pixel PX or an adjacent pixel.

The two blocking layers 31 and 32 may be integrally connected or may be separately provided, e.g., may receive the driving voltage ELVDD through different contact holes. Depending on exemplary embodiment, the two blocking layers 31 and 32 may receive the same or different voltages, e.g., the same or different ones of the driving voltage ELVDD, an initialization voltage Vint, a common voltage ELVSS, a scan signal Sn, a previous scan signal Sn−1, a data voltage Dm, and a light emission control signal EM. The two blocking layers 31 and 32 may be connected with one terminal of each of a plurality of transistors T1 to T7 or one terminal of an organic light emitting diode.

Figure 12:
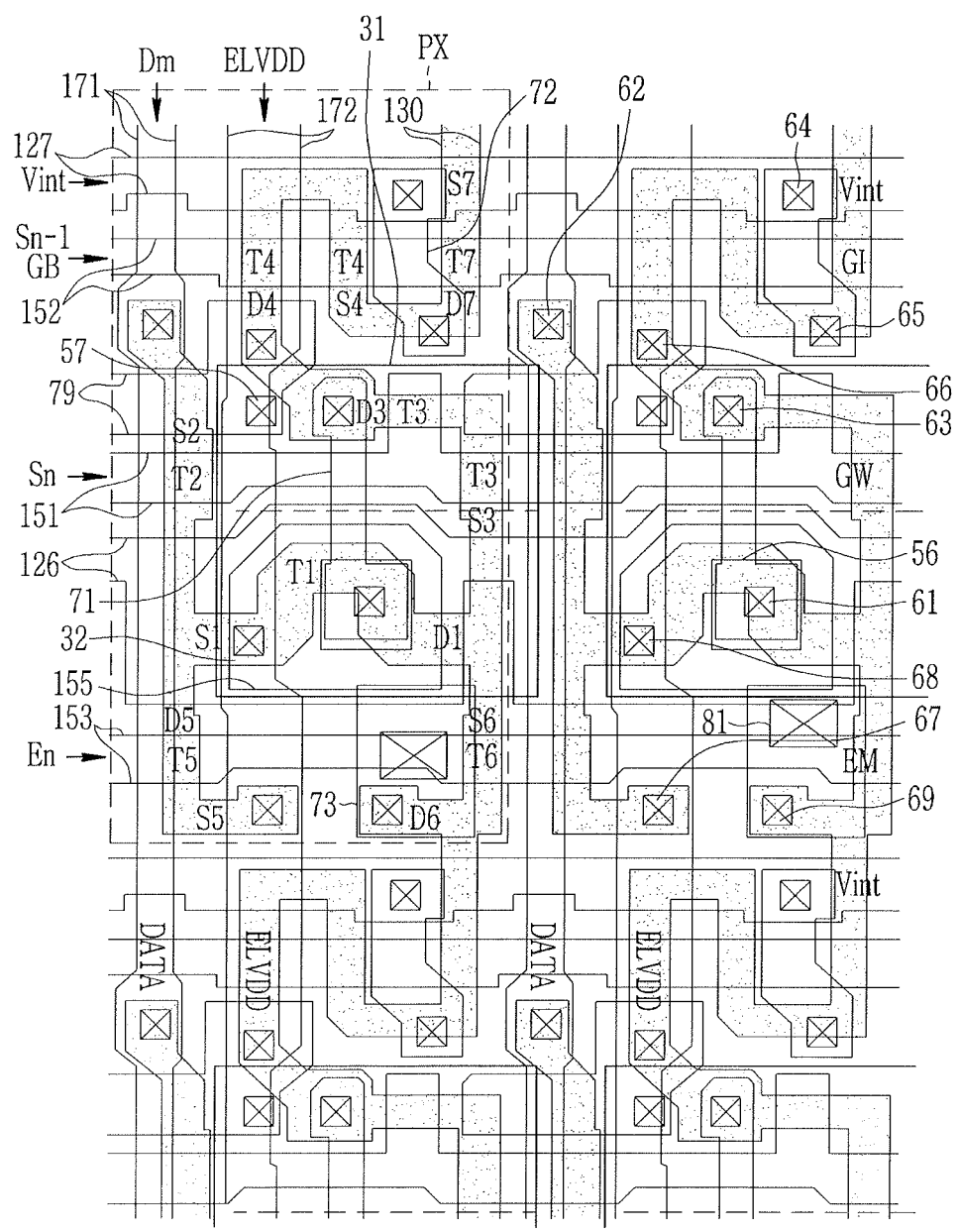
FIG. 12 and FIG. 13 illustrate layout views of a pixel area of an OLED display according to an exemplary embodiment.
Figure 13:
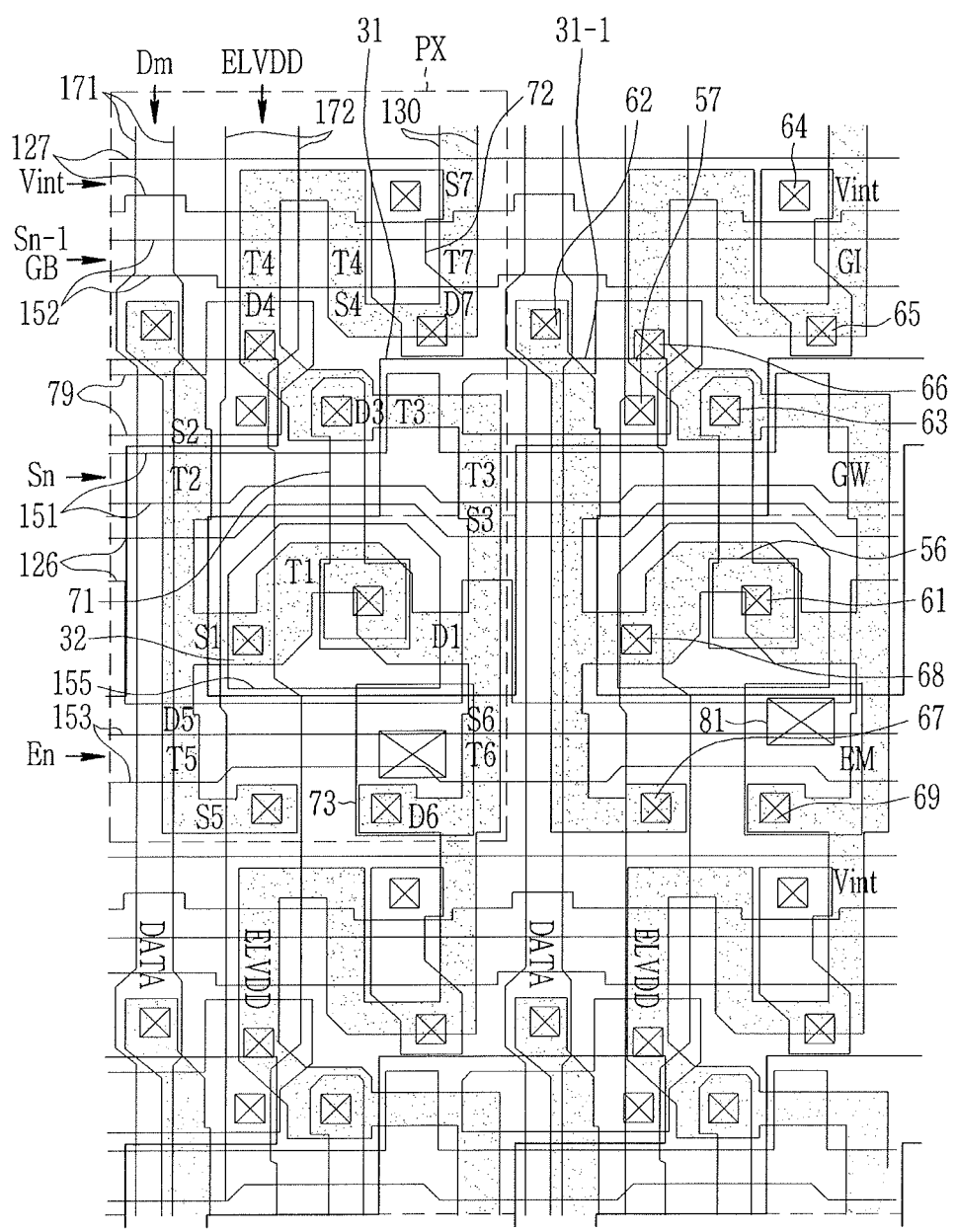

Such a structure of the blocking layers 31 and 32 will now be described. The blocking layers 31 and 32 may have a structure of FIG. 12 and FIG. 13. FIG. 12 and FIG. 13 are layout views of a pixel area of an OLED display according to an exemplary embodiment.

First, a structure of FIG. 12 will be described. In order to clearly illustrate the blocking layers, the blocking layers 31 and 32 are illustrated with thicker lines than other portions in FIG. 12.

In FIG. 12, the blocking layers 31 and 32 are connected with each other, and receive a driving voltage ELVDD through a contact hole 57. The blocking layer 31 overlaps a third transistor T3 on a plane and the blocking layer 32 overlaps a driving transistor on a plane. In FIG. 12, the blocking layer 31 and the blocking layer 32 are separated by a dotted line.

A connection structure of the blocking layers 31 and 32 through the contact hole 57 is the same as the connection structure of FIG. 4 of FIG. 6, and therefore no further detailed drawing is illustrated. That is, the blocking layer 31 is connected with a parasitic capacitor control pattern 79 through the contact hole 57 in the blocking layer 31 and the parasitic capacitor control pattern 79 is connected with a driving voltage line 172 through a contact hole 66. Thus, the blocking layer 31 receives the driving voltage ELVDD. The blocking layer 32 that overlaps the driving transistor T1 on a plane is formed in one structure with the blocking layer 31 that overlaps the third transistor T3 on a plane. Thus, the blocking layer 32 also receives the driving voltage ELVDD. The blocking layers 31 and 32 are between a substrate 110 that is formed of plastic or polyimide (PI) in a cross-sectional view, and are separated from the substrate 110 and the semiconductor layer 130 by a barrier layer 111 and a buffer layer 112.

A degree of overlap of the blocking layers 31 and 32 with the transistors T3 and T1 may be changed depending on exemplary embodiments, and may overlap channel regions of the transistors T3 and T1, respectively, on a plane. Depending on exemplary embodiments, the blocking layer 31 and 32 may overlap at least a part of a first region or a second region of the transistors T1 and T3, respectively.

The shape and connection of the blocking layers of FIG. 13 are different from those of FIG. 12. That is, the blocking layers 31 and 32 of FIG. 13 receive a driving voltage ELVDD through a contact hole 57 in an adjacent pixel PX, and overlap a third transistor T3 and a driving transistor T1 on a plane while extending into the pixel PX. A contact portion 31-1 that is connected with the contact hole 57 in the adjacent pixel PX also overlaps a second transistor T2 in the adjacent pixel while extending into the pixel PX where the blocking layers 31 and 32 are disposed. Accordingly, the exemplary embodiment of FIG. 13 may be illustrated in a structure that further includes a blocking layer at the periphery of the second transistor T2 in the circuit diagram of FIG. 11, and the corresponding blocking layer is connected with the driving voltage line 172. A structure in which the contact hole 57 and the contact portion 31-1 are connected with each other in the adjacent pixel PX in FIG. 13 is the same as the structure shown in FIG. 4 or FIG. 6.

Figure 14:
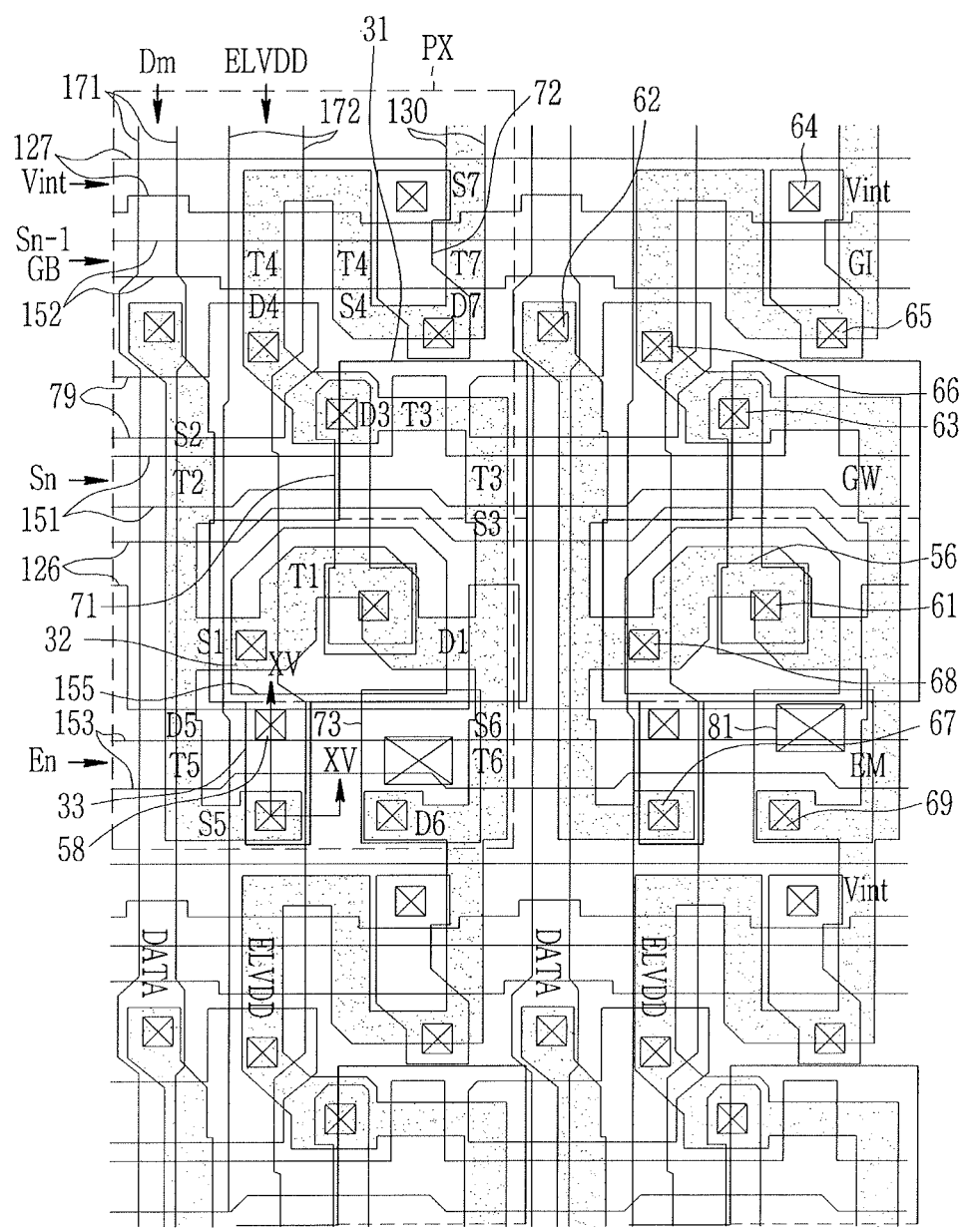
FIG. 14 illustrates a layout view of a pixel area of an OLED display according to an exemplary embodiment.
Figure 15:
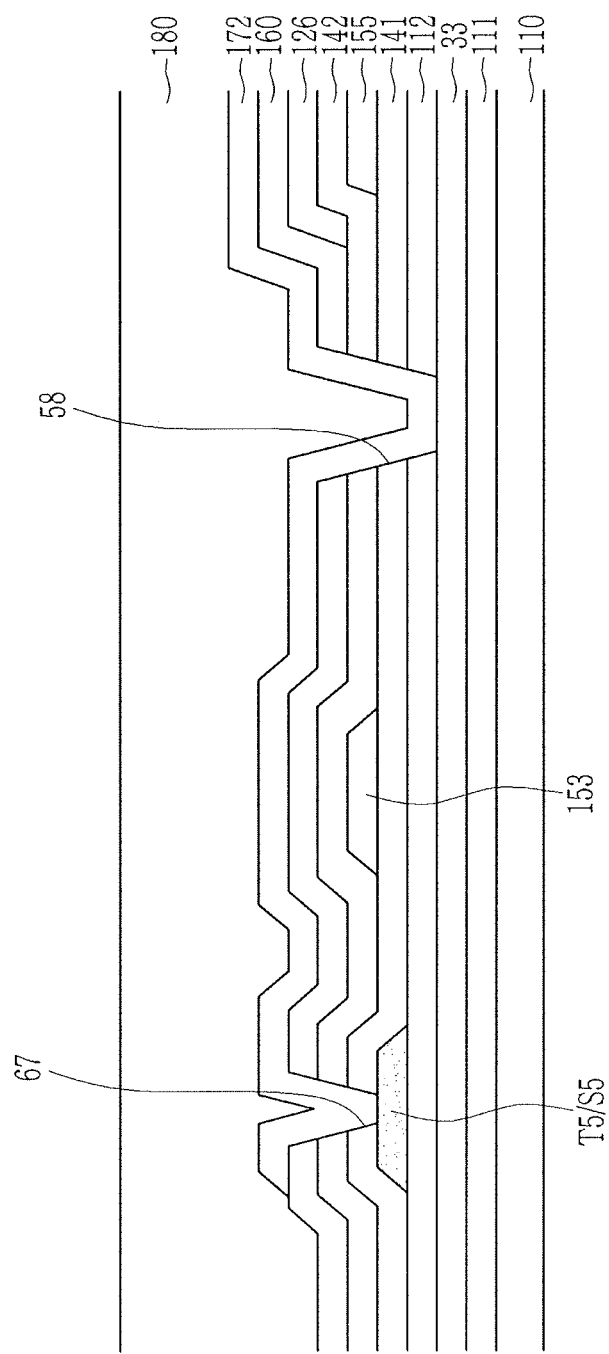
FIG. 15 illustrates a cross-sectional view of FIG. 14, taken along the line XV-XV.

The blocking layers 31 and 32 may have a structure shown in FIG. 14 and FIG. 15. FIG. 14 is a layout view of a pixel area of an OLED display according to an exemplary embodiment, and FIG. 15 is a cross-sectional view of FIG. 14, taken along the line XV-XV.

In order to clearly illustrate the blocking layers, the blocking layers 31 and 32 are illustrated with thicker lines than other portions in FIG. 14. In the exemplary embodiment FIG. 14, in addition to the blocking layers 31 and 32, a contact portion 33 is further provided. The contact portion 33 may be directly connected with a driving voltage line 172 through a contact hole 58.

That is, the blocking layers 31 and 32 of FIG. 14 are formed in a structure in which they are connected with each other, with the blocking layer 31 overlapping a third transistor T3 on a plane and the blocking layer 32 overlaps a driving transistor T1 on a plane. The blocking layer 31 and the blocking layer 32 are separated by the dotted line. The contact portion 33 is connected to the blocking layers 31 and 32, and the extends downward, e.g., along the y-direction, from the blocking layer 32 that overlaps the driving transistor T1 on a plane. The contact portion 33 is directly connected with a driving voltage line 172, as shown in FIG. 15.

Referring to FIG. 15, the contact portion 33 of the blocking layers 31 and 32 is between the substrate 110 formed of plastic or polyimide (PI) and the semiconductor layer 130, and is separated from the substrate 110 and the semiconductor layer 130 by the barrier layer 111 and the buffer layer 112. The first gate insulation layer 141 is on the semiconductor layer 130 (i.e., a first electrode S5 of a fifth transistor T5 in FIG. 15). The gate electrode 155 and the light emission control line 153 are on the first gate insulation layer 141. The second gate insulation layer 142 is on the gate electrode 155 and the light emission control line 153, while covering the same.

An expansion portion of the sustain line 126 may be on the second gate insulation layer 142, and the interlayer insulation layer 160 may be on the expansion portion of the sustain line 126. The contact hole 58 may be on the contact portion 33 and in the buffer layer 112, the first gate insulation layer 141, the second gate insulation layer 142, and the interlayer insulation layer 160.

The driving voltage line 172 may be on the interlayer insulation layer 160, and may be directly connected to the contact portion 33 through the contact hole 58 while extending through the contact hole 58. The passivation layer 180 may be on the driving voltage line 172 while covering the same, and a pixel electrode, a barrier rib, an organic emission layer, a common electrode, and an encapsulation layer may be on the passivation layer 180. The pixel electrode, the organic emission layer, and the common electrode form an organic light emitting diode (OLED).

Figure 16:
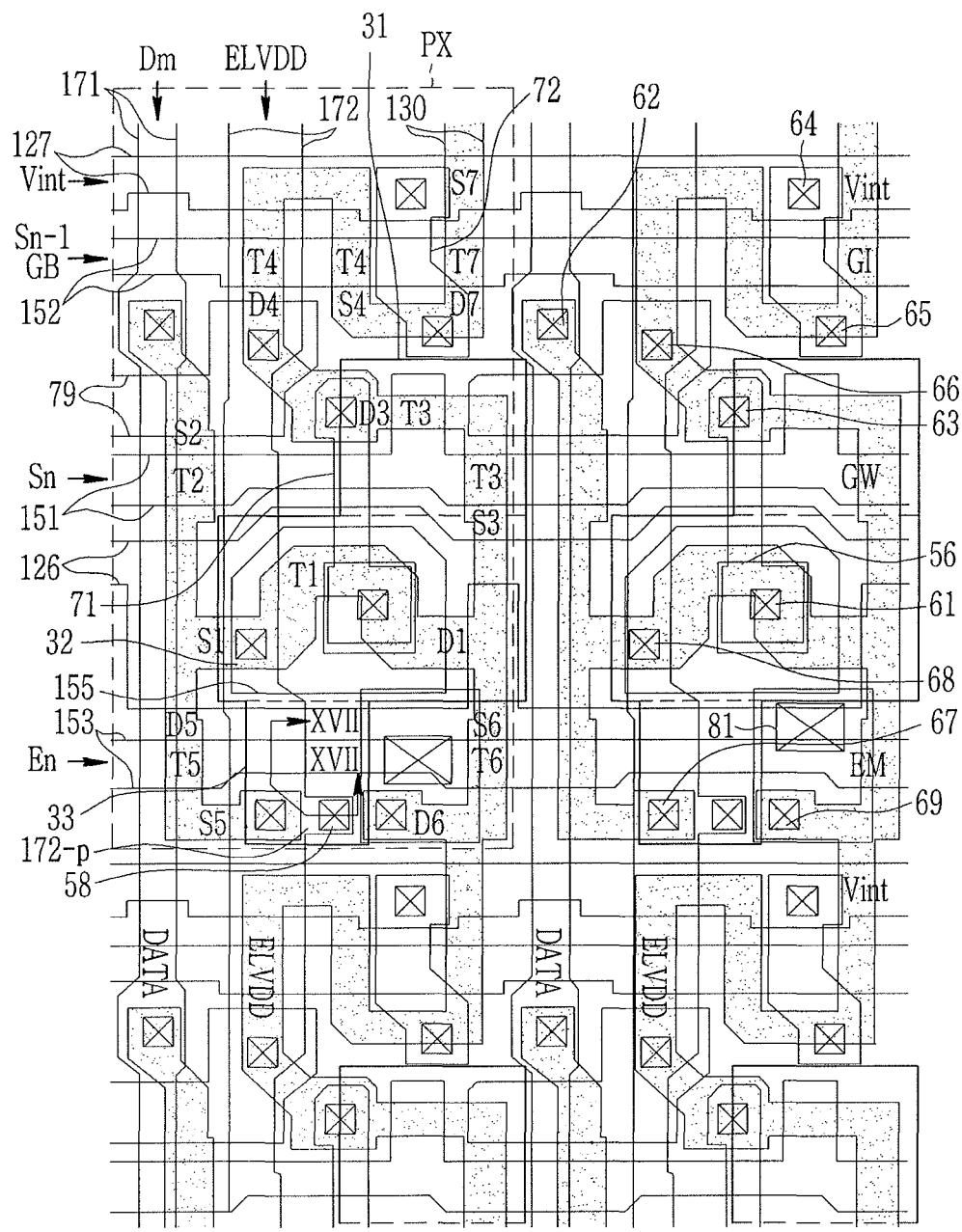
FIG. 16 illustrates a layout view of a pixel area of an OLED display according to an exemplary embodiment.
Figure 17:
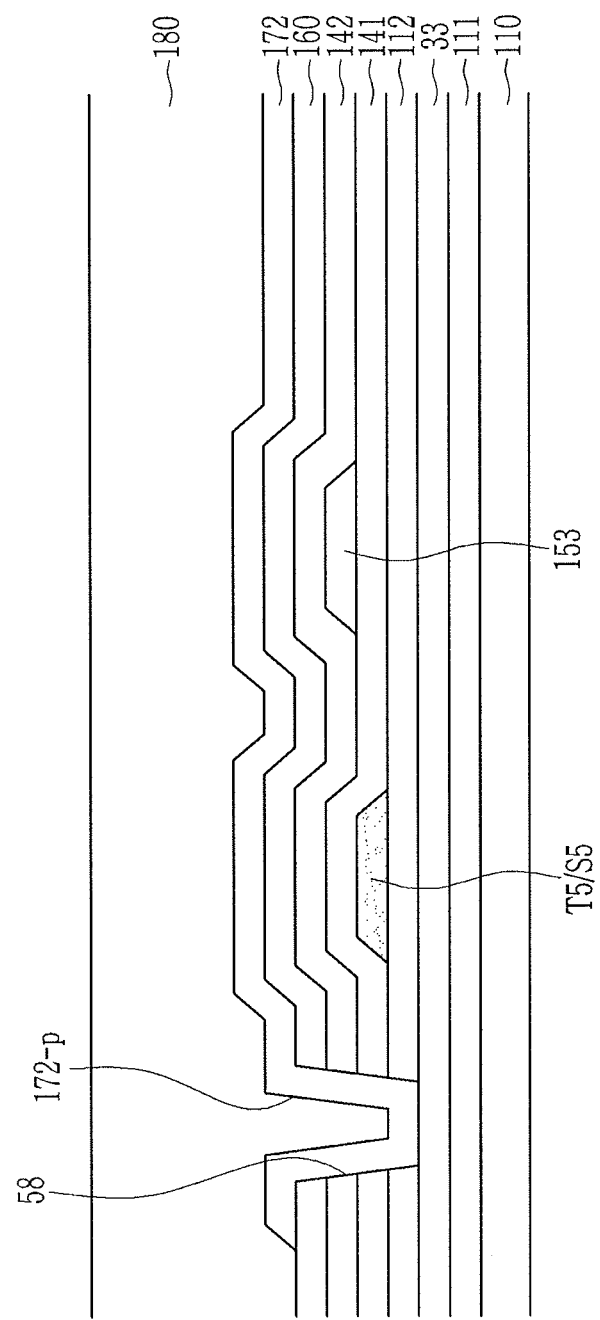
FIG. 17 illustrates a cross-sectional view of FIG. 16, taken along the line XVII-XVII.

The blocking layers 31 and 32 may have a structure shown in FIG. 16 and FIG. 17. FIG. 16 is a layout view of a pixel area of an OLED display according to an exemplary embodiment, and FIG. 17 is a cross-sectional view of FIG. 16, taken along the line XVII-XVII.

In order to clearly illustrate the blocking layers, the blocking layers 31 and 32 are illustrated with thicker lines than other portions in FIG. 16. Similar to the contact portion 33 of FIG. 14, the contact portion 33 of the exemplary embodiment of FIG. 16 is directly connected to a driving voltage line 172. However, a lower area where a connection between the contact portion 33 and the driving voltage line 172 are connected with each other is different from that of FIG. 14. In particular, the blocking layers 31 and 32 of FIG. 16 have the same structure as the structure shown in FIG. 14, while a location where the contact hole 33 connected to the driving voltage line 172 through a contact hole 58 is different from the exemplary embodiment shown in FIG. 14.

Referring to FIG. 16, the driving voltage line 172 extends in the y-direction and then the protrusion portion 172-*p* thereof protrudes to the right along the x-direction such that the contact hole 58 is below the protrusion portion 172-*p* of the driving voltage line 172. Thus, the driving voltage line 172 is connected with a contact portion 33 there below through the contact hole 58. Accordingly, the blocking layers 31 and 32 receive a driving voltage ELVDD.

A connection structure between the protrusion portion of the driving voltage line 172 and the contact portion 33 in the contact hole 58 will be described with reference to FIG. 17.

Referring to FIG. 17, the blocking layers 31 and 32, and the contact portion 33 are between the substrate 110 of plastic or polyimide (PI) and the semiconductor layer 130 along the z-direction, and are separated from the substrate 110 and the semiconductor layer 130 by the barrier layer 111 and the buffer layer 112.

The first gate insulation layer 141 is on the semiconductor layer 130 (i.e., a first electrode S5 of a fifth transistor T5 in FIG. 17). The light emission control line 153 is on the first gate insulation layer 141. The second gate insulation layer 142 is on the first gate insulation layer 141 while covering the same. Although a second gate conductor is on the second gate insulation layer 142, since the second gate conductor is not at a location cut along the line XVII-XVII of FIG. 16, the second gate conductor is not illustrated in FIG. 17. Thus, an interlayer insulation layer 160 is on the second gate insulation layer 142.

The contact hole 58 in the buffer layer 112, the first gate insulation layer 141, the second gate insulation layer 142, and the interlayer insulation layer 160 expose the contact portion 33. The protrusion portion 172-p of the driving voltage line 172 is on the interlayer insulation layer 160 and is directly connected with the contact portion 33 through the contact hole 58. The passivation layer 180 is on the driving voltage line 172 while covering the same, and a pixel electrode, a barrier rib, an organic emission layer, a common electrode, and an encapsulation layer may be on the passivation layer 180. The pixel electrode, the organic emission layer, and the common electrode form an organic light emitting diode (OLED).

Figure 18:
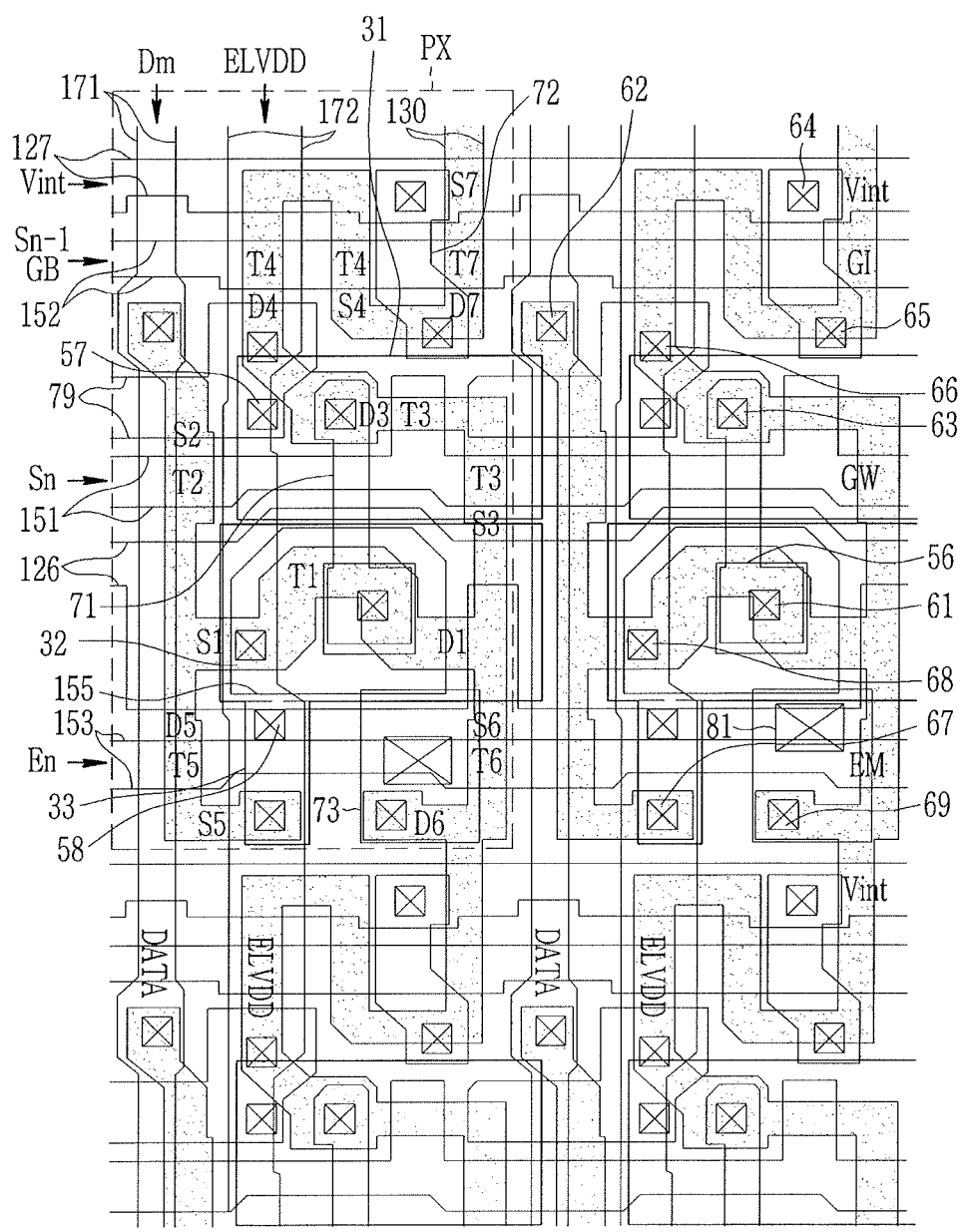
FIG. 18 and FIG. 19 illustrate layout views of a pixel area of an OLED display according to an exemplary embodiment.
Figure 19:
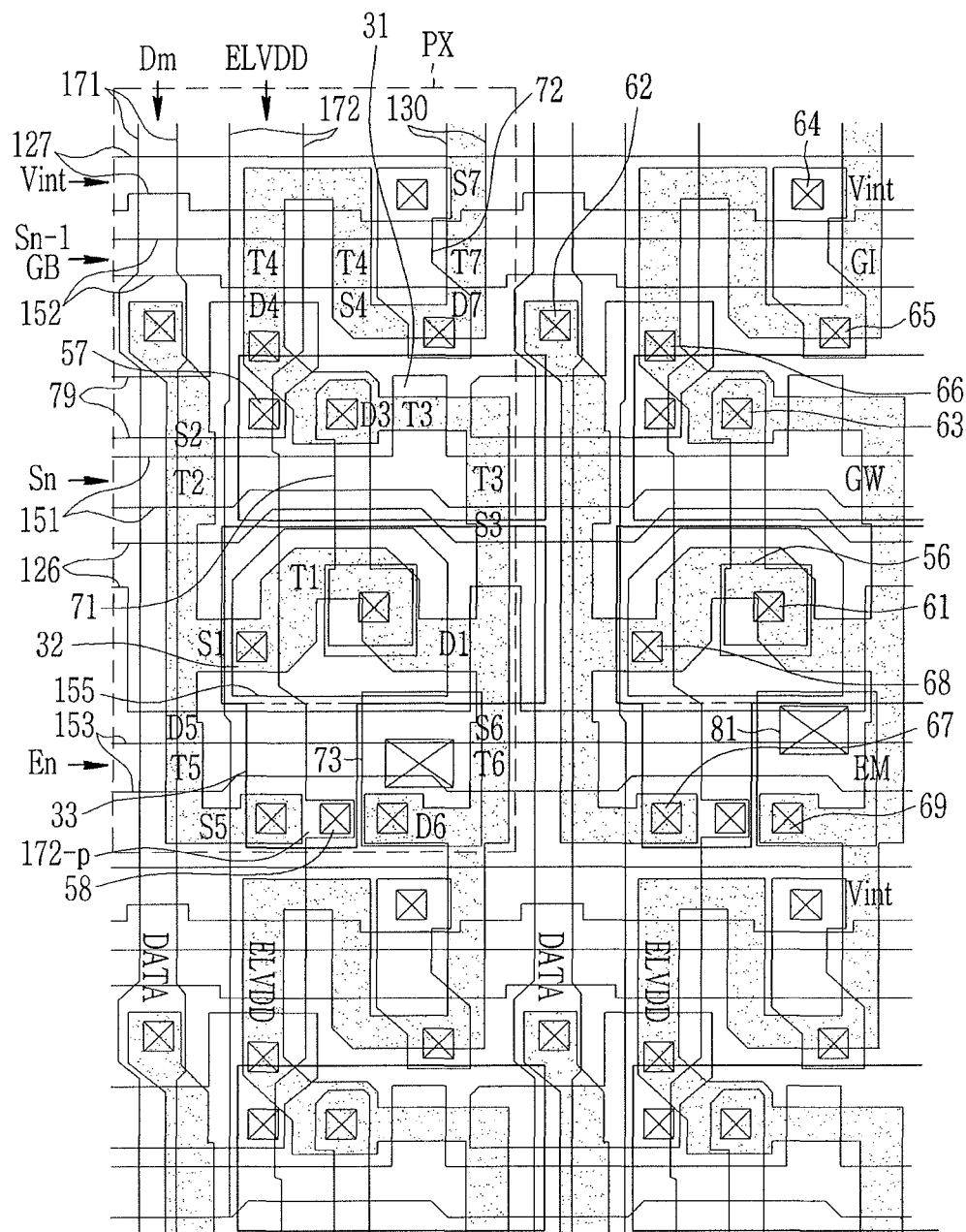

The blocking layers 31 and 32 may have a structure shown in FIG. 18 or FIG. 19. FIG. 18 and FIG. 19 are layout views of a pixel area of an OLED display according to an exemplary embodiment. Unlike as shown in FIG. 12, FIG. 14, and FIG. 16, blocking layers are separated from each other in FIG. 18 and FIG. 19.

First, a structure shown in FIG. 18 will be described. The blocking layer 31 that overlaps the third transistor T3 on a plane and the blocking layer 32 that overlaps a driving transistor T1 on a plane are separated from each other. Thus, the blocking layers 31 and 32 respectively receive a driving voltage ELVDD through different contact holes 57 and 58.

The blocking layer 31 receives the driving voltage ELVDD through the contact hole 57. More specifically, the blocking layer 31 is connected through the contact hole 57 with the parasitic capacitor control pattern 79, which is connected to the driving voltage line 172 through the contact hole 56, such that the blocking layer 31 receives the driving voltage ELVDD. Such a connection relationship is the same as that of the blocking layer 31 of FIG. 12.

In addition, the blocking layer 32 that overlaps the driving transistor T1 on a plane further includes the contact portion 33 that is directly connected with the driving voltage line 172 through the contact hole 58. Such a connection structure is the same as that of FIG. 14 and FIG. 15. That is, the contact portion 33 extends downward along the y-direction from the blocking layer 32 to overlap the contact hole 58 in the buffer layer 112, the first gate insulation layer 141, the second gate insulation layer 142, and the interlayer insulation layer 160, such that the driving voltage line 172 and the contact portion 33 are directly connected with each other.

Hereinafter, a structure shown in FIG. 19 will be described. The blocking layer 31 that overlaps the third transistor T3 on a plane and a blocking layer 32 that overlaps the driving transistor T1 on a plane are separated from each other. Thus, the blocking layers 31 and 32 receive a driving voltage ELVDD through different contact holes 57 and 58.

The blocking layer 31 receives the driving voltage ELVDD through the contact hole 57. More specifically, the blocking layer 31 is connected with the parasitic capacitor control pattern 79 through the contact hole 57. The parasitic capacitor control pattern 79 is connected with the driving voltage line 172 through the contact hole 66, such that the blocking layer 31 receives the driving voltage ELVDD. The blocking layer 31 has the same connection relationship as the blocking layer 31 of FIG. 12.

In addition, the blocking layer 32 that overlaps the driving transistor T1 further includes a contact portion 33 directly connected with the driving voltage line 172 through the contact hole 58. The blocking layer 32 has the same connection structure as shown in FIG. 16 and FIG. 17. That is, the contact portion 33 extends downward from the blocking layer 32 along the y-direction and the driving voltage 172 has a protrusion portion 172-p that extends along the x-direction to overlap the contact hole 58 that exposes the contact portion 33 through the buffer layer 112, the first gate insulation layer 141, the second gate insulation layer 142, and the interlayer insulation layer 160. Accordingly, the protrusion portion 172-p of the driving voltage line 172 and the contact portion 33 are directly connected with each other through the contact hole 58.

Figure 20:
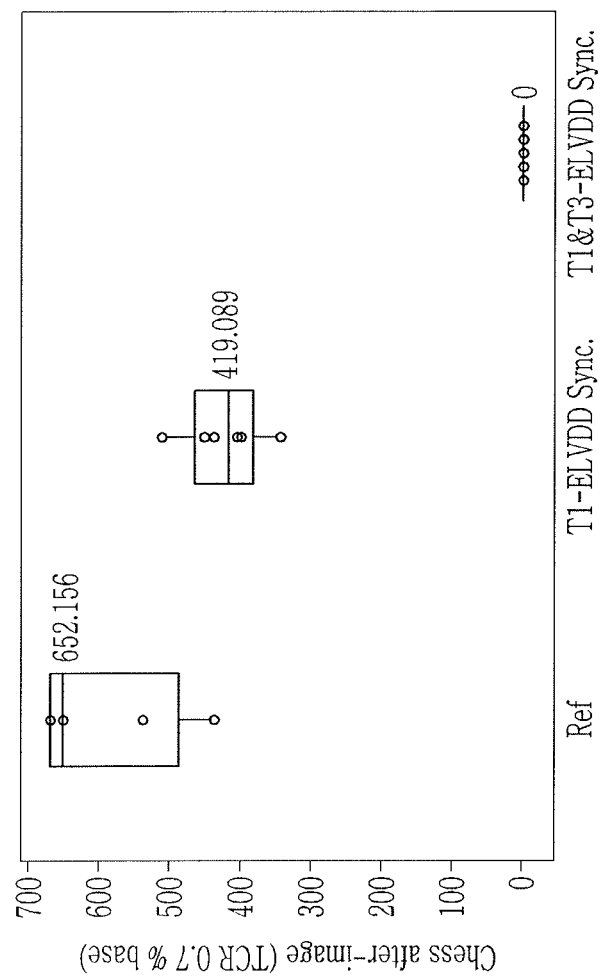
FIG. 20 and FIG. 21 illustrate graphs of after-images of an OLED display according to an exemplary embodiment.
Figure 21:
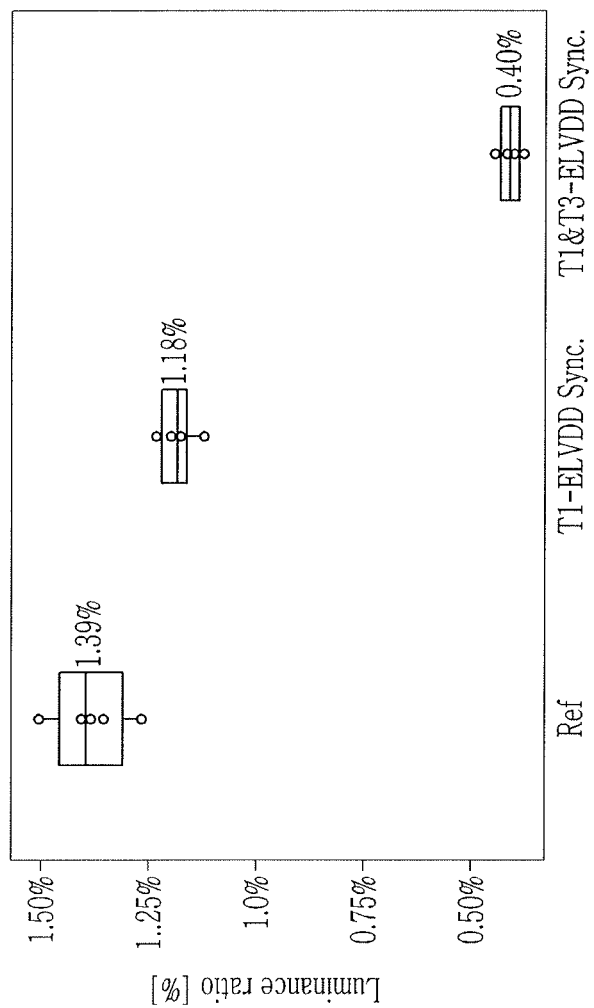

Hereinafter, a characteristic of an exemplary embodiment in which blocking layers 31 and 32 are between the substrate 110 and the semiconductor layer 130 while overlapping the third transistor T3 and the driving transistor T1, respectively, and receive the driving voltage ELVDD is described, and a characteristic of a case in which blocking layers 31 and 32 are not provided will be compared with reference to FIG. 20 and FIG. 21. FIG. 20 and FIG. 21 are graphs of after-images of an OLED display according to exemplary embodiments.

For after-image comparison, a comparative example and exemplary embodiments were examined. In FIG. 20 and FIG. 21, a comparative example, marked as Ref, used an OLED display where no blocking layer is provided; an exemplary embodiment, marked as T1-ELVDD Sync., used an OLED display in which a blocking layer overlaps only a driving transistor T1 on a plane and the blocking layer receives a driving voltage ELVD; and an exemplary embodiment, marked as T1&T3-ELVDD Sync., used an OLED display in which a blocking layer overlaps a driving transistor T1 and a third transistor T3 on a plane, and receives a driving voltage ELVDD.

In the comparative example and the exemplary embodiments, adjacent pixels are set to display black and white, and then display white and black after one frame. Such display was iteratively performed, and a degree of after-image remaining was observed.

First, the graph of FIG. 20 will be described. In FIG. 20, the Y-axis denotes a time axis based on seconds, indicating a duration during which an after-image remains with a higher contrast ratio (CR) than a reference (TCR 0.7%. Here, TCR is calculated as (B−W)/(B+W), and B denotes luminance of a black portion while W denotes luminance or a white portion). That is, an image was displayed with luminance other than desired luminance as time extends, and the duration is proportional to a duration during which a gray color is viewed when a black color and a white color are displayed.

In FIG. 20, a gray color was viewed for about 652 seconds in the Ref comparative example, about 419 seconds in the T1-ELVDD Sync. exemplary embodiment, and 0 seconds in the T1&T3-ELVDD Sync. exemplary embodiment. This indicates a very good display characteristic.

Next, the graph of FIG. 21 will be described. In FIG. 21, the Y-axis denotes a percentage value (%) of a luminance difference, and a difference between desired luminance and displayed luminance was shown by "%". As the value of "%" is increased, a different color is displayed, and accordingly an after-image can be easily viewed.

In FIG. 21, a luminance difference was about 1.39% in the Ref comparative example, about 1.18% in the T1-ELVDD Sync. exemplary embodiment, and about 0.40% in the T1&T3-ELVDD Sync. exemplary embodiment. Since the 0.40% luminance represents almost no difference, this indicates a very good display characteristic.

Referring to FIG. 20 and FIG. 21, an after-image occurs when no blocking layer is provided, and particularly, when black and white are alternately displayed and thus a check pattern is displayed, a gray after-image is viewed. In addition, even when the blocking layer overlaps only the driving transistor T1 on a plane, such a problem is ameliorated, but an after-image can still be observed. Therefore, the exemplary embodiment in which the blocking layer covers only the driving transistor T1 may be used in a product or may not be used in a product depending on required specifications. However, these issues are reduced or prevented when the blocking layer overlaps the driving transistor T1 and the third transistor T3 on a plane.

Referring to FIG. 20 and FIG. 21, a blocking layer that overlaps only the third transistor T3 may provide better display characteristics than a blocking layer that overlaps the driving transistor T1 on a plane. This is because that the effect can be amplified by more than several times when a blocking layer overlaps the third transistor T3. Thus, in FIG. 1, the blocking layer 31 that overlaps the third transistor T3 on a plane is described first, and then exemplary embodiments in which blocking layers overlap a driving transistor T1 and a third transistor T3 are described from FIG. 11.

Alternatively, various transistors and blocking layers may overlap on a plane, and may be connected with various signal lines and a portion in a pixel PX. However, when blocking layers that overlap all the transistors on a plane are formed, a signal applied to each pixel PX may be delayed due to parasitic capacitance that is added due to the blocking layer. Therefore, some transistors in the pixel PX may not overlap at least the blocking layer. This can be implemented in various exemplary embodiments, some of which are described below.

Hereinabove, an exemplary embodiment having a circuit diagram that is the same as the circuit diagram shown in FIG. 11, i.e., a structure in which the blocking layer 31 overlaps the third transistor T3 on a plane and the blocking layer 32 overlaps the driving transistor T1 on a plane, and the blocking layers 31 and 32 receive the driving voltage ELVDD, has been described. Hereinafter, a structure in which a blocking layer overlaps the fourth transistor T4 as well as the third transistor T3 will be described.

Figure 22:
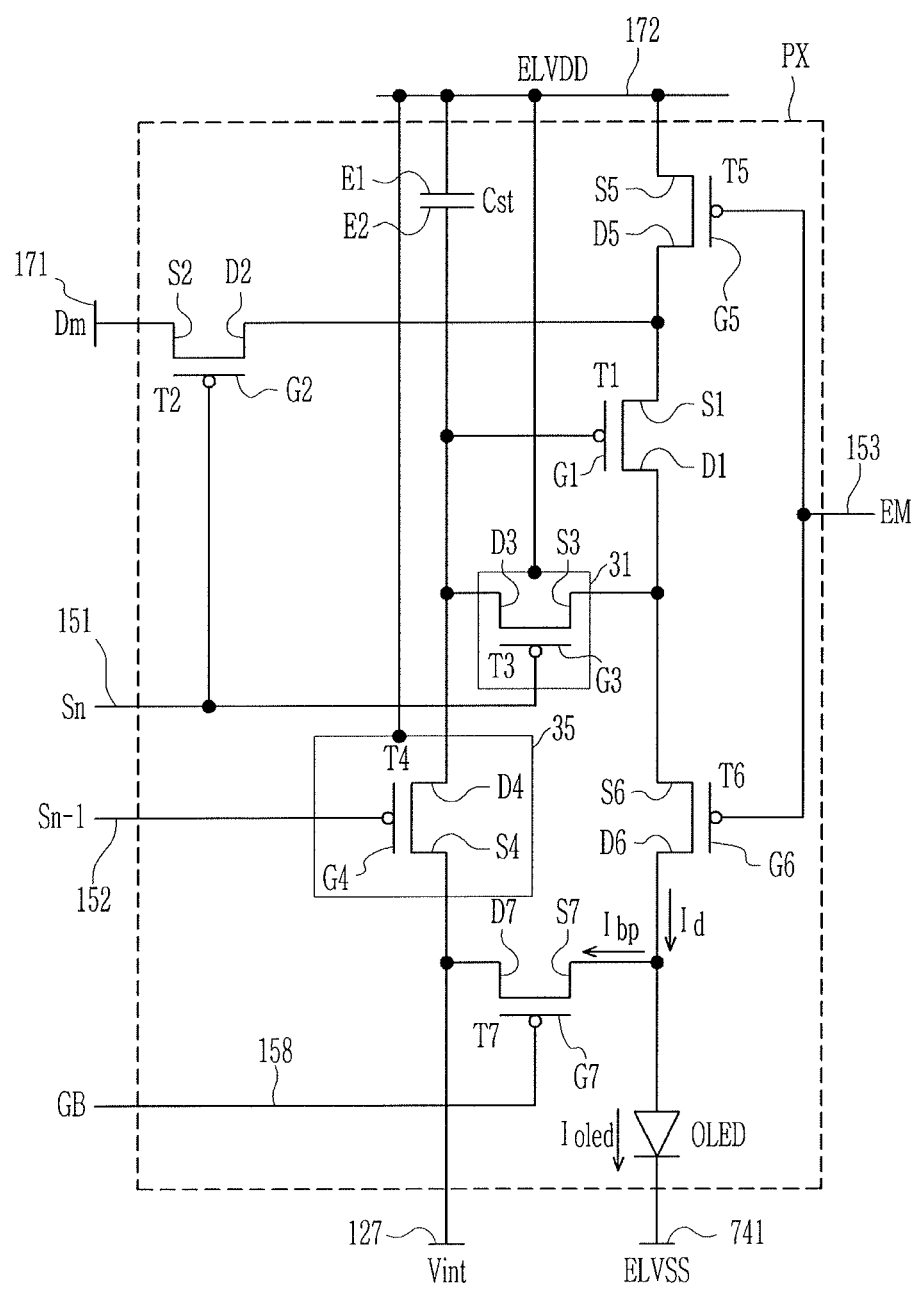
FIG. 22 illustrates an equivalent circuit diagram of a pixel of an OLED display according to an exemplary embodiment.

FIG. 22 is an equivalent circuit diagram of a pixel of an OLED display according to an exemplary embodiment. The OLED display of FIG. 22 is almost the same as the OLED display of FIG. 1 or FIG. 11, and thus only a difference will be described. In addition to FIG. 1, in FIG. 22, a blocking layer 35 overlaps the driving transistor T4 on a plane, and receives a driving voltage ELVDD. That is, in the OLED display of the exemplary embodiment of FIG. 22, two blocking layers 31 and 35 are formed, and one of the two blocking layers 31 and 35 overlaps a third transistor T3 on a plane and the other overlaps the fourth transistor T4 on a plane. The two blocking layers 31 and 35 both receive a driving voltage ELVDD through a contact hole that is formed in the corresponding pixel PX or an adjacent pixel.

The two blocking layers 31 and 35 may have a structure in which they are connected with each other or may be separately disposed and may receive the driving voltage through different contact holes. Depending on exemplary embodiments, the two blocking layers 31 and 35 may receive different voltages. One or more of the same or different the driving voltage ELVDD, the initialization voltage Vint, the common voltage ELVSS, a scan signal Sn, the previous scan signal Sn−1, the data voltage Dm, and the light emission control signal EM may be applied to the two blocking layers 31 and 35. The two blocking layers 31 and 35 may be connected with one terminal of each of a plurality of transistors T1 to T7 or one terminal of an organic light emitting diode.

Figure 23:
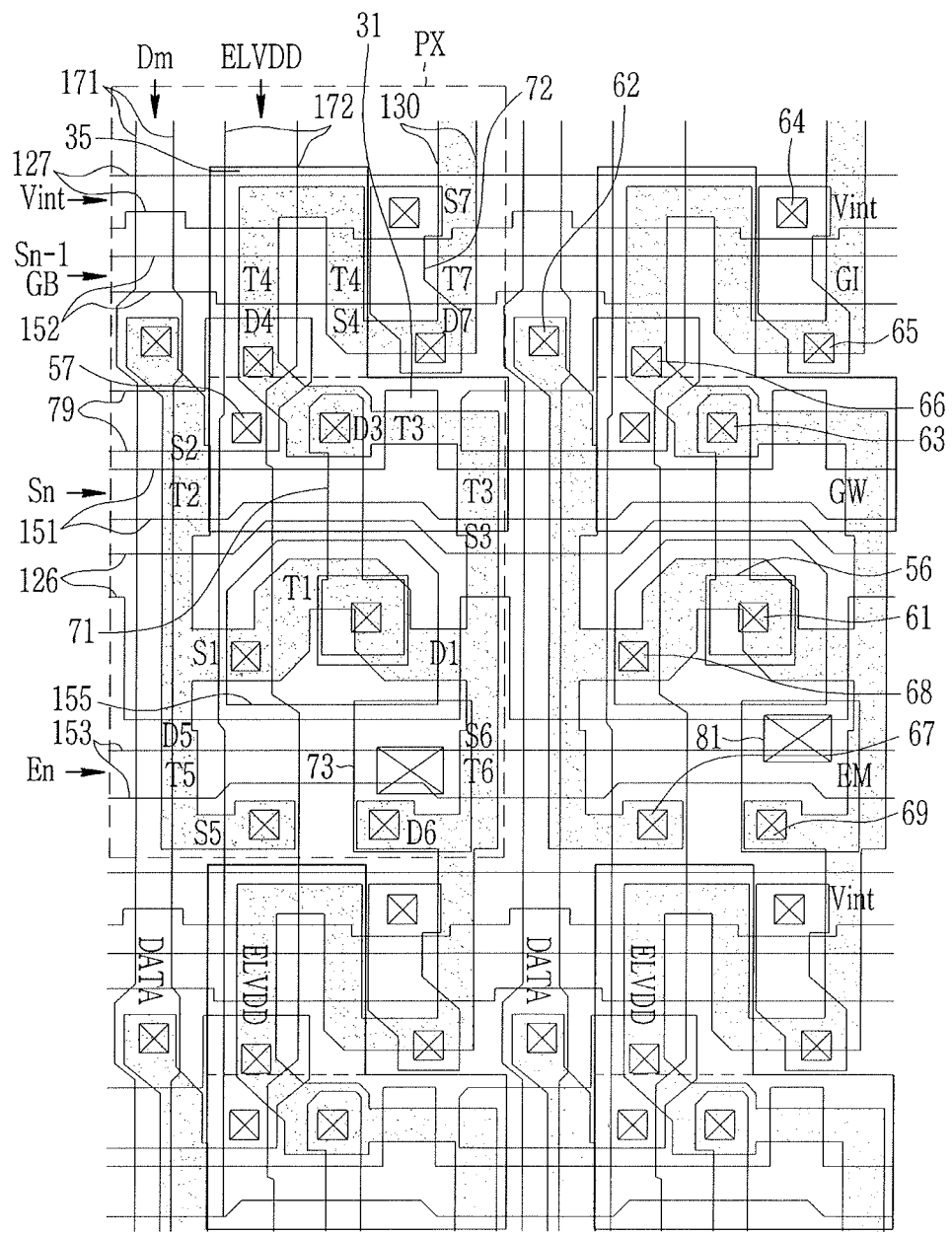
FIG. 23 and FIG. 24 illustrate layout views of a pixel area of an OLED display according to an exemplary embodiment.
Figure 24:
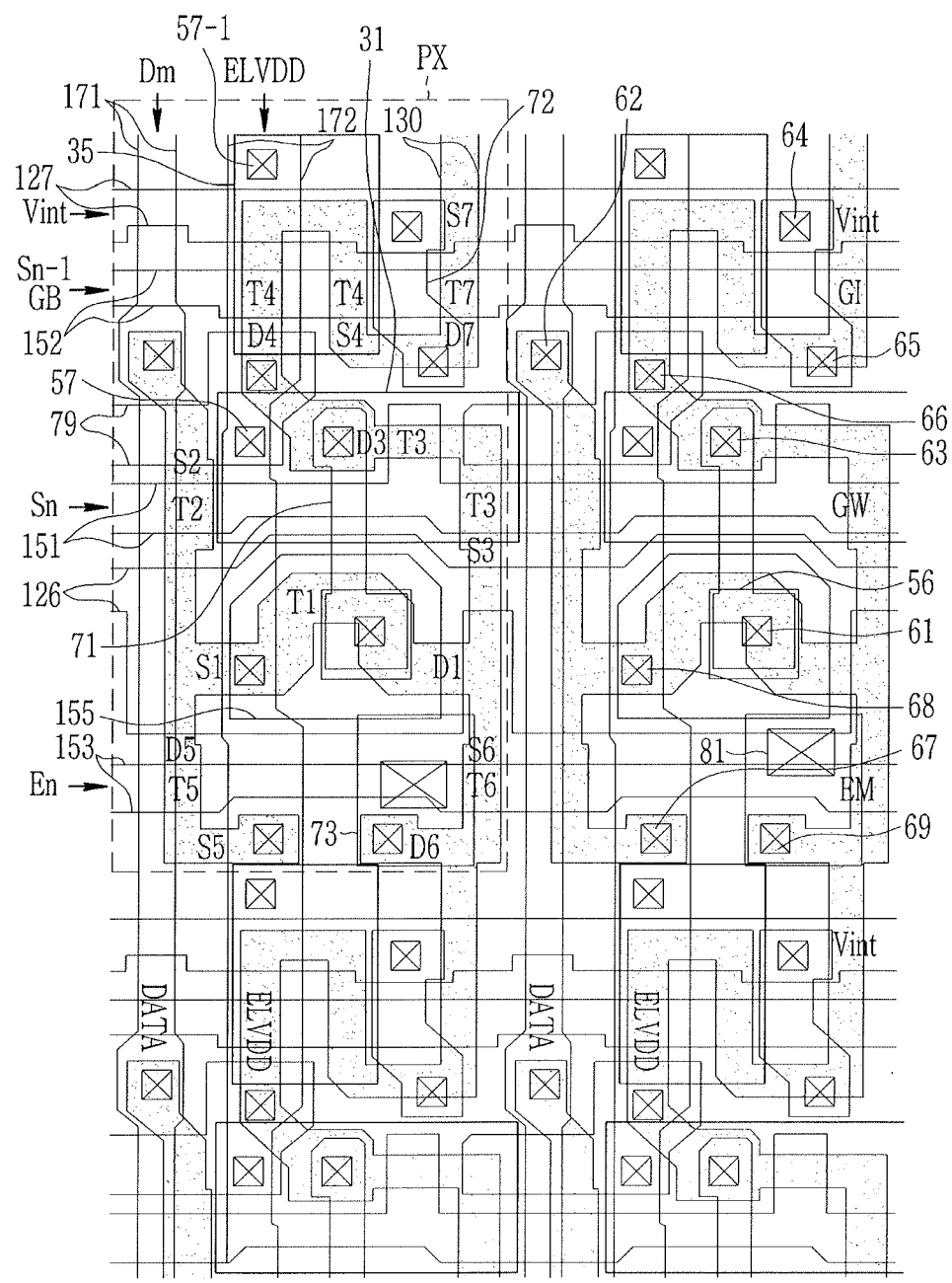

Such a structure of the blocking layers 31 and 35 will now be described. The blocking layers 31 and 35 may have a structure of FIG. 23 and FIG. 24. FIG. 23 and FIG. 24 are layout views of a pixel area of an OLED display according to an exemplary embodiment.

First, a structure shown in FIG. 23 will be described. In order to clearly illustrate the blocking layers, the blocking layers 31 and 35 are illustrated with thicker lines than other portions in FIG. 23.

In FIG. 23, the blocking layers 31 and 35 are connected with each other, and receive a driving voltage ELVDD through a contact hole 57. The blocking layer 31 overlaps the third transistor T3 on a plane and the blocking layer 35 overlaps the driving transistor T4 on a plane. In FIG. 23, the blocking layer 31 and the blocking layer 35 are separated by a dotted line, but locations thereof can be changed depending on structures. The connection structure of the blocking layers 31 and 35 through the contact hole 57 is the same as that of FIG. 4 or FIG. 6, and therefore no further detailed drawing is provided.

In particular, the blocking layer 31 is connected with a parasitic capacitor control pattern 79 through the contact hole 57 that is in the blocking layer 31. The parasitic capacitor control pattern 79 is connected with the driving voltage line 172 through the contact hole 66. Thus, the blocking layer 31 receives the driving voltage ELVDD. The blocking layer 35 that overlaps the driving transistor T4 on a plane is formed in one structure with the blocking layer 31 such that the blocking layer 35 also receives the driving voltage ELVDD. The blocking layers 31 and 35 are between the substrate 110 along the z-direction, and are separated from the substrate 110 and the semiconductor layer 130 by the barrier layer 111 and the buffer layer 112

A degree of overlap between the blocking layers 31 and 35 and the transistors T3 and T4, respectively, may be changed depending on exemplary embodiments, e.g., may overlap channel regions of the transistors T3 and T4, resptively. Depending on exemplary embodiments, the blocking layers 31 and 35 may overlap at least a part of a first region or a second region of the transistors T3 and T4, respectively.

Unlike the blocking layers 31 and 35 of FIG. 23, blocking layers 31 and 35 of FIG. 24 are separated from each other, and respectively receive a driving voltage ELVDD through different contact holes 57 and 57-1. Since it is the same as the exemplary embodiment shown in FIG. 23 in which the blocking layer 31 that overlaps the third transistor T3 receives the driving voltage ELVDD through the contact hole 57, no further description will be provided.

In a structure in which the blocking layer 35 that overlaps the fourth transistor T4 on a plane receives the driving voltage ELVDD through the contact hole 57-1, the driving voltage 172 and the blocking layer 35 are directly connected through the contact hole 57-1 as in the structure of the exemplary embodiment of FIG. 14.

That is, the blocking layer 35 in FIG. 24 overlaps the fourth transistor T4 on a plane, and, along the z-direction, is between the substrate 110 and the semiconductor layer 130, and separated from the substrate 110 and the semiconductor layer 130 by the barrier layer 111 and the buffer layer 112. The first gate insulation layer 141 is on the semiconductor layer 130. The first gate conductor is on the first gate insulation layer 141, and the second gate insulation layer 142 is on the first gate conductor, while covering the same. The second gate conductor is on the second gate insulation layer 142, and an interlayer insulation layer 160 is on the second gate conductor.

The contact hole 57-1 exposes the blocking layer 35 through the buffer layer 112, the first gate insulation layer 141, the second gate insulation layer 142, and the interlayer insulation layer 160. The driving voltage line 172 is on the interlayer insulation layer 160, and is directly connected with the blocking layer 35 through the contact hole 57-1 by extending into the contact hole 57-1.

The passivation layer 180 is on the driving voltage line 172 while covering the same, and a pixel electrode, a barrier rib, an organic emission layer, a common electrode, and an encapsulation layer may be on the passivation layer 180. The pixel electrode, the organic emission layer, and the common electrode form an organic light emitting diode (OLED).

Hereinabove, the exemplary embodiment having a circuit diagram such as the circuit diagram shown in FIG. 22, i.e., the blocking layers 31 and 35 overlap the third transistor T3 and the fourth transistor T4 on a plane and receive the driving voltage ELVDD, has been described. Hereinafter, a structure in which a blocking layer overlaps a driving transistor T1 and a second transistor T2, together with the third transistor T3, will be described.

Figure 25:
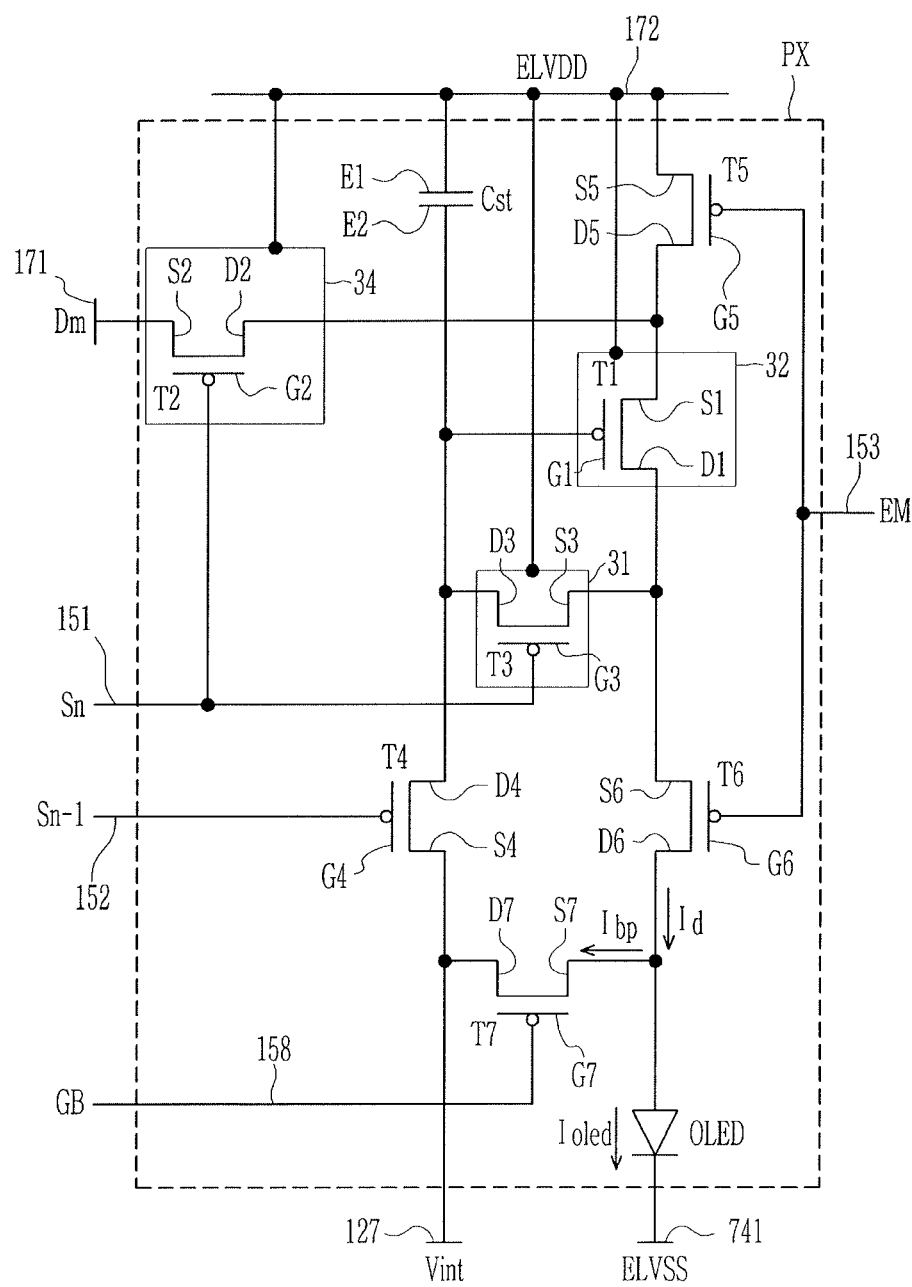
FIG. 25 illustrates an equivalent circuit diagram of a pixel of an OLED display according to an exemplary embodiment.

FIG. 25 is an equivalent circuit diagram of a pixel of an OLED display according to an exemplary embodiment. FIG. 25 is almost the same as FIG. 11, and only a difference will be described. In addition to the structure shown in FIG. 11, the exemplary embodiment of FIG. 25 includes a blocking layer 34 that overlaps a second transistor T2 along the z-direction and receives a driving voltage ELVDD in FIG. 25. That is, in the OLED display according to the exemplary embodiment of FIG. 25, three blocking layers 31, 32, and 34 are provided, i.e., one that overlaps the third transistor T3, another that overlaps the driving transistor T1, and yet another that overlaps the second transistor T2. The three blocking layers 31, 32, and 34 receive a driving voltage ELVDD through a contact hole that is formed in the corresponding pixel PX or an adjacent pixel.

The three blocking layers 31, 32, and 34 may be formed in a structure in which are connected with each other or may be separated from each other and receive the driving voltage ELVDD through different contact holes. Depending on exemplary embodiments, the three blocking layers 31, 32, and 34 may receive different voltages. In particular, one of the same or different ones of the driving voltage ELVDD, the initialization voltage Vint, the common voltage ELVSS, the scan signal Sn, the previous scan signal Sn−1, the data voltage Dm, and the light emission control signal EM may be applied to the three blocking layers 31, 32, and 34. The three blocking layers 31, 32, and 34 may be connected with one terminal of each of a plurality of transistors T1 to T7 or one terminal of an organic light emitting diode.

Figure 26:
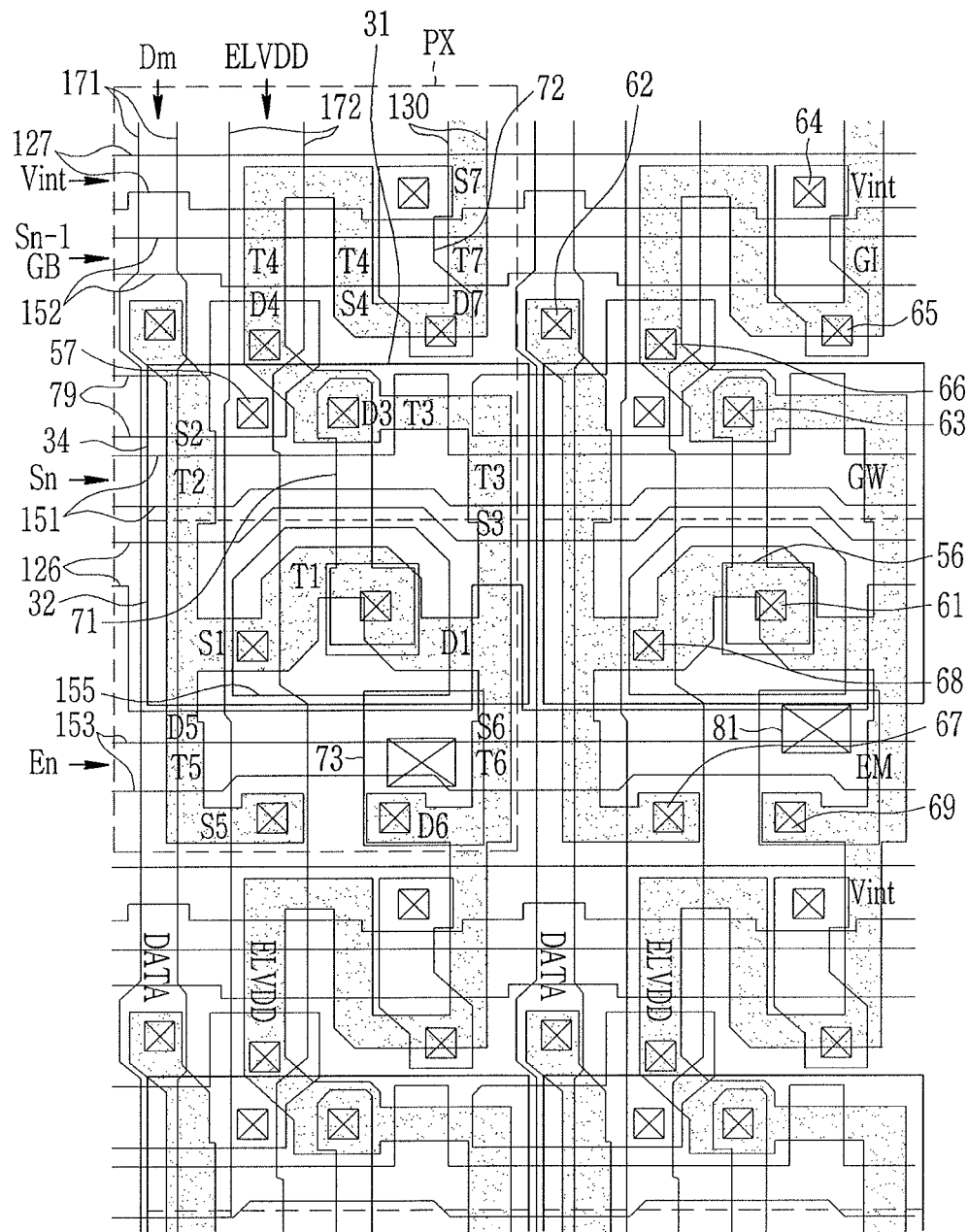
FIG. 26 to FIG. 28 illustrate layout views of a pixel area of an OLED display according to an exemplary embodiment.
Figure 27:
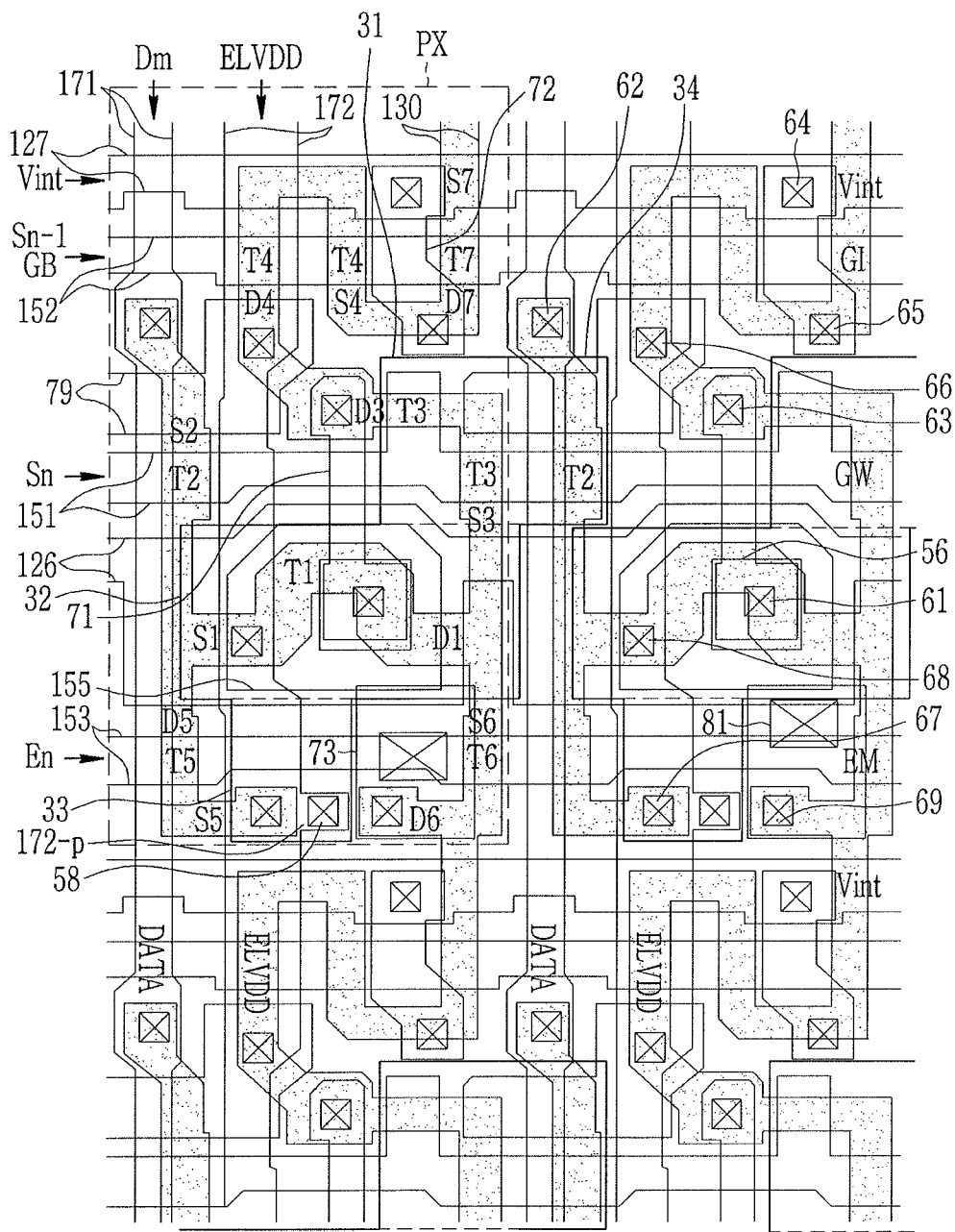
Figure 28:
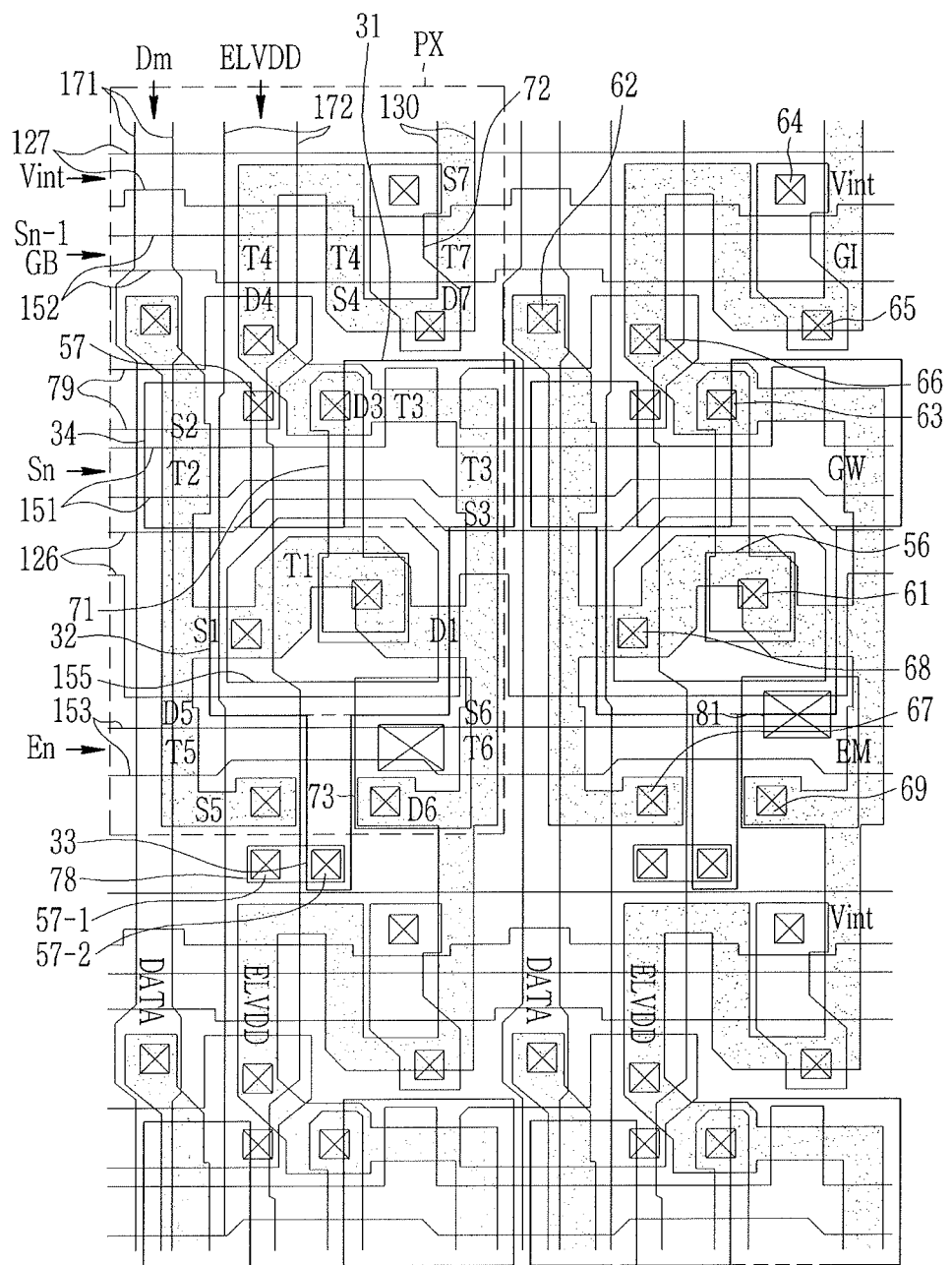

A structure having the blocking layers 31, 32, and 34 will now be described. The blocking layers 31, 32, and 34 may have a structure as shown in FIG. 26 to FIG. 28. FIG. 26 to FIG. 28 are layout views of a pixel area of an OLED display according to an exemplary embodiment.

First, a structure shown in FIG. 26 will be described. In order to clearly illustrate the blocking layers, the blocking layers 31, 32 and 34 are illustrated with thicker lines than other portions in FIG. 26.

In FIG. 26, the blocking layers 31, 32, and 34 are formed in a structure in which they are connected with each other, and receive a driving voltage ELVDD through a contact hole 57. The blocking layer 31 overlaps a third transistor T3 on a plane, the blocking layer 32 overlaps a driving transistor T1 on a plane, and the blocking layer 34 overlaps a second transistor T2 on a plane. In FIG. 26, the blocking layers 31 and 34 and the blocking layer 34 are separated by dotted lines. A connection structure of the blocking layers 31, 32, and 34 through the contact hole 57 is the same as that of FIG. 4 or FIG. 6, and therefore no further illustration is provided.

In particular, the blocking layers 31 and 34 are connected with a parasitic capacitor control pattern 79 through the contact hole 57 between the blocking layer 31 and the blocking layer 34, and the parasitic capacitor control pattern 79 is connected with a driving voltage line 172 through a contact hole 66 and thus the blocking layers 31 and 34 receive a driving voltage ELVDD. The blocking layer 32 that overlaps the driving transistor T1 on a plane is formed in one structure with the blocking layers 31 and 34. Thus the blocking layer 32 also receives the driving voltage ELVDD. Along the z-direction, the blocking layers 31, 32, and 34 are between the substrate 110 and the semiconductor layer 130, and are separated from the substrate 110 and the semiconductor layer 130 by the barrier layer 111 and the buffer layer 112.

A degree of overlap of the blocking layers 31, 32, and 34 with the transistors T3, T1, and T2, respectively, may be changed depending on exemplary embodiments, and the blocking layers 31, 32, and 34 may overlap channel regions of the transistors T3, T1, and T2 on a plane. Depending on exemplary embodiments, the blocking layers 31, 32, and 34 may overlap at least a part of first regions or second regions of the transistors T3, T1, and T2, respectively.

Structures in FIG. 27 and FIG. 28 are different from the structure shown in FIG. 26 in that the blocking layers 31, 32, and 34 further include the contact portion 33. the contact hole 58 is formed on the contact portion 33, and thus the contact portion 33 is connected with a driving voltage line 172 through the contact hole 58. In the exemplary embodiment of FIG. 27, the contact portion 33 is directly connected with the driving voltage line 172. In the exemplary embodiment of FIG. 28, the contact portion 33 is connected with the driving voltage line 172 through the connection member 78.

First, the structure shown in FIG. 27 will be described. In the exemplary embodiment of FIG. 27, unlike the exemplary embodiment of FIG. 26, only the blocking layers 31 and 32 are in the corresponding PX, while the blocking layer 34 overlaps a second transistor T2 in an adjacent pixel PX by extending to the adjacent pixel PX from the blocking layer 31 along the x-direction.

In addition, unlike the exemplary embodiment of FIG. 26, in the exemplary embodiment of FIG. 27, the contact portion 33 is further connected to the blocking layers 31, 32, and 34. The contact portion 33 extends downward along the y-direction from the blocking layer 32 that overlaps the driving transistor T1 on a plane. The contact portion 33 is directly connected with the driving voltage line 172. A connection structure between the contact portion 33 and the driving voltage line 172 is the same as the structure shown in FIG. 16 and FIG. 17, and thus no further illustration is provided.

Referring to FIG. 27, the driving voltage line 172 includes the protrusion portion 172-p that protrudes along the x-direction to overlap the contact hole 58 that exposes the contact portion 33 to contact the contact portion 33 through the contact hole 58. Accordingly, the blocking layers 31, 32, and 34 receive the driving voltage ELVDD.

A connection structure between the protrusion portion of the driving voltage line 172 and the contact portion 33 in the contact hole 58 will now be described. Along the z-direction, the blocking layers 31, 32, and 34, and the contact portion 33 are between the substrate 110 and the semiconductor layer 130, and are separated from the substrate 110 and the semiconductor layer 130 by the barrier layer 111 and the buffer layer 112. The first gate insulation layer 141 is on the semiconductor layer 130. The first gate conductor is on the first gate insulation layer 141, and the second gate insulation layer 142 is on the first gate conductor while covering the same. The second gate conductor is on the second gate insulation layer 142, and an interlayer insulation layer 160 is on the second gate conductor. The contact hole 58 exposes the contact portion 33 through the buffer layer 112, the first gate insulation layer 141, the second gate insulation layer 142, and the interlayer insulation layer 160.

The protrusion portion 172-p of the driving voltage line 172 is on the interlayer insulation layer 160 and is directly connected with the contact portion 33 through the contact hole 58. The passivation layer 180 is on the driving voltage line 172 while covering the same, and a pixel electrode, a barrier rib, an organic emission layer, a common electrode, and an encapsulation layer may be disposed on the passivation layer 180. The pixel electrode, the organic emission layer, and the common electrode form an organic light emitting diode (OLED).

Hereinafter, the structure shown in FIG. 28 will be described. Unlike in the structure shown in FIG. 27, in the structure shown in FIG. 28, the blocking layer 31 that overlaps the third transistor T3 and the blocking layer 34 that overlaps a second transistor T2 are separated from each other 34, and are connected by the blocking layer 32 that overlaps a driving transistor T1. In addition, the blocking layer 34 that overlaps the second transistor T2 is in the same pixel PX with other blocking layers 31 and 32.

Further, unlike in the exemplary embodiment of FIG. 27, in the exemplary embodiment of FIG. 28, the contact portion 33 is connected with the driving voltage line 172 through the connection member 78. As described, the structure in which the contact portion 33 is connected with the driving voltage line 172 through the connection member 78 is similar to the structure shown in FIG. 9, and no further cross-sectional view will be provided.

In the exemplary embodiment of FIG. 28, the blocking layers 31, 32, and 34 use the contact hole 33 to connect with the driving voltage line 172. The contact hole 57-1 that exposes one end of the connection member 78 is provided below the driving voltage line 172 such that the connection member 78 and the driving voltage line 172 are connected with each other. The other end of the connection member 78 is connected with the contact portion 33 through the contact hole 57-2. Thus, the blocking layers 31, 32, and 34 receive a driving voltage ELVDD. The connection member 78 may be provided as a first gate conductor or a second gate conductor. When the connection member 78 is provided as the first gate conductor, the contact hole 57-1 is formed in the second gate insulation layer 142 and the interlayer insulation layer 160, and the contact hole 57-2 is formed in a first gate insulation layer 141 and a buffer layer 112. When the connection member 78 is provided as the second gate conductor, the contact hole 57-1 is in the interlayer insulation layer 160, and the contact hole 57-2 is in the second gate insulation layer 142, the first gate insulation layer 141, and the buffer layer 112.

Hereinabove, the exemplary embodiment having a circuit diagram that is the same as that of FIG. 25, i.e., a structure in which the blocking layer 31 overlaps the third transistor T3, the blocking layer 32 overlaps the driving transistor T1, and the blocking layer 34 overlaps the second transistor T2, and they receive the driving voltage ELVDD, has been described. Hereinafter, a structure in which a blocking layer overlaps the driving transistor T1, the second transistor T2, and the fourth transistor T4, together with the third transistor T3, will be described.

Figure 29:
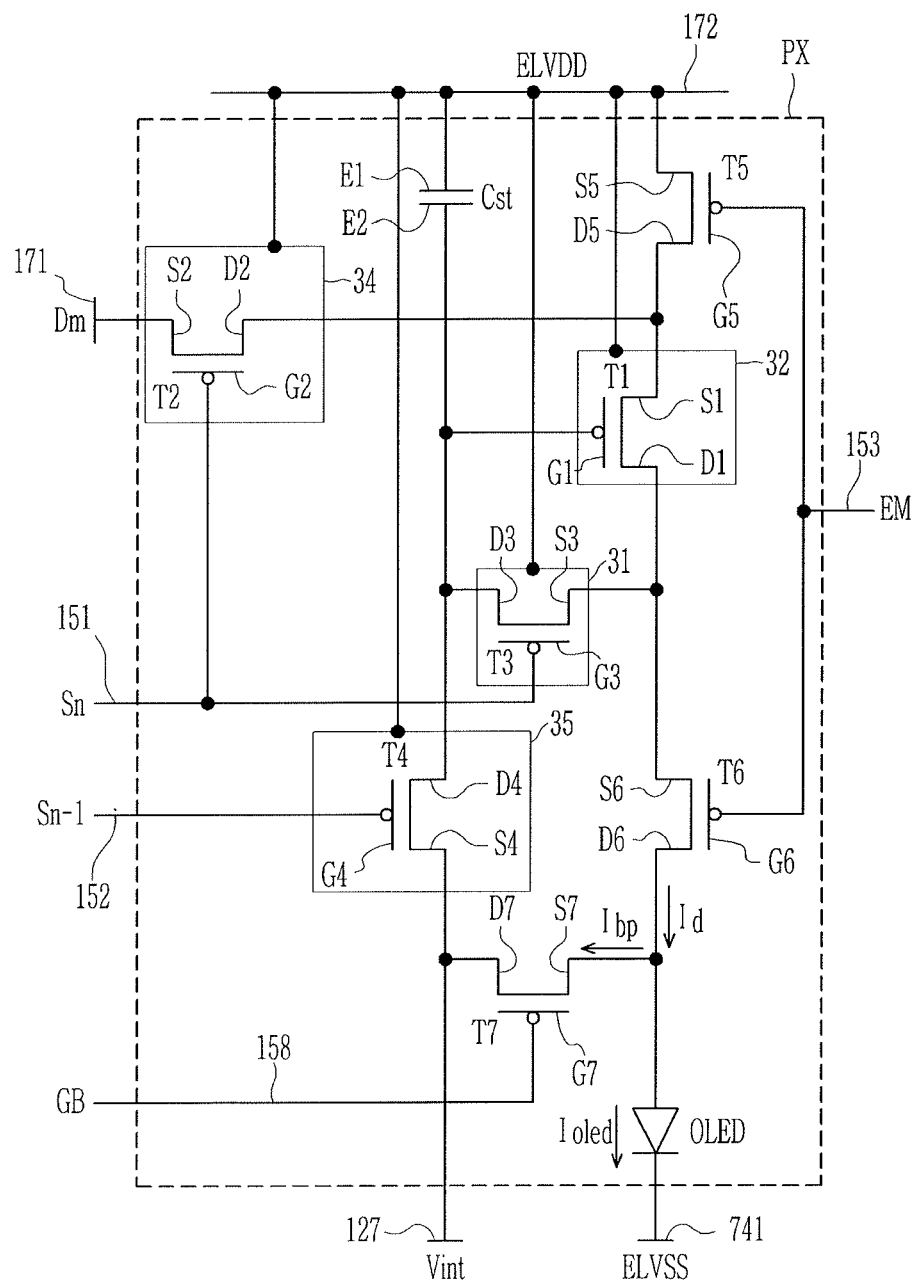
FIG. 29 illustrates an equivalent circuit diagram of a pixel of an OLED display according to an exemplary embodiment.

FIG. 29 is an equivalent circuit diagram of a pixel of an OLED display according to an exemplary embodiment. The exemplary embodiment of FIG. 29 is almost the same as that of FIG. 25, and therefore only a difference will be described. In FIG. 29, in addition to the exemplary embodiment shown in FIG. 25, a blocking layer 35 overlaps a fourth transistor T4 on a plane and receives a driving voltage ELVDD. That is, in the OLED display according to the exemplary embodiment of FIG. 29, four blocking layers 31, 32, 34, and 35 are provided. In particular, one of the four transistors 31, 32, 34, and 35 overlaps a third transistor T3, another overlaps a driving transistor T1, another overlaps a second transistor T2, and the other overlaps the fourth transistor T4. The four blocking layers 31, 32, 34, and 35 all receive a driving voltage ELVDD through a contact hole in the corresponding pixel PX or in an adjacent pixel.

The four blocking layers 31, 32, 34, and 35 may be connected with each other, or may be separated from each other and thus may receive the driving voltage ELVDD through different contact holes. Depending on exemplary embodiments, the four blocking layers may receive different voltages. In particular, one of the same or different ones of the driving voltage ELVDD, the initialization voltage Vint, the common voltage ELVSS, the scan signal Sn, the previous scan signal Sn−1, the data voltage Dm, and the light emission control signal EM may be applied to the four blocking layers 31, 32, 34, and 35. The four blocking layers 31, 32, 34, and 35 may be connected with one terminal of each of a plurality of transistors T1 to T7 or one terminal of an organic light emitting diode.

Figure 30:
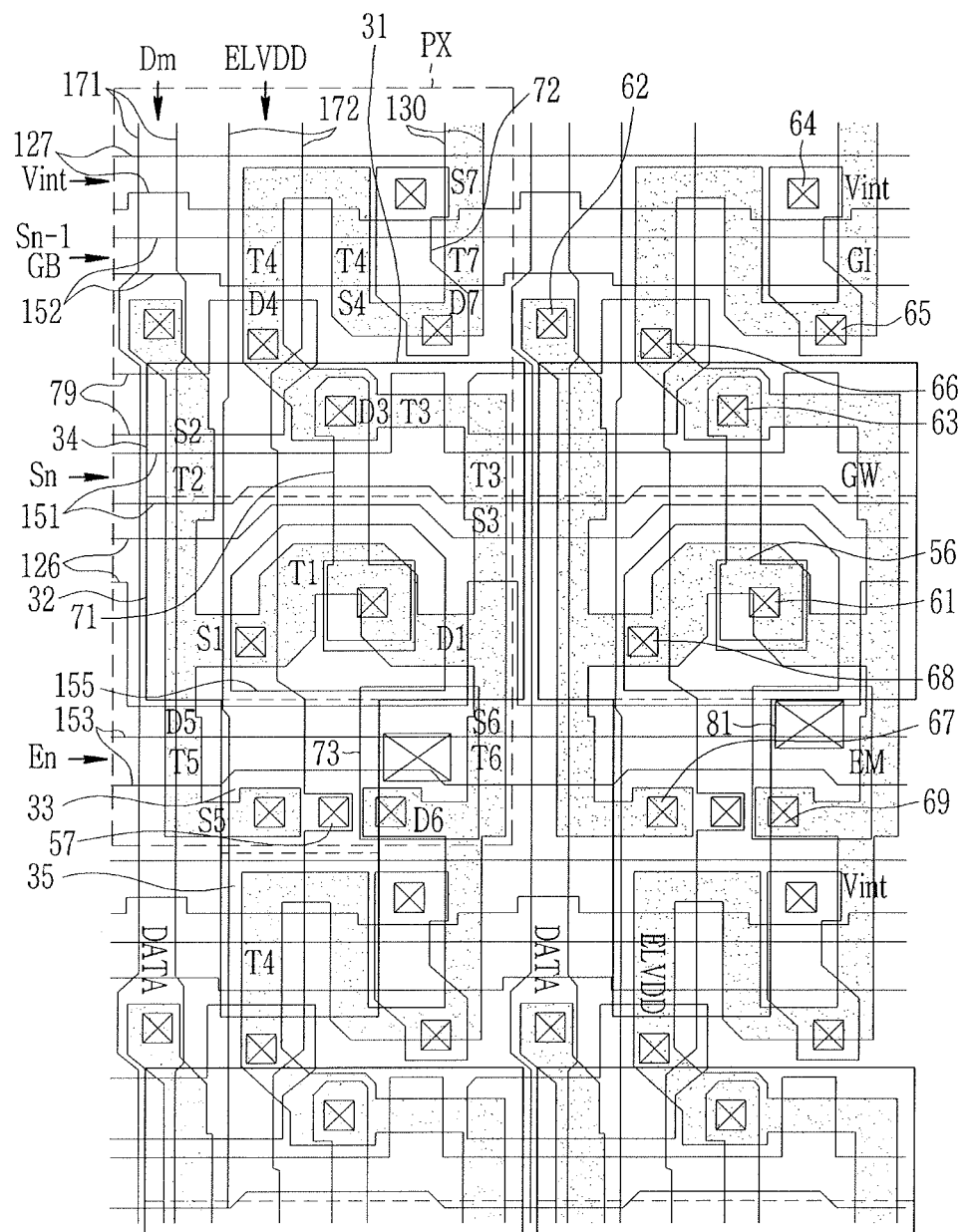
FIG. 30 and FIG. 31 illustrate layout views of a pixel area of an OELD display according to an exemplary embodiment.
Figure 31:
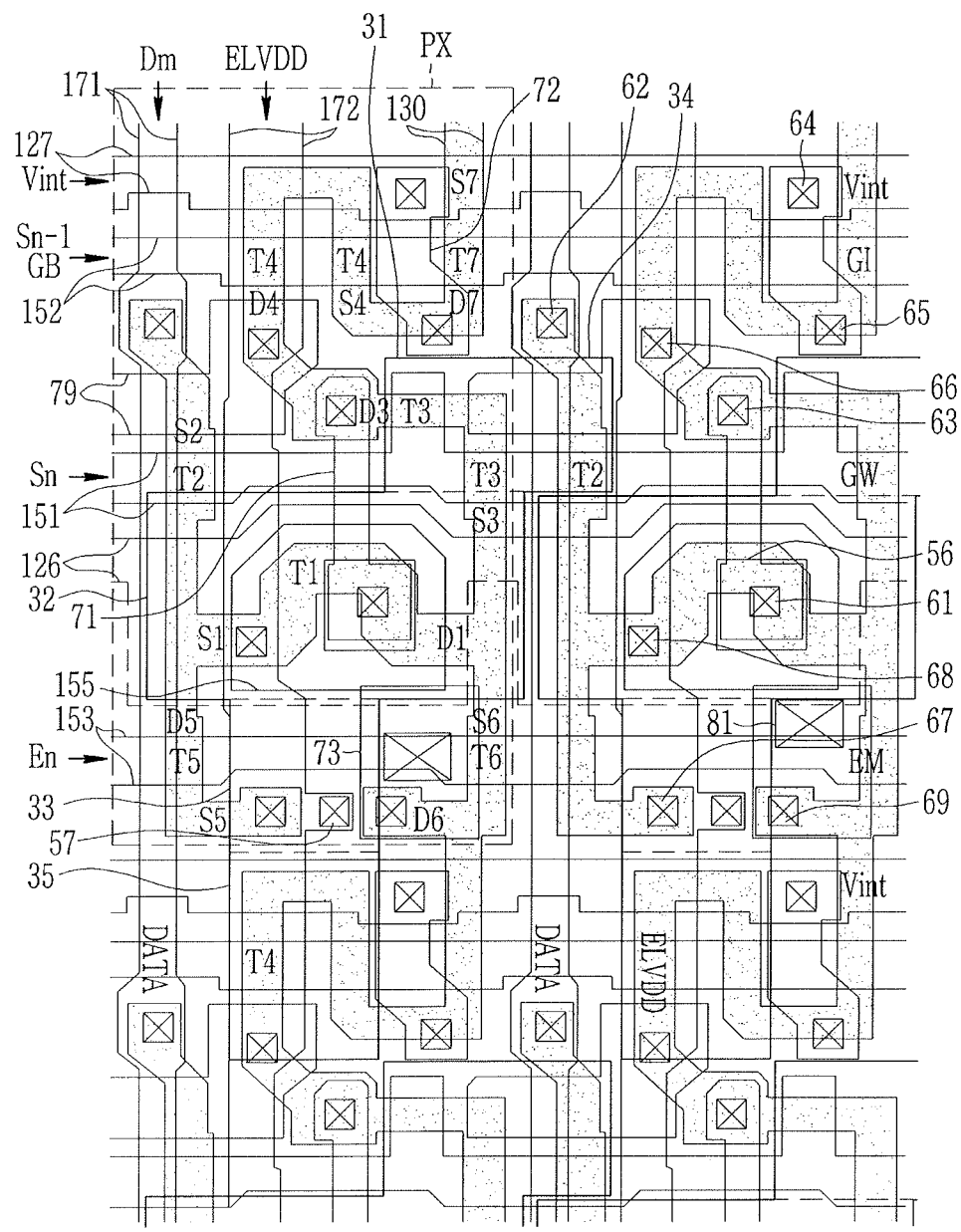

A structure having the blocking layers 31, 32, 34, and 35 will now be described. The blocking layers 31, 32, 34, and 35 may have a structure such as a structure shown in FIG. 30 and FIG. 31. FIG. 30 and FIG. 31 are layout views of a pixel area of an OELD display according to an exemplary embodiment.

In an exemplary embodiment of FIG. 30, blocking layers 31, 32, 34, and 35 include the contact portion 33. The blocking layer 31, the blocking layer 34, and the blocking layer 32 are formed in one quadrangular shape, and a contact portion 33 extends along the y-direction below the blocking layer 32. Then, the blocking layer 35 is disposed below the contact portion 33, such that the contact portion connects and is between the blocking layer 32 and the blocking layer 35. Unlike other blocking layers 31, 32, and 34, in the pixel, the blocking layer 35 connected to the contact portion 33 overlaps the fourth transistor T4 of an adjacent pixel, i.e., adjacent to the pixel downward along the y-direction.

The driving voltage line 172 includes a protrusion portion 172-p directly connected to the contact portion 33 through the contact hole 57. Such a structure is the same as the structure shown in FIG. 9, and thus no additional cross-sectional view is provided. The contact portion 33 receives a driving voltage ELVDD from the protrusion portion of the driving voltage line 172 through the contact hole 57. Thus, the driving voltage ELVDD is applied to all the blocking layers 31, 32, 34, and 35.

Meanwhile, unlike the exemplary embodiment of FIG. 30, in the exemplary embodiment of FIG. 31, the blocking layer 34 that overlaps the second transistor T2 extends along the x-direction to a pixel that is adjacent to the corresponding pixel PX to the right. Accordingly, the blocking layer 34 does not overlap the second transistor T2 in the corresponding pixel PX, but overlaps a second transistor T2 in the right-adjacent pixel.

Thus, in the exemplary embodiment of FIG. 31, a blocking layer that overlaps a transistor in the corresponding pixel PX includes the blocking layer 31 that overlaps the third transistor T3 and the blocking layer 32 that overlaps the driving transistor T1, and a blocking layer that overlaps a transistor in adjacent pixels includes the blocking layer 34 that overlaps the second transistor T2 and the blocking layer 35 that overlaps the fourth transistor T4. In addition, the blocking layer 34 that overlaps the second transistor T2 on a plane is disposed in the right-adjacent pixel of the corresponding pixel PX, and the blocking layer 35 that overlaps the fourth transistor T4 on a plane is disposed in a pixel below the corresponding pixel PX.

Hereinabove, an exemplary embodiment having a circuit diagram such as that of FIG. 30, that is, a structure in which the blocking layer 31 overlaps the third transistor T3, the blocking layer 32 overlaps the driving transistor T1, the blocking layer 34 overlaps the second transistor T2, and the blocking layer 35 overlaps the fourth transistor T4, and they receive the driving voltage ELVDD, has been described. Hereinafter, a structure in which a blocking layer overlaps the driving transistor T1 and the fourth transistor T4, together with the third transistor T3, will be described.

Hereinabove, layouts or cross-sections are added to the circuit diagram to clearly observe the planar positional relationship and the connection relationship of the blocking layer. When the above-described structure is used, various exemplary embodiments in which a specific transistor overlaps a blocking layer that receives a driving voltage ELVDD can be combined. In the above description, a quadrangular structure is used to designate a portion where the blocking layer is disposed. Alternatively, the blocking layers may have various polygonal structures other than a quadrangle or may have a curved structure so as to be below only a transistor.

Further, the driving voltage ELVDD can be applied to blocking layers through contact holes that are formed in various locations. Further, various planar structures and connection structures can be combined.

FIG. 32 to FIG. 37 are equivalent circuit diagrams of a pixel of an OLED display according to exemplary embodiments.

Figure 32:
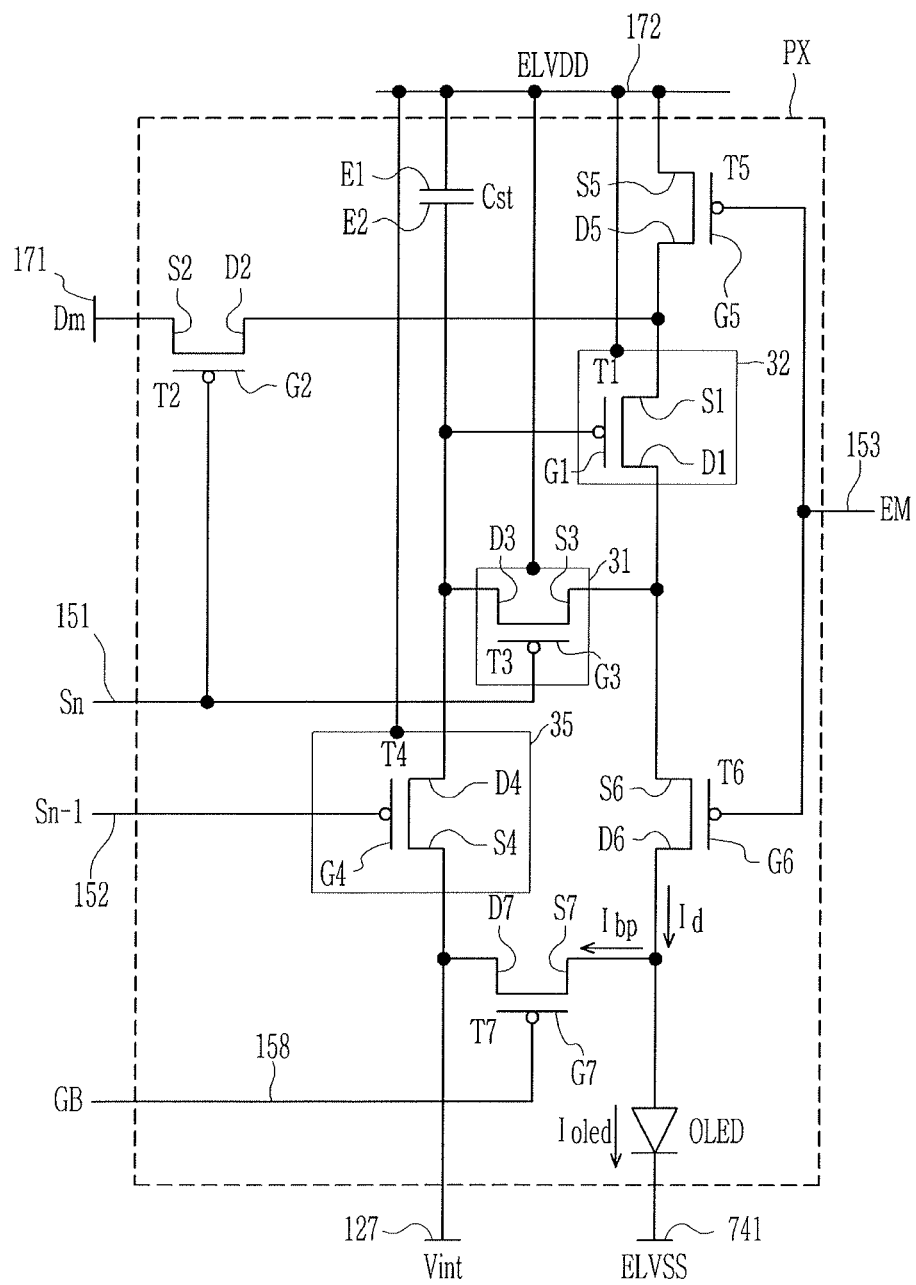
FIG. 32 to FIG. 37 illustrate equivalent circuit diagrams of a pixel of an OLED display according to exemplary embodiments.

First, a circuit diagram of FIG. 32 will be described. In an exemplary embodiment of FIG. 32, three blocking layers are provided, i.e., one that overlaps the third transistor T3, another that overlaps a driving transistor T1, and the other that overlaps the fourth transistor T4. In addition, the three blocking layers 31, 32, and 35 receive a driving voltage ELVDD through a contact hole formed in a pixel PX.

The three blocking layers 31, 32, and 35 may be formed in one structure by being connected with each other, and may be separated from each other and thus receive the driving voltage ELVDD through different contact holes. Depending on exemplary embodiments, the blocking layers 31, 32, and 35 may receive different voltages. In particular, one of the same or different ones of the driving voltage ELVDD, the initialization voltage Vint, the common voltage ELVSS, the scan signal Sn, the previous scan signal Sn−1, the data voltage Dm, and the light emission control signal EM may be applied to the three blocking layers 31, 32, and 35. The three blocking layers 31, 32, and 35 may be connected with one terminal of each of a plurality of transistors T1 to T7 or one terminal of an organic light emitting diode.

Figure 33:
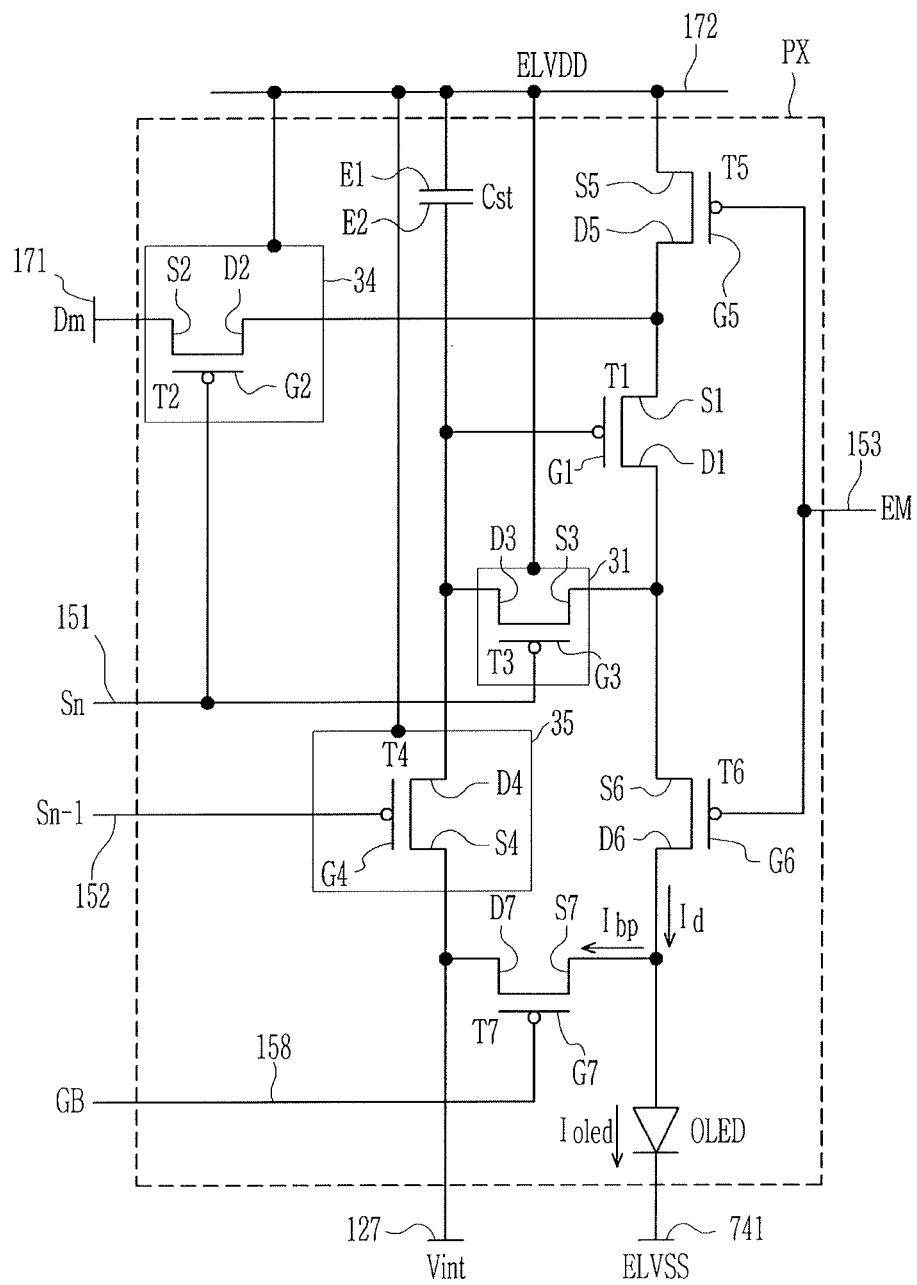

The circuit diagram of FIG. 33 illustrates an exemplary embodiment to be described hereinafter. In the exemplary embodiment of FIG. 33, three blocking layers are provided, i.e., one that overlaps the third transistor T3, another that overlaps the second transistor T2, and the other overlaps the fourth transistor T4. In addition, the three blocking layers 31, 34, and 35 receive a driving voltage ELVDD through a contact hole formed in a pixel PX.

The three blocking layers 31, 34, and 35 may be formed in one structure by being connected with each other, and may be separated from each other and thus receive the driving voltage ELVDD through different contact holes. Depending on exemplary embodiments, the blocking layers 31, 34, and 35 may receive different voltages. In particular, one of the same or different ones of the driving voltage ELVDD, the initialization voltage Vint, the common voltage ELVSS, the scan signal Sn, the previous scan signal Sn−1, the data voltage Dm, and the light emission control signal EM may be applied to the three blocking layers 31, 34, and 35. The three blocking layers 31, 34, and 35 may be connected with one terminal of each of a plurality of transistors T1 to T7 or one terminal of an organic light emitting diode. That is, lines other than the driving voltage line 172 may also be electrically connected with the blocking layer, and in the exemplary embodiments described above, they are connected with the driving voltage line 172 and receive the driving voltage ELVDD.

Hereinafter, an exemplary embodiment in which a blocking layer is connected with another signal line will be described through a circuit diagram. First, a circuit diagram shown in FIG. 34 will be described.

Figure 34:
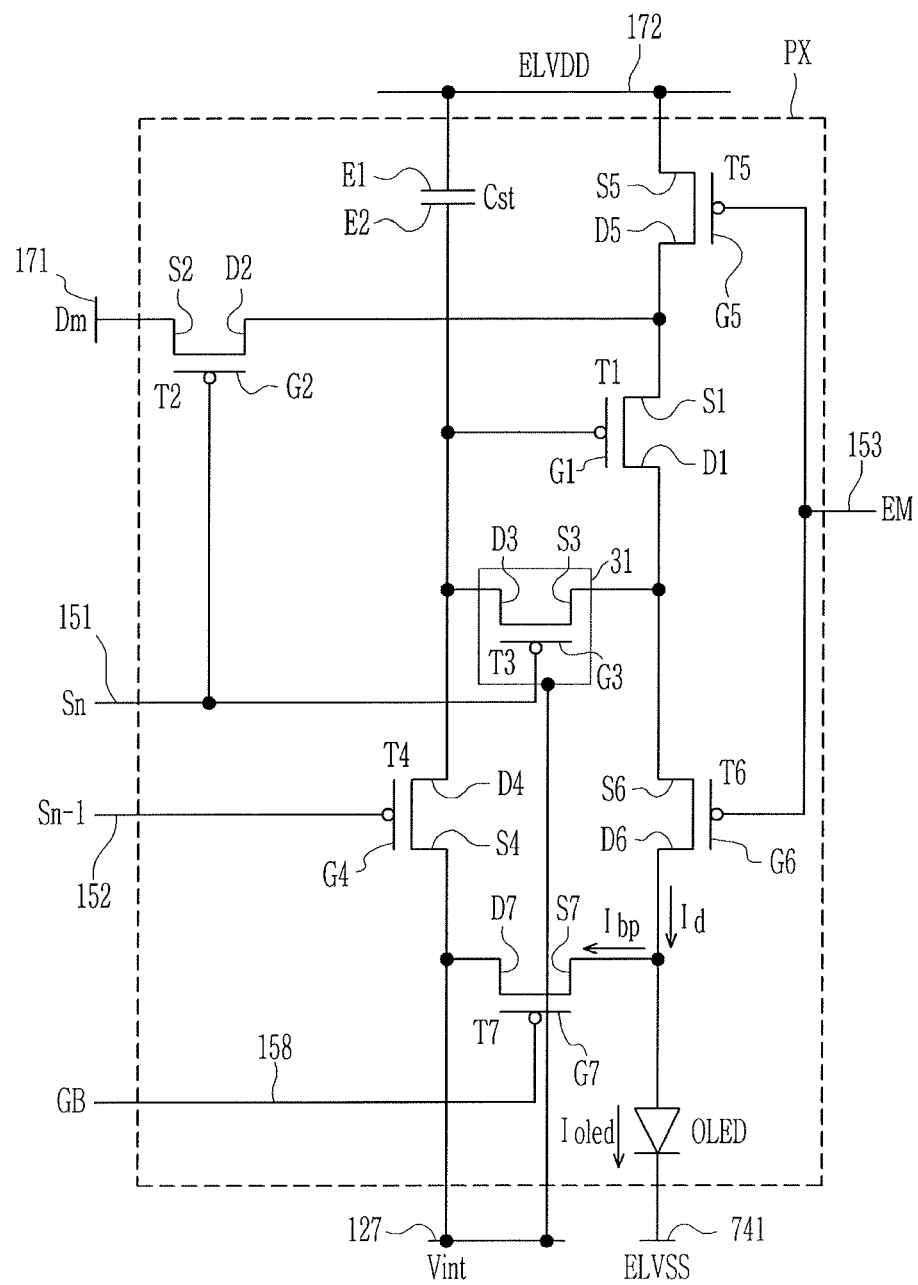

As in the circuit diagram of FIG. 1, in the circuit diagram of FIG. 34, the blocking layer 31 overlaps only a third transistor T3 on a plane. However, in contacts with the circuit diagram of FIG. 1, the blocking layer 31 is not connected with the driving voltage line 172, but is connected with an initialization voltage line 127 to receive an initialization voltage Vint. When the initialization voltage Vint is applied to the blocking layer 31, unlike a case of applying a driving voltage ELVDD, a channel characteristic of the third transistor T3 may be shifted in the opposite direction. That is, a voltage line to which the blocking layer is connected is determined based on a characteristic of each transistor, and operation features depending on a type of a transistor, that is, a P-type transistor and an N-type transistor, also need to be considered.

A contact hole through which the initialization voltage line 127 and the blocking layer 31 are connected with each other is formed in a pixel PX. When a contact hole is formed outside a display area, parasitic capacitance may be unnecessarily generated due to a wire connected to the pixel PX such that display quality deterioration may occur due to a signal delay in a display device having high-resolution pixels, and thus in the present exemplary embodiment, the initialization voltage line 127 and the blocking layer 31 are electrically connected with the contact hole disposed in the pixel PX. This is also applicable to an exemplary embodiment in which the blocking layer is connected with another wire.

In addition, in FIG. 34, the blocking layer 31 overlaps only the third transistor T3, but additional blocking layers may overlap various transistors as in the above-described exemplary embodiments. In particular, various combinations have been formed with four transistors T1 to T4 in the above-described embodiments. Alternatively, blocking layers may selectively overlap all the transistors T1 to T7. If the blocking layer overlaps all the transistors, the blocking layer is formed only in a portion of the pixel PX to reduce or prevent attendant problems, e.g., signal delay due to unnecessary parasitic capacitance, i.e., the blocking layer is not provided below an entirety the pixels PX. That is, at least a portion where the blocking layer is not formed in the pixel PX may exist.

Hereinafter, the circuit diagram of FIG. 35 will be described. Differently from the circuit diagram of FIG. 34, in the circuit diagram of FIG. 35, the blocking layer 31 is connected with one end of the transistor T3 that it overlaps.

That is, the blocking layer 31 does not need to be connected with one of the signal lines, but may be connected to one end of one of a plurality of transistors T1 to T7. As an example, as shown in FIG. 35, the blocking layer 31 overlaps one end of the transistor T3 that it overlaps and is connected with a second electrode D3.

Figure 35:
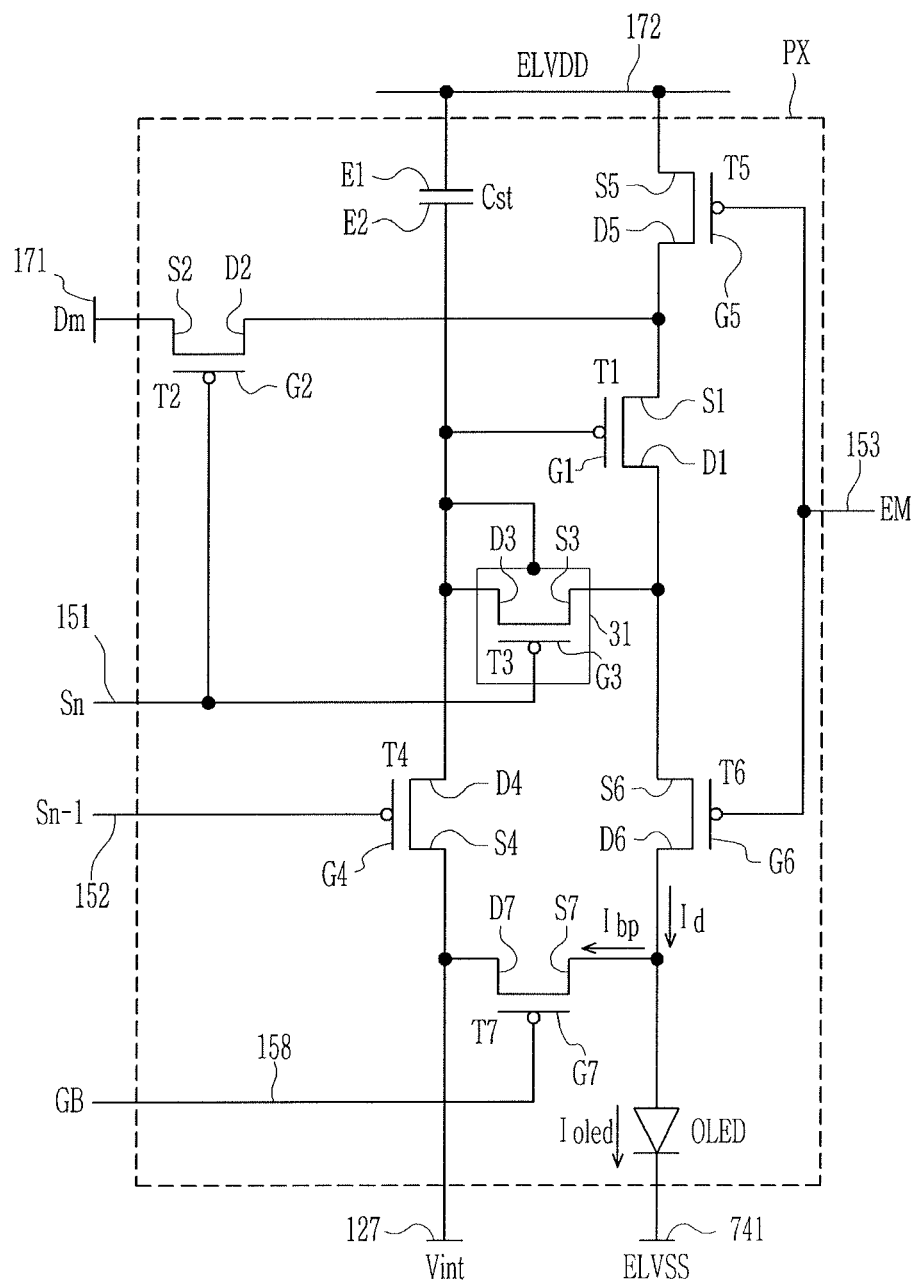

As in the circuit diagram of FIG. 1, in the circuit diagram of FIG. 35, the blocking layer 31 overlaps only the third transistor T3. However, unlike FIG. 1, the blocking layer 31 is not connected with the driving voltage line 172 but is connected with the second electrode D3 of the third transistor T3, and thus receives a varying voltage. Such a voltage variation displaces the potential of the blocking layer 31 such that a characteristic is changed compared to a case of applying a constant voltage. However, since the second electrode D3 is periodically initialized in FIG. 35, the characteristic is not significantly different from a case of applying an initialization voltage Vint.

Further, a contact hole through which the second electrode D3 of the third transistor T3 and the blocking layer 31 are connected with each other is disposed in the pixel PX. Depending on exemplary embodiments, the blocking layer 31 may be connected with a first electrode S3 or connected with a terminal of a transistor that is not overlapped with the blocking layer 31.

In addition, in FIG. 35, the blocking layer 31 overlaps only the third transistor T3, but as in the previously described exemplary embodiment, blocking layers may overlap various transistors. In particular, various combinations have been formed with four transistors T1 to T4 in the above-described embodiments. Alternatively, blocking layers may selectively overlap all the transistors T1 to T7. If the blocking layer overlaps all the transistors, the blocking layer is formed only in a portion for elimination of a problem such as a signal delay due to unnecessary parasitic capacitance, and the blocking layer is not provided below all the pixels PX. That is, at least a portion where the blocking layer is not formed in the pixel PX may exist.

Figure 36:
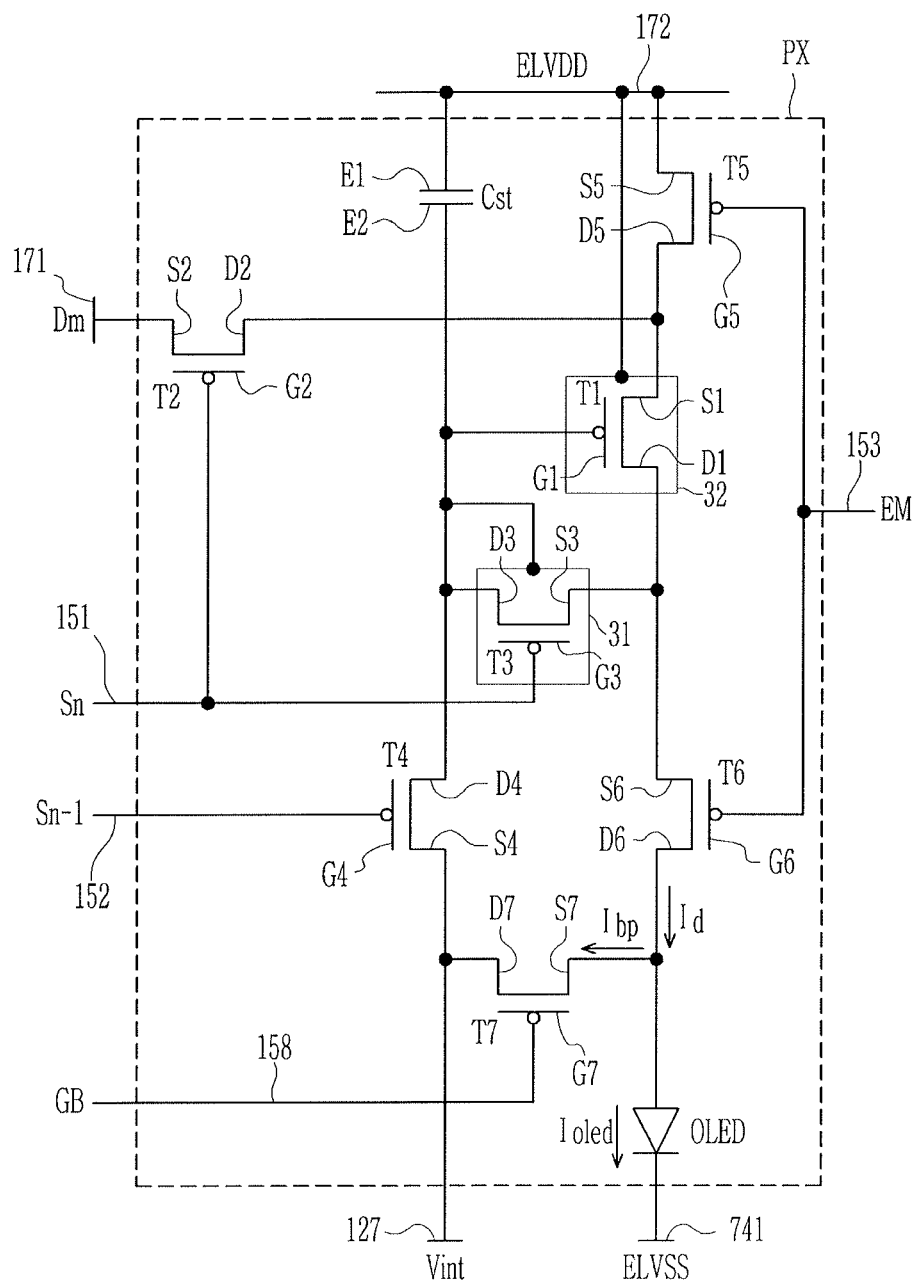
Figure 37:
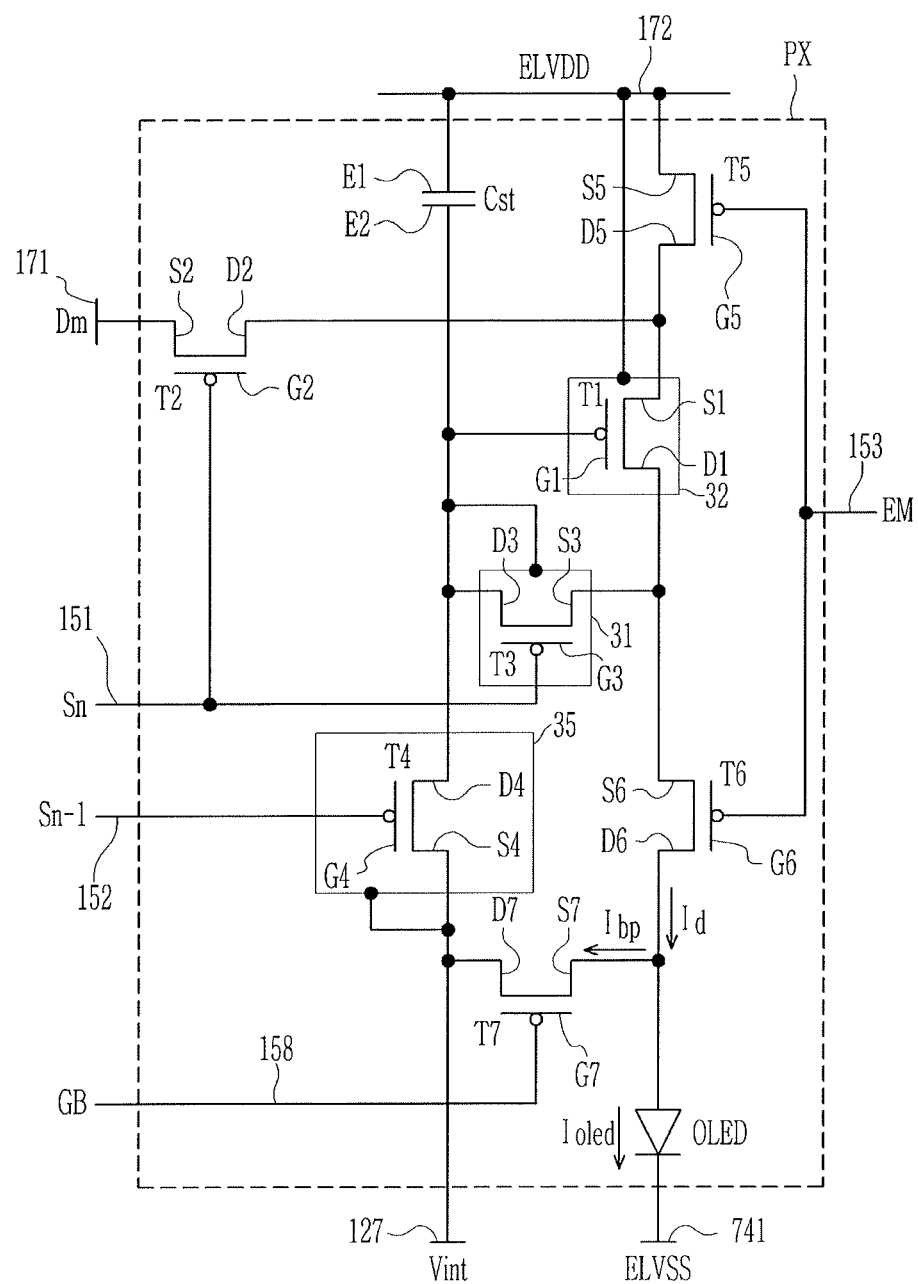

Hereinafter, a structure in which a plurality of blocking layers are formed and they receive different voltages will be described with reference to FIG. 36 and FIG. 37. In FIG. 36 and FIG. 37, and also as shown in FIG. 35, the blocking layer 31 that overlaps the third transistor T3 is connected with the second electrode D3 of the third transistor T3, and another blocking layer is additionally formed.

First, the structure shown in FIG. 36 will be described. In an exemplary embodiment of FIG. 36, in addition to the exemplary embodiment shown in FIG. 35, the blocking layer 32 that overlaps the driving transistor T1 is further provided. As shown in the exemplary embodiment of FIG. 11, the blocking layer 32 is connected with a driving voltage line 172 and receives a driving voltage ELVDD. Thus, the two blocking layers 31 and 32 are electrically separated from each other, and the blocking layer 31 is connected with a second electrode D3 of a third transistor T3 and the blocking layer 32 receives the driving voltage ELVDD.

In this case, a contact hole through which the two blocking layers 31 and 32 are electrically connected with each other is provided in a pixel PX to thereby reduce parasitic capacitance. As described, various blocking layers may be electrically separated from each other and may receive different voltages according to various exemplary embodiments. However, in order to prevent occurrence of unnecessary parasitic capacitance due to overlapping of the blocking layer with the entire pixel area, at least a part is opened and the blocking layer is formed only in a portion where it needs to be.

Hereinafter, an exemplary embodiment of FIG. 37 will be described. In addition to the exemplary embodiment of FIG. 36, the blocking layer 35 that overlaps the fourth transistor T4 is further included in the exemplary embodiment of FIG. 37. The blocking layer 35 that overlaps the fourth transistor T4 is electrically connected with a first electrode S4 of the fourth transistor T4. However, from a circuit view, the first electrode S4 of the fourth transistor T4 is applied with an initialization voltage Vint. Thus, a connection structure between the blocking layer 35 and the first electrode S4 of the fourth transistor T4 is the same as a connection structure between a blocking layer and the initialization voltage line 127.

Therefore, in the exemplary embodiment of FIG. 37, the blocking layer 31 is electrically connected with an electrode D3 of the transistor T3 that it overlaps with the blocking layer 31, the blocking layer 32 receives a driving voltage ELVDD, and the blocking layer 35 receives the initialization voltage Vint. That is, all the blocking layers receive different voltages. In this case, a contact hole through which the third blocking layers 31, 32, and 35 are electrically connected is provided in a pixel PX to thereby reduce parasitic capacitance.

As described, various blocking layers may be electrically separated from each other and may receive different voltages according to various exemplary embodiments. However, in order to prevent occurrence of unnecessary parasitic capacitance due to overlapping of the blocking layer with the entire pixel area, at least a part is opened and the blocking layer is formed only in a portion where it needs to be.

Figure 38:
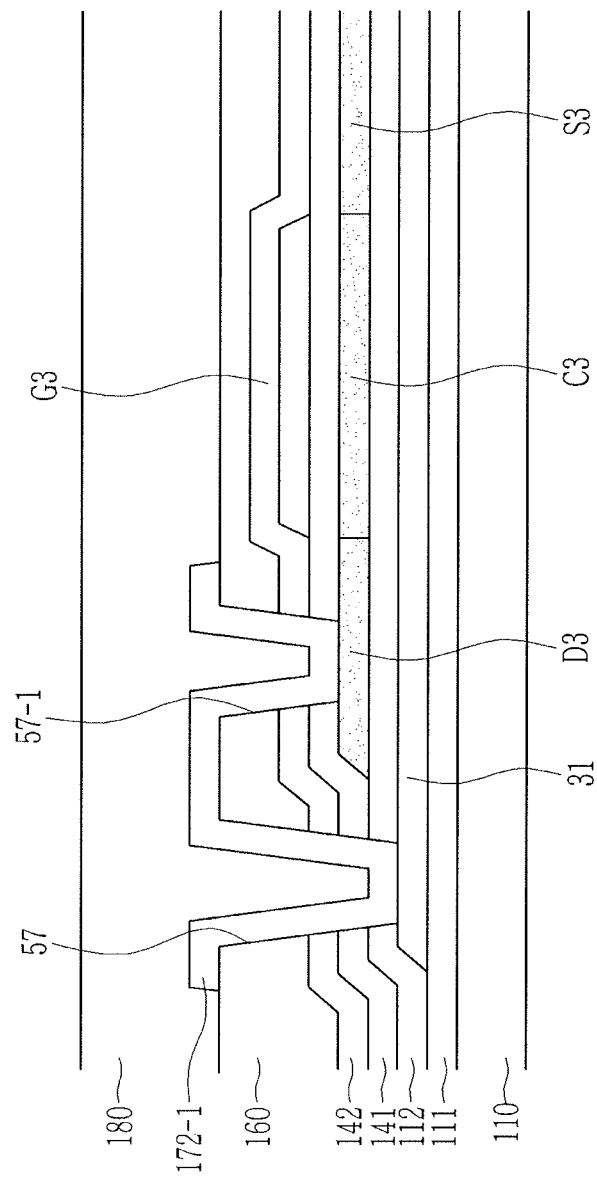
FIG. 38 and FIG. 39 illustrate cross-sectional views of an OLED display according to an exemplary embodiment.
Figure 39:
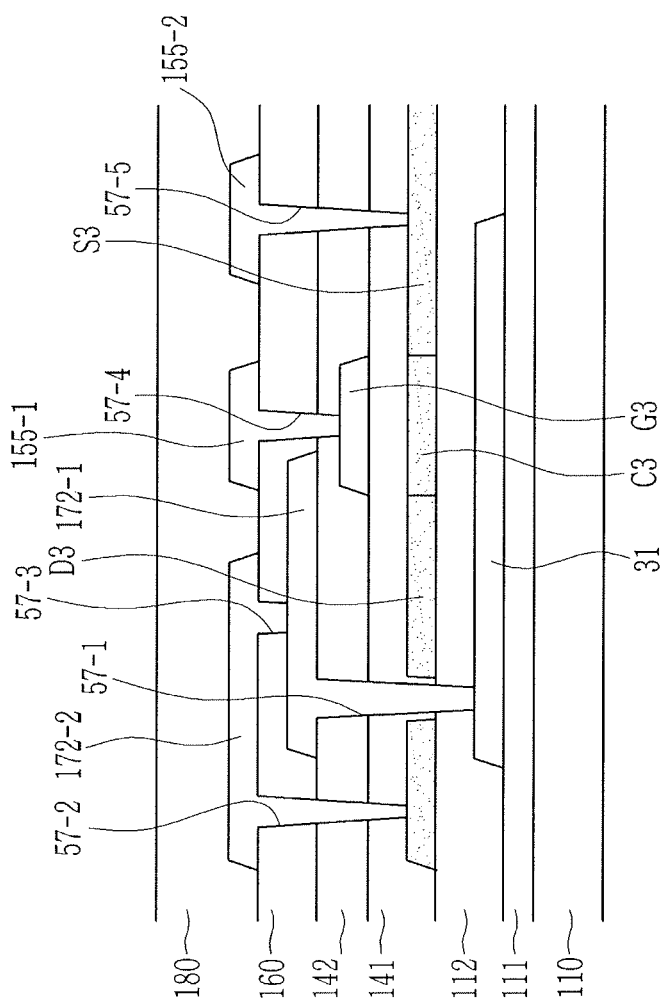

Hereinabove, a circuit connection structure between one electrode of a transistor and a blocking layer that overlaps the transistor and is electrically connected to one electrode of the transistor has been described. Hereinafter, a connection relationship between one electrode of a transistor and a blocking layer will be described with reference to FIG. 38 and FIG. 39. FIG. 38 and FIG. 39 are cross-sectional views of an OLED display according to an exemplary embodiment.

First, FIG. 38 will be described. Referring to FIG. 38, the blocking layer 31 is between the substrate 110 and the semiconductor layer 130. The barrier layer 111 is on the substrate 110, and the blocking layer 31 is on the barrier layer 111. The buffer layer 112 is on the blocking layer 31 and the barrier layer 112, and the semiconductor layer 130 is on the buffer layer 112. In FIG. 38, the semiconductor layer 130, the first electrode S3, the second electrode D3, and the channel region C3 of the third transistor T3 are illustrated.

The first gate insulation layer 141 is on the semiconductor layer 130. The gate electrode G3 of the third transistor T3 is on the first gate insulation layer 141. The second insulation gate layer 142 is on the gate electrode G3 of the third transistor T3, while covering the same. An expansion portion of the sustain line 126 is on the second gate insulation layer 142, and the interlayer insulation layer is on the expansion portion of the sustain line 126. The contact hole 57 exposes part of the blocking layer 31, through the buffer layer 112, the first gate insulation layer 141, the second gate insulation layer 142, and the interlayer insulation layer 160.

In addition, the contact hole 57-1 is provided on the second electrode D3, and in the first gate insulation layer 141, the second gate insulation layer 142, and the interlayer insulation layer 160 and thus partially exposes the second electrode D3. A connection member 172-1 is on the interlayer insulation layer 160, and electrically connects the blocking layer 31 and the second electrode D3 of the third transistor T3 through the two contact holes 57 and 57-1. The passivation layer 180 is on the interlayer insulation layer 160 and the connection member 172-1, and a pixel electrode, a barrier rib, an organic emission layer, a common electrode, and an encapsulation layer may be disposed on the passivation layer 180. The pixel electrode, the organic emission layer, and the common electrode form an organic light emitting diode (OLED).

In addition, through such a structure of FIG. 39, the second electrode D3 of the third transistor T3 and the blocking layer 31 may be electrically connected with each other. Referring to FIG. 39, the blocking layer 31 is between the substrate 110 and the semiconductor layer 130. The barrier layer 111 is on the substrate 110, and the blocking layer 31 is on the barrier layer 111. The buffer layer 112 is on the blocking layer 31 and the barrier layer 111, and the semiconductor layer 130 is on the buffer layer 112. In FIG. 39, the first electrode D3, the second electrode D3, and the channel region C3 of the third transistor T3 are illustrated as the semiconductor layer 130. The first gate insulation layer 141 is on the semiconductor layer 130. The gate electrode G3 of the third transistor T3 is on the first gate insulation layer 141. The second gate insulation layer 142 is on the first gate insulation layer 141, while covering the same.

The first connection member 172-1 that is connected with the blocking layer 31 is on the second gate insulation layer 142. The first connection member 172-1 is electrically connected with the blocking layer 31 through a contact hole 57-1 formed in the buffer layer 112, the semiconductor layer 130, the first gate insulation layer 141, and the second gate insulation layer 142. The interlayer insulation layer 160 is on the first connection member 172-1 and the second gate insulation layer 142.

A second connection portion 172-2, a gate electrode connection portion 155-1, and a first electrode connection portion 155-2 are on the interlayer insulation layer 160. First, the second connection portion 172-2 is on the second electrode D3 and on the contact hole 57-2 in the first gate insulation layer 141, the second gate insulation layer 142, the interlayer insulation layer 160, and the first connection member 172-1, and connects the second electrode D3 and the first connection member 172-1 through a contact hole 57-3. Thus, the blocking layer 31 connected with the first connection member 172-1 is connected with the second electrode D3.

The gate electrode connection portion 155-1 is connected with the gate electrode G3 by a contact hole 57-4 in the second gate insulation layer 142 and the interlayer insulation layer 160. In addition, the first electrode connection portion 155-2 is connected with the first electrode S3 through the contact hole 57-5 in the first gate insulation layer 141, the second gate insulation layer 142, and the interlayer insulation layer 160. Alternatively, portions for connecting the gate electrode G3 and the first electrode S3 with other portions or for signal application may be provided.

The passivation layer 180 is on the second connection portion 172-2, the gate electrode connection portion 155-1, and the first electrode connection portion 155-2, and a pixel electrode, a barrier rib, an organic emission layer, a common electrode, and an encapsulation layer may be disposed on the passivation layer 180. The pixel electrode, the organic emission layer, and the common electrode form an organic light emitting diode (OLED).

Hereinabove, a configuration that includes only one substrate 110 has been described. However, depending on exemplary embodiments, the substrate 110 may be included in plural.

Figure 40:
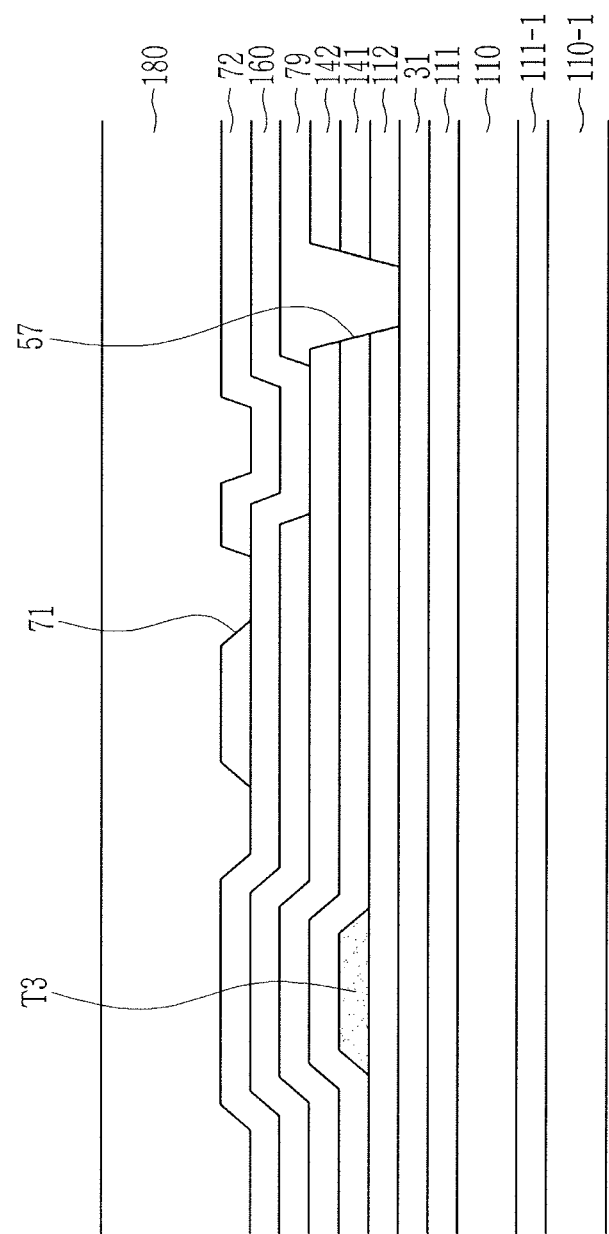
FIG. 40 illustrates a cross-sectional view of an OLED display according to an exemplary embodiment.

FIG. 40 is a cross-sectional view of an OLED display according to an exemplary embodiment. The cross-sectional view of FIG. 40 is similar to that of FIG. 4, and a blocking layer 31 is connected with a parasitic capacitor control pattern 79 through a contact hole 57, while the parasitic capacitor control pattern 79 is connected with a driving voltage line 172. Thus, the blocking layer 31 is applied with a driving voltage ELVDD.

However, unlike as shown in FIG. 4, in FIG. 40, two substrates 110 and 110-1 and two barrier layers 111 and 111-1 are provided. That is, when a substrate is provided as a flexible substrate, a plurality of substrates that are formed of plastic or polyimide (PI) are provided, and a number of barrier layers may be provided as the number of substrates. Depending on exemplary embodiments, the barrier layer may be partially omitted.

Figure 41:
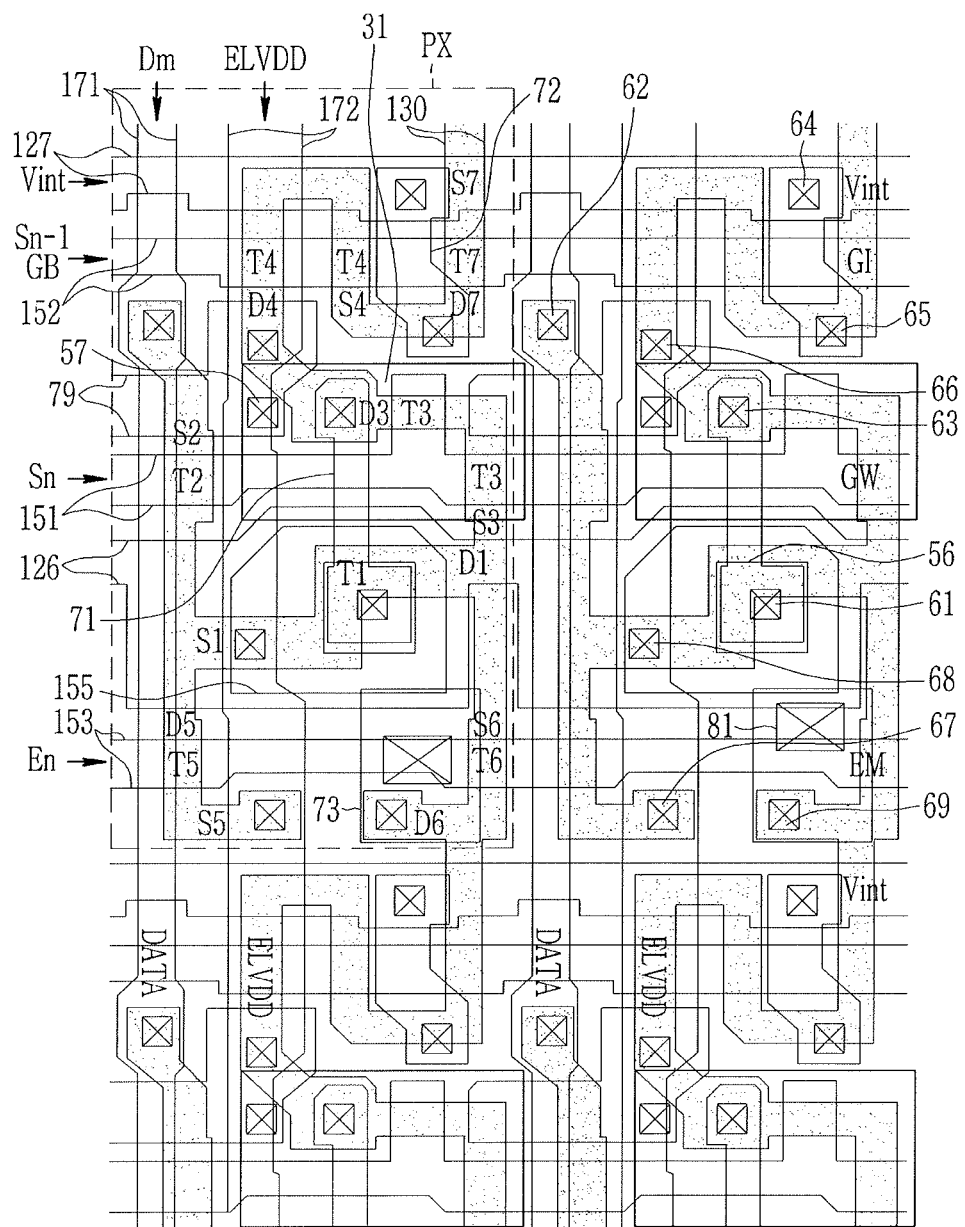
FIG. 41 to FIG. 43 illustrate layout views of a pixel area of an OLED display according to exemplary embodiments.
Figure 42:
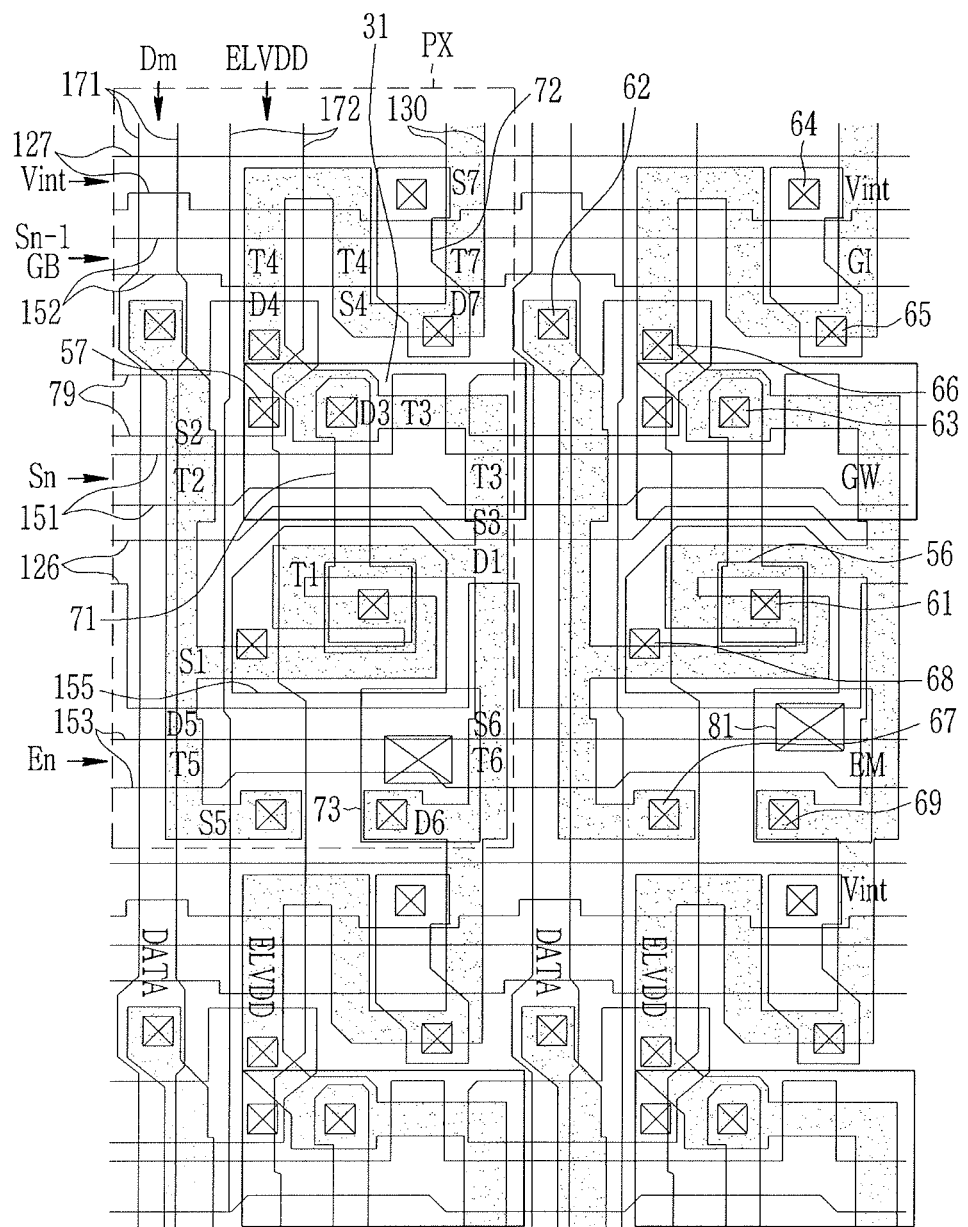

Hereinafter, a structure in which the shape of a channel of the driving transistor T1 is different will be described with reference to FIG. 41 and FIG. 42. FIG. 41 and FIG. 42 are layout views of a pixel area of an OLED display according to an exemplary embodiment.

The structures shown in FIG. 41 and FIG. 42 are the same as the structure shown in FIG. 3, except for a structure of the semiconductor layer 130 where the channel of the driving transistor T1 is disposed. In particular, in FIG. 3, the channel region of the driving transistor T1 is formed in the shape of S2, but the channel of the driving transistor T1 is bent two times in FIG. 41 and the channel of the driving transistor T1 is formed in the shape of an inverted S in FIG. 42. Alternatively, various channel structures may be used, such as an S-type, an M-type, a W-type, and the like.

Figure 43:
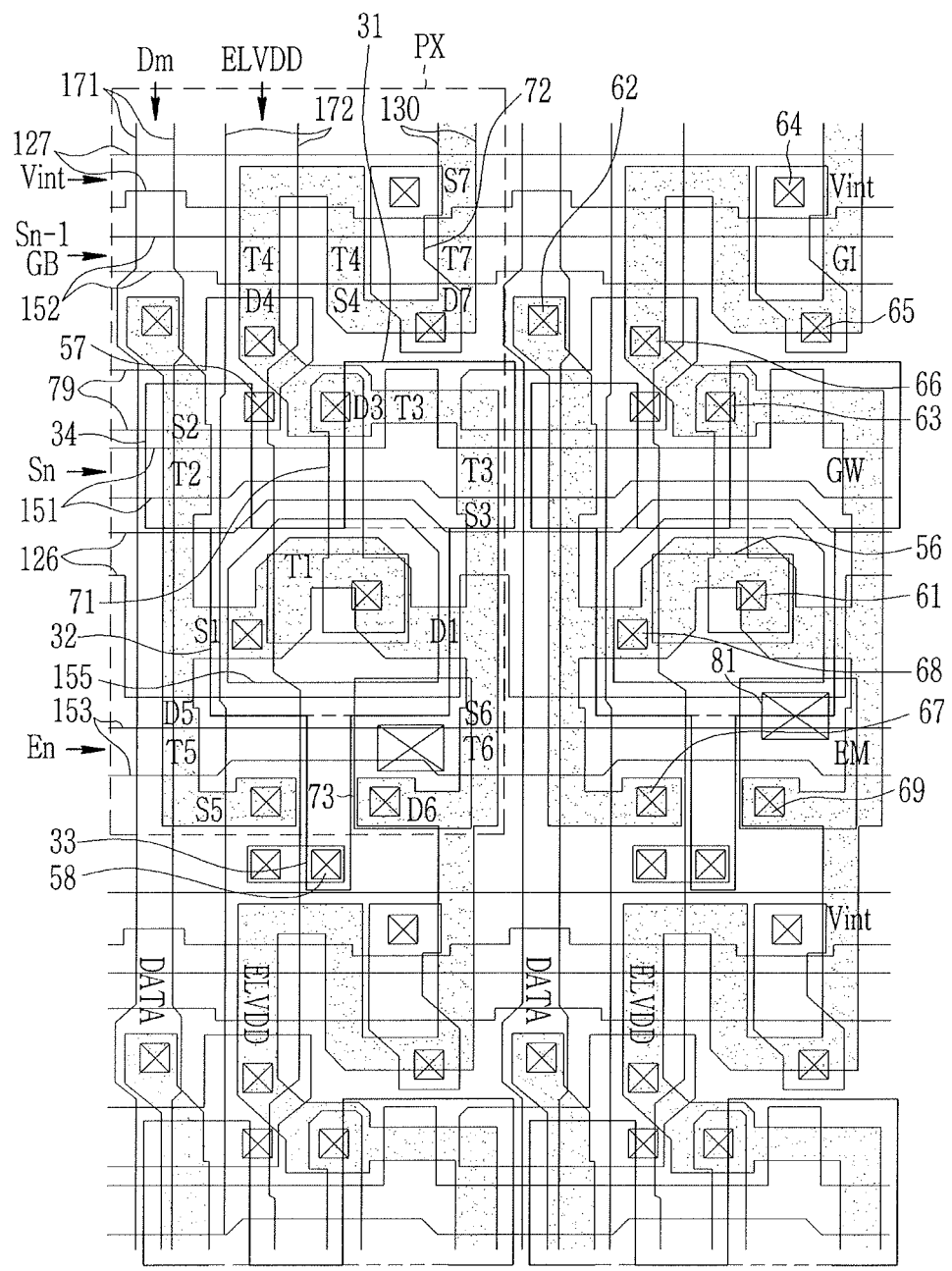

FIG. 43 is a layout view of a pixel area of an OLED display according to an exemplary embodiment. In the above-described exemplary embodiments, the opening 56 has a constant size. That is, the opening 56 is formed in an expansion portion of a sustain line 126 for connection between a gate electrode 155 and a first data connection member 71. The expansion portion of the sustain line 126 overlaps an upper surface of the gate electrode 155, while disposing a second gate insulation layer therebetween, such that the storage capacitor Cst is formed. Thus, the size of the storage capacitor Cst is determined based on the size of a portion where the expansion portion of the sustain line 126 and the gate electrode 155 overlap.

However, depending on OLED displays, the size of the storage capacitor Cst needs to be increased or decreased. That is, compared to other exemplary embodiments, the size of the opening 56 is large in the exemplary embodiment of FIG. 43. Accordingly, the overlapped area of the expansion portion of the sustain line 126, forming the storage capacitor Cst is reduced so that the storage capacitor Cst has relatively small storage capacity.

That is, when the size of the opening 56 is adjusted as in the exemplary embodiment of FIG. 43, a signal delay due to parasitic capacitance occurring by the blocking layer 31 can be reduced. Accordingly, the size of opening 56 may be adjusted depending on exemplary embodiments. Further, the storage capacity of the storage capacitor Cst can be adjusted by adjusting the size of the expansion portion of the sustain line 126 with the size of the gate electrode 155.

One or more embodiments may provide a flexible organic light emitting diode display that can prevent deterioration of display quality due to impurities that occur during thermal treatment. According to the exemplary embodiments, when a lower substrate is a flexible substrate and an impurity is transmitted to a transistor from the lower substrate during a thermal treatment, the transistor can normally operate. In addition, when white and black are alternately displayed, generation of an after-image can be prevented by preventing a transistor characteristic (e.g., a kickback voltage) from being changed, thereby improving display quality. Further, a contact hole is formed in a pixel such that a metal layer below a semiconductor layer can receive a voltage without being floated. Accordingly, the metal layer can be formed only where needed, thereby preventing deterioration of display quality due to unnecessary parasitic capacitance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
   a substrate;
   a bottom electrode on the substrate;
   a pixel; and
   a scan line, a data line, and a driving voltage line connected to the pixel, wherein
   the pixel includes:
   an organic light emitting diode;
   a switching transistor connected to the scan line; and
   a driving transistor,
   the bottom electrode, disposed between the switching transistor and the substrate, includes a first portion disposed in an area that overlaps the switching transistor on a plane, and
      the bottom electrode is exposed by a contact hole which is disposed outside of the pixel,
   wherein
   the switching transistor is a third transistor including a third semiconductor layer, and
   one end of the third semiconductor layer is connected to one end of a first semiconductor layer of the driving transistor and the other end of the third semiconductor layer is electrically connected to a gate electrode of the driving transistor.

2. The OLED display as claimed in claim 1, wherein the bottom electrode is electrically connected with one of the scan line, the data line, the driving voltage line, the switching transistor, the driving transistor, and one terminal of the organic light emitting diode through the contact hole.

3. The OLED display as claimed in claim 1, wherein the bottom electrode further includes a second portion disposed in an area that overlaps the driving transistor on a plane.

4. The OLED display as claimed in claim 3, wherein the second portion of the bottom electrode, overlapping the driving transistor, has a width that is wider than a width of a gate electrode of the driving transistor.

5. The OLED display as claimed in claim 3, wherein the second portion of the bottom electrode is connected with the driving voltage line through the contact hole.

6. The OLED display as claimed in claim 3, wherein
   the first portion of the bottom electrode and the second portion of the bottom electrode are separated from each other,
   the second portion has a second contact hole exposing a part of the second portion,
   and
   the first portion and the second portion are electrically connected to different line from each other.

7. The OLED display as claimed in claim 1, further comprising:
   an initialization voltage line connected to the pixel
   wherein the pixel further includes a fourth transistor including a fourth semiconductor layer,
   one end of the fourth semiconductor layer is electrically connected to the initialization voltage line and the other end of the fourth semiconductor layer is electrically connected to a gate electrode of the driving transistor, and
   the bottom electrode further includes a fourth portion disposed in an area that overlaps the fourth transistor on a plane.

8. The OLED display as claimed in claim 7, wherein the bottom electrode is electrically connected with the initialization voltage line.

9. The OLED display as claimed in claim 7, wherein the bottom electrode is connected with the driving voltage line through the contact hole.

10. The OLED display as claimed in claim 7, wherein
   the first portion of the bottom electrode and the fourth portion of the bottom electrode are separated from each other,
   the fourth portion has a fourth contact hole exposing a part of the fourth portion, and
   the first portion and the fourth portion are electrically connected to different line from each other.

11. The OLED display as claimed in claim 1, further comprising:
   an initialization voltage line connected to the pixel,
   wherein the pixel further includes at least one of:
   a fifth transistor that includes a first electrode connected with the driving voltage line and a second electrode connected with an input side electrode of the driving transistor;
   a sixth transistor that includes a first electrode connected with an output side electrode of the driving transistor and a second electrode connected with the organic light emitting diode; and
   a seventh transistor that includes a first electrode connected with the organic light emitting diode and a second electrode connected with the initialization voltage line.

12. The OLED display as claimed in claim 11, wherein the bottom electrode further includes a fifth portion disposed in an area that overlaps one of the fifth transistor, the sixth transistor, and the seventh transistor, included in the pixel, on a plane.

13. The OLED display as claimed in claim 12, further comprising a previous scan line and a light emission control line that are connected to the pixel, wherein
in the bottom electrode, the first portion and the fifth portion are separated from each other,
the fifth portion has a fifth contact hole exposing a part of the fifth portion, and
the first portion and the fifth portion are electrically connected to different line from each other.

14. The OLED display as claimed in claim 13, wherein one of the first portion and the fifth portion is electrically connected with one of the previous scan line and the light emission control line.

15. The OLED display as claimed in claim 1, wherein the bottom electrode does not overlap at least a part of the pixel.

16. An organic light emitting diode (OLED) display, comprising
a substrate;
a bottom electrode on the substrate;
a buffer layer on the layer;
a semiconductor layer on the buffer layer;
a first gate insulation layer that covers the semiconductor layer;
a first gate layer on the first gate insulation layer;
an interlayer insulation layer that covers the first gate layer and the first gate insulation layer;
a data layer on the first gate insulation layer;
a passivation layer that covers the data layer and the interlayer insulation layer;
a transistor that includes a channel formed in the semiconductor layer and a gate electrode formed in the first gate layer; and
an organic light emitting diode electrically connected to the transistor, wherein
the bottom electrode overlaps the channel of the transistor on a plane,
a contact hole is formed in at least a part of the buffer layer, the first gate insulation layer, or the interlayer insulation layer,
a pixel includes the organic light emitting diode and at least one transistor electrically connected to the organic light emitting diode,
a pixel area is an area that the at least one transistor included in the pixel is disposed on a plane,
the bottom electrode is exposed by the contact hole which is disposed in the pixel area,
the transistor of the pixel includes a plurality of transistors,
the plurality of transistors include:
a switching transistor connected to a scan line; and
a driving transistor electrically connected to the organic light emitting diode,
the switching transistor is a third transistor including a third semiconductor layer, and
one end of the third semiconductor layer is connected to one end of a first semiconductor layer of the driving transistor and the other end of the third semiconductor layer is electrically connected to a gate electrode of the driving transistor.

17. The OLED display as claimed in claim 16, wherein the bottom electrode is electrically connected with one of the scan line, a data line, a driving voltage line, an initialization voltage line, a previous scan line, a light emission control line, one terminal of the transistor, and one terminal of an organic light emitting diode.

18. The OLED display as claimed in claim 16, wherein the bottom electrode includes a first portion disposed in an area that overlaps the switching transistor on a plane.

19. The OLED display as claimed in claim 16, wherein a channel of the driving transistor is formed in the semiconductor layer, and the semiconductor layer has one of S2, inverted S, S, M, and W shapes.

20. The OLED display as claimed in claim 16, wherein the bottom electrode is formed of a metal or a semiconductor material.

21. The OLED display as claimed in claim 16, wherein the substrate is provided in plural, and
a barrier layer is further included in at least one portion between substrates.

22. The OLED display as claimed in claim 16, further comprising:
a second gate insulation layer that covers the first gate layer and the first gate insulation layer; and
a second gate layer on the second gate insulation layer,
wherein the second gate insulation layer and the second gate layer is disposed under the interlayer insulation layer,
wherein the first gate layer comprises a first electrode of a storage capacitor;
wherein the second gate layer comprises a second electrode of the storage capacitor, and
wherein the first electrode and the second electrode of the storage capacitor are overlapped with each other.

23. The OLED display as claimed in claim 22, wherein the second electrode of the storage capacitor includes an opening.

24. The OLED display as claimed in claim 16, wherein the contact hole exposing the bottom electrode is disposed in the pixel area which involves the channel of the transistor overlapping the bottom electrode.

* * * * *